(12) United States Patent
Miyake

(10) Patent No.: US 10,260,146 B2
(45) Date of Patent: Apr. 16, 2019

(54) METHOD FOR MANUFACTURING NITRIDE SEMICONDUCTOR SUBSTRATE

(71) Applicant: MIE UNIVERSITY, Mie (JP)

(72) Inventor: Hideto Miyake, Mie (JP)

(73) Assignee: MIE UNIVERSITY, Mie (JP)

( * ) Notice: Subject to any disclaimer, the term of this patent is extended or adjusted under 35 U.S.C. 154(b) by 0 days.

(21) Appl. No.: 15/763,782

(22) PCT Filed: Sep. 9, 2016

(86) PCT No.: PCT/JP2016/076622
§ 371 (c)(1),
(2) Date: Mar. 27, 2018

(87) PCT Pub. No.: WO2017/043628
PCT Pub. Date: Mar. 16, 2017

(65) Prior Publication Data
US 2018/0274088 A1    Sep. 27, 2018

(30) Foreign Application Priority Data
Sep. 11, 2015  (JP) ................. 2015-180173

(51) Int. Cl.
*C23C 16/18*   (2006.01)
*C23C 16/34*   (2006.01)
(Continued)

(52) U.S. Cl.
CPC .............. *C23C 16/18* (2013.01); *C23C 16/34* (2013.01); *C30B 29/38* (2013.01); *C30B 29/406* (2013.01);
(Continued)

(58) Field of Classification Search
CPC .......... H01L 21/0254; H01L 21/02205; H01L 21/02172; H01L 21/3245; H01L 21/02389; H01L 21/02304
See application file for complete search history.

(56) References Cited

U.S. PATENT DOCUMENTS 6,593,016 B1    7/2003  Chiyo et al.
2003/0205195 A1  11/2003  Chiyo et al.
(Continued)

FOREIGN PATENT DOCUMENTS

JP    60-12721    1/1985
JP    60-50916    3/1985
(Continued)

OTHER PUBLICATIONS

International Search Report dated Nov. 29, 2016 in International (PCT) Application No. PCT/JP2016/076622.

*Primary Examiner* — Anthony Ho
(74) *Attorney, Agent, or Firm* — Wenderoth, Lind & Ponack, L.L.P.

(57) ABSTRACT

A method for manufacturing a nitride semiconductor substrate includes: a preparation step of preparing a sapphire substrate; and a buffer layer forming step of forming an AlN buffer layer on the sapphire substrate, wherein the buffer layer forming step includes: a group III nitride semiconductor forming step of forming a precursor of an AlN buffer layer on the sapphire substrate; and an annealing step of annealing the sapphire substrate on which the precursor of the AlN buffer layer is formed in a gas-tight state in which a principal surface of the precursor of the AlN buffer layer is covered with a cover member (such as a sapphire substrate) for inhibiting a component of the group III nitride semiconductor from dissociating from the principal surface of the formed precursor of the AlN buffer layer.

14 Claims, 40 Drawing Sheets

(51) Int. Cl.
*C30B 29/38* (2006.01)
*H01L 21/20* (2006.01)
*H01L 21/205* (2006.01)
*H01L 21/324* (2006.01)
*H01L 21/02* (2006.01)
*C30B 29/40* (2006.01)

(52) U.S. Cl.
CPC .... *H01L 21/0254* (2013.01); *H01L 21/02172* (2013.01); *H01L 21/02205* (2013.01); *H01L 21/02304* (2013.01); *H01L 21/02389* (2013.01); *H01L 21/20* (2013.01); *H01L 21/205* (2013.01); *H01L 21/324* (2013.01); *H01L 21/3245* (2013.01)

(56) References Cited

U.S. PATENT DOCUMENTS

| | | |
|---|---|---|
| 2005/0287774 A1 | 12/2005 | Shibata et al. |
| 2010/0244086 A1 | 9/2010 | Hanawa et al. |
| 2011/0101391 A1 | 5/2011 | Miki et al. |
| 2012/0223329 A1 | 9/2012 | Kinoshita et al. |
| 2014/0315394 A1 | 10/2014 | Jouanneau et al. |

FOREIGN PATENT DOCUMENTS

| | | |
|---|---|---|
| JP | 60-163440 | 8/1985 |
| JP | 4-107918 | 4/1992 |
| JP | 9-312417 | 12/1997 |
| JP | 10-32370 | 2/1998 |
| JP | 2001-15443 | 1/2001 |
| JP | 2006-332570 | 12/2006 |
| JP | 2006-335607 | 12/2006 |
| JP | 2006-339396 | 12/2006 |
| JP | 2008-60519 | 3/2008 |
| JP | 2008-270749 | 11/2008 |
| JP | 2008-306114 | 12/2008 |
| JP | 5085067 | 9/2012 |
| JP | 2013-21028 | 1/2013 |
| JP | 2014-535171 | 12/2014 |
| JP | 2015-42598 | 3/2015 |
| WO | 2009/113458 | 9/2009 |
| WO | 2011/058968 | 5/2011 |

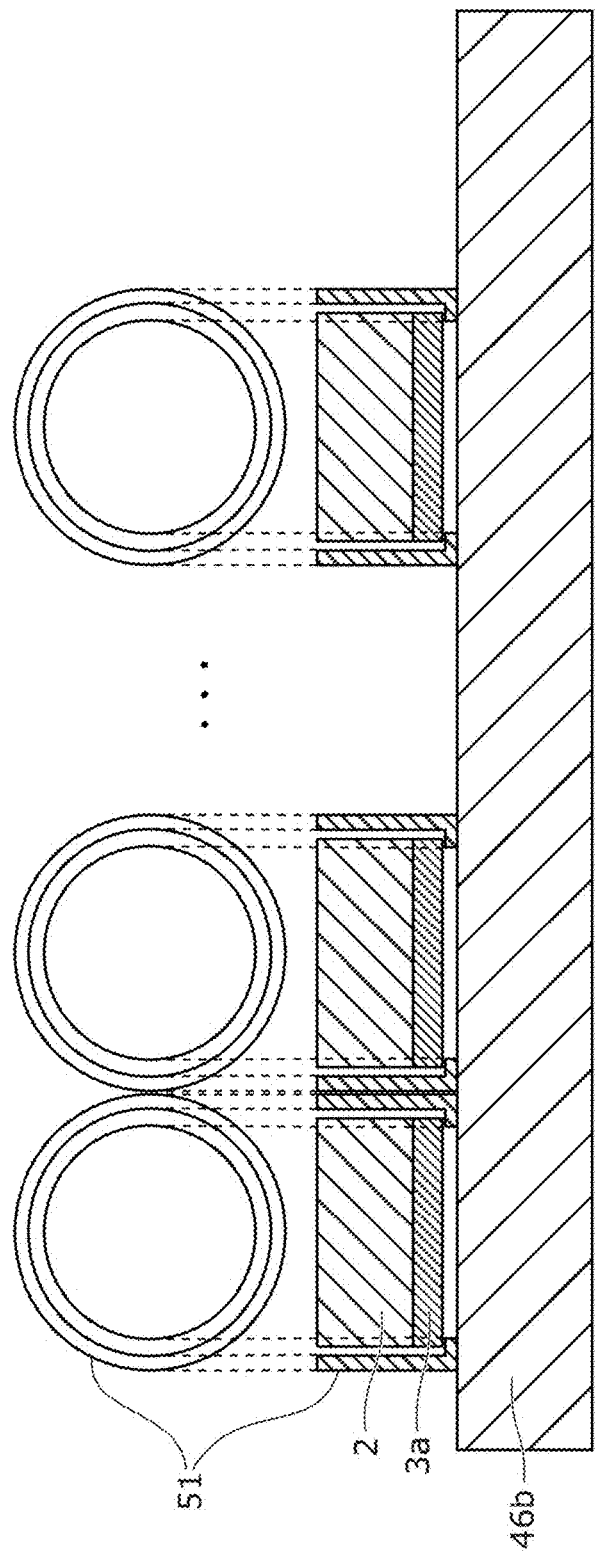

| No. | 1a | 2a | 3a | 4a | 5a | 6a | 7a | 8a | 9a | 10a | 11a |
|---|---|---|---|---|---|---|---|---|---|---|---|
| Temperature (°C) | 1400 | 1600 | 1600 | 1650 | 1650 | 1650 | 1700 | 1700 | 1700 | 1700 | 1750 |
| AlN film deposition method | Sputtering | Sputtering | Sputtering | Sputtering | Sputtering | Sputtering | Sputtering | Sputtering | Sputtering | MOVPE | Sputtering |
| AlN film thickness (nm) | 173 | 170 | 353 | 174 | 170 | 352 | 171 | 352 | 170 | 320 | 173 |
| Gas-tight state | AlN/Sap. | AlN/Sap. | AlN/Sap. | AlN/Sap. | AlN/Sap. | AlN/Sap. | AlN/Sap. | AlN/Sap. | AlN/Sap. | AlN/Sap. | AlN/Sap. |
| Ambient gas | Nitrogen+NH₃ | Nitrogen | Nitrogen | Nitrogen+NH₃ | Nitrogen | Nitrogen | Nitrogen | Nitrogen | Nitrogen | Nitrogen | Nitrogen |
| XRC before annealing | | | | | | | | | | | |
| (0002) (arcsec) | 115 | 698 | 2321 | 56 | 729 | 2553 | 317 | 2584 | 2426 | 270 | 64 |
| (10-12) (arcsec) | 4783 | 5945 | 6318 | 5012 | 5755 | 5704 | 5779 | 5749 | 6283 | 1841 | 5283 |
| XRC after annealing | | | | | | | | | | | |
| (0002) (arcsec) | 56 | 51 | 141 | 48 | 60 | 151 | 49 | 53 | 205 | 197 | 273 |
| (10-12) (arcsec) | 1492 | 422 | 682 | 357 | 367 | 469 | 287 | 244 | 394 | 258 | 452 |
| Surface state | Good | Good | Good | Good | Good | Good | Good | Good | Good | Good | Fair |

(b)

| No. | 1b | 2b | 3b |
|---|---|---|---|
| Temperature (°C) | 1500 | 1750 | 1700 |
| AlN film deposition method | Sputtering | Sputtering | Sputtering |
| AlN film thickness (nm) | 173 | 174 | 170 |
| Gas-tight state | AlN box | AlN box | Sap. |
| Ambient gas | Nitrogen+NH₃ | Nitrogen | Nitrogen |
| XRC before annealing | | | |
| (0002) (arcsec) | 70 | 71 | 532 |
| (10-12) (arcsec) | 4594 | 6344 | 6031 |
| XRC after annealing | | | |
| (0002) (arcsec) | 90 | 404 | 50 |
| (10-12) (arcsec) | 1393 | 527 | 340 |
| Surface state | Good | Fair | Good |

(c)

| No. | 1c | 2c | 3c | 4c |
|---|---|---|---|---|
| Temperature (°C) | 1400 | 1400 | 1700 | 1750 |
| AlN film deposition method | Sputtering | Sputtering | Sputtering | Sputtering |
| AlN film thickness (nm) | 172 | 172 | 340 | 340 |
| Gas-tight state | Not gas-tight | Not gas-tight | Not gas-tight | Not gas-tight |
| Ambient gas | Nitrogen+NH₃ | Nitrogen | Nitrogen | Nitrogen |
| XRC before annealing | | | | |
| (0002) (arcsec) | 145 | 81 | 70 | 70 |
| (10-12) (arcsec) | 5727 | 4986 | 5537 | 5537 |
| XRC after annealing | | | | |
| (0002) (arcsec) | 83 | 113 | 358 | 9676 |
| (10-12) (arcsec) | 1498 | 2010 | 8733 | 9239 |
| Surface state | Fair | Poor | Poor | Poor |

(a) (0002) Diffraction (b) (10-12) Diffraction

FIG. 24

| No. | 3d | 3e | 4d | 4e |
|---|---|---|---|---|
| Spacing (μm) | 0 | 430 | 860 | (3 mm) |
| Temperature (°C) | 1660 | 1660 | 1660 | 1660 |
| AlN film deposition method | Sputtering | Sputtering | Sputtering | Sputtering |
| AlN film thickness (nm) | 283 | 290 | 286 | 284 |
| Cover substance | AlN/Sap. | AlN/Sap. | AlN/Sap. | None |
| Ambient gas | Nitrogen | Nitrogen | Nitrogen | Nitrogen |
| XRC before annealing | | | | |
| (0002) (arcsec) | 59 | 59 | 65 | 59 |
| (10-12) (arcsec) | 4556 | 4620 | 4696 | 4531 |
| XRC after annealing | | | | |
| (0002) (arcsec) | 89 | 404 | 598 | 865 |
| (10-12) (arcsec) | 860 | 835 | 1830 | 1563 |
| Surface state | Good | Fair | Fair | Poor |
| RMS (nm) | 2.17 | 2.03 | 6.89 | Not measured |

METHOD FOR MANUFACTURING NITRIDE SEMICONDUCTOR SUBSTRATE

TECHNICAL FIELD

The present invention relates to a method for manufacturing a nitride semiconductor substrate which includes a substrate, and a buffer layer which includes a group III nitride semiconductor formed on the substrate.

BACKGROUND ART

Ultraviolet light emitting elements have been widely attracting attention as next-generation light sources used for illumination, sterilization, photolithography, laser machines, medical equipment, light sources for phosphors, spectral distribution analysis, ultraviolet curing, and so on. Such an ultraviolet light emitting element includes a group III nitride semiconductor such as aluminum gallium nitride (AlGaN) or aluminum nitride (AlN) deposited on a substrate such as a sapphire substrate.

For example, AlN has a very wide band gap among those of semiconductor materials, and can efficiently take out ultraviolet light to the outside. Thus, AlN is expected as a highly efficient light emitting element substrate. However, a bulk AlN monocrystal substrate does not have sufficient crystallinity, is expensive, and is not available in a large size, so that the material of a substrate for an ultraviolet light emitting element has many problems involving crystallinity and cost.

In view of such circumstances, if a high-quality AlN thin layer can be produced on an inexpensive sapphire substrate, an ultraviolet light emitting element and a light receiving element can be produced by substantially homoepitaxially growing AlGaN using such a semiconductor substrate in which an AlN thin layer is formed on a sapphire substrate.

However, there is a large lattice mismatch between AlN and sapphire, and thus an AlN layer grown on a sapphire substrate includes many threading dislocations. Accordingly, it is difficult to obtain an AlN layer having a flat surface, which is deposited on the sapphire substrate, and also there is a problem that the AlN layer has many crystal defects. Furthermore, the crystallinity of AlGaN serving as a light emitting layer inherits the crystallinity of AlN, and thus the technology of producing AlN having low defect density is extremely important.

For example, Patent Literatures (PTLs) 1 and 2 disclose technology as methods for obtaining a high-quality layer (thin film) which has low defect density of AlN crystals. Furthermore, PTL 3 discloses technology of reducing surface roughness of substrates by performing high-temperature processing on the substrates in a state where the substrates, although they do not include AlN crystals, are placed in contact.

CITATION LIST

Patent Literature

[PTL 1] Japanese Unexamined Patent Application Publication No. 2013-21028
[PTL 2] Japanese Unexamined Patent Application Publication No. 2008-60519
[PTL 3] Japanese Unexamined Patent Application Publication No. 2006-339396

SUMMARY OF INVENTION

Technical Problem

According to the manufacturing method disclosed in PTL 1, oxygen partially leaves from the c-plane of a sapphire substrate, and thus a surface in which Al atoms are exposed and a surface from which oxygen atoms have not left are formed on the sapphire substrate. After that, an AlN layer is formed on the sapphire substrate in an atmosphere of a hydrogen gas, a nitrogen gas, or a mixed gas of a hydrogen gas and a nitrogen gas. At this time, on the sapphire substrate, the surface where Al atoms are exposed rapidly reacts to the introduced gas and is nitrided so as to be given an N polarity, and the surface from which oxygen has not left has an Al polarity. Furthermore, the AlN layer formed on the sapphire substrate is annealed (subjected to heat treatment), whereby components sublimate from and go out of the region of the N polar surface. Accordingly, components are sublimated only from the region of the N polar surface on the sapphire substrate. Accordingly, a hollow is formed in the AlN layer on the sapphire substrate, resulting in a rough surface. Thus, it is difficult to provide a substrate on which a high-quality AlN layer having a flat surface is formed.

The manufacturing method disclosed in PTL 2 is technology of reducing dislocations by heat-treating an AlN epitaxial film in an atmosphere of a nitrogen-element containing gas to which an oxygen-element containing gas is added, and diffusing oxygen atoms in the epitaxial film. Nevertheless, it is difficult to control concentration of the oxygen-element containing gas and a temperature, which leads to a problem of difficulty in always obtaining constant crystalline accuracy.

Note that PTL 3 discloses technology of reducing the surface roughness of silicon carbide substrates by heat-treating the silicon carbide substrates placed in contact, yet PTL 3 is directed to technology of sublimating SiC molecules from silicon carbide (SiC) substrates and epitaxially growing the SiC molecules on the surfaces of the SiC substrates by vapor-phase epitaxy. Thus, the technology is not for nitride semiconductor substrates, and is different from annealing treatment technology.

The present invention is to address the problems described above, and an object thereof is to provide a method for manufacturing a high-quality nitride semiconductor substrate having a flat surface.

Solution to Problem

In order to achieve the above object, a method for manufacturing a nitride semiconductor substrate according to an aspect of the present invention includes: a step of placing, in an annealing furnace, a semiconductor substrate which includes: a substrate which includes one of sapphire, silicon carbide, and aluminum nitride; and a precursor of a buffer layer which includes a group III nitride semiconductor represented by $Al_xGa_yIn_{(1-x-y)}N$, where $0 \leq x \leq 1$, $0 \leq y \leq 1$, and $(x+y) \leq 1$, such that the precursor and a cover member face each other with at most a 0.5-mm spacing therebetween to inhibit dissociation of a component of the group III nitride semiconductor due to heating the semiconductor substrate, the precursor being formed on a surface of the substrate and including group III nitride semiconductor grains; and a step of annealing the semiconductor substrate in the annealing furnace in an inert gas atmosphere for at least 20 minutes at a temperature of the semiconductor substrate in a range from 1400° C. to 1750° C.

Here, the semiconductor substrate may be placed in the annealing furnace in a state in which movement of the semiconductor substrate is limited from a periphery side by a substrate holder in the annealing furnace.

The precursor of the buffer layer which includes the group III nitride semiconductor may be formed by sputtering.

A method for manufacturing a nitride semiconductor substrate according to an aspect of the present invention includes: a preparation step of preparing a substrate which includes at least one of sapphire, silicon carbide, and aluminum nitride in a container which is coverable with a lid while the substrate is stored in the container, and includes, in the container, a substrate holder which limits movement of the substrate from a periphery side of the substrate; a buffer layer forming step of forming, on the substrate, a precursor of a buffer layer which includes a group III nitride semiconductor represented by $Al_xGa_yIn_{(1-x-y)}N$, where $0 \leq x \leq 1$, $0 \leq y \leq 1$, and $(x+y) \leq 1$, in the container in an uncovered state; a step of creating a gas-tight state in the container by covering the container with the lid after forming the precursor of the buffer layer; and an annealing step of annealing the nitride semiconductor substrate on which the precursor of the buffer layer which includes the group III nitride semiconductor is formed through the buffer layer forming step, in an inert gas atmosphere and at a temperature higher than a temperature in the buffer layer forming step.

Advantageous Effects of Invention

According to the present invention, a method for manufacturing a high-quality nitride semiconductor substrate having a flat surface can be provided.

BRIEF DESCRIPTION OF DRAWINGS

FIG. 9B is a diagram illustrating a variation of the gas-tight state in FIG. 9A.

FIG. 16 is a diagram illustrating manufacturing conditions for and evaluation results of a plurality of nitride semiconductor substrates manufactured for evaluation and each having an AlN film serving as a buffer layer formed.

FIG. 24 is a diagram illustrating manufacturing conditions for and evaluation results of a plurality of nitride semiconductor substrates having AlN films as buffer layers formed and manufactured for evaluation.

DESCRIPTION OF EMBODIMENTS

The following describes embodiments of the present invention in detail with reference to the drawings. In the following description, aluminum nitride may be represented by AlN, aluminum gallium nitride may be represented by AlGaN, aluminum gallium indium nitride may be represented by AlGaInN, sapphire may be represented by $Al_2O_3$, and silicon carbide may be represented by SiC.

The embodiments described below each illustrate a particular preferable example of the present invention. Thus, the numerical values, shapes, materials, elements, the arrangement and connection of the elements, steps, the order in which the steps are performed, and others indicated in the following embodiments are examples, and are not intended to limit the present invention. The present invention is defined by the claims. Thus, among the elements in the following embodiments, elements not recited in any of the independent claims are described as arbitrary elements.

[Configuration of a Nitride Semiconductor Substrate]

Figure 1:
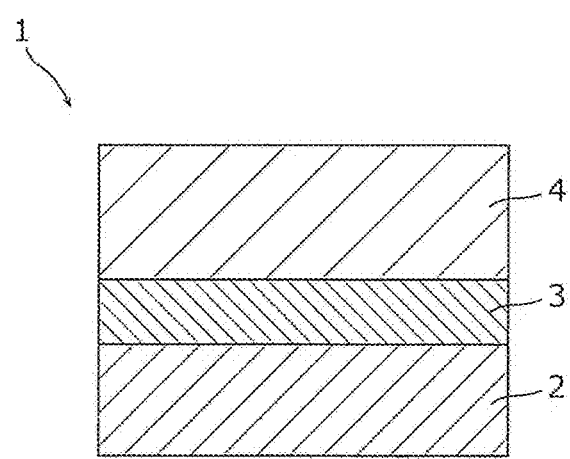
FIG. 1 is a schematic diagram of a nitride semiconductor substrate according to an embodiment.
Figure 2:
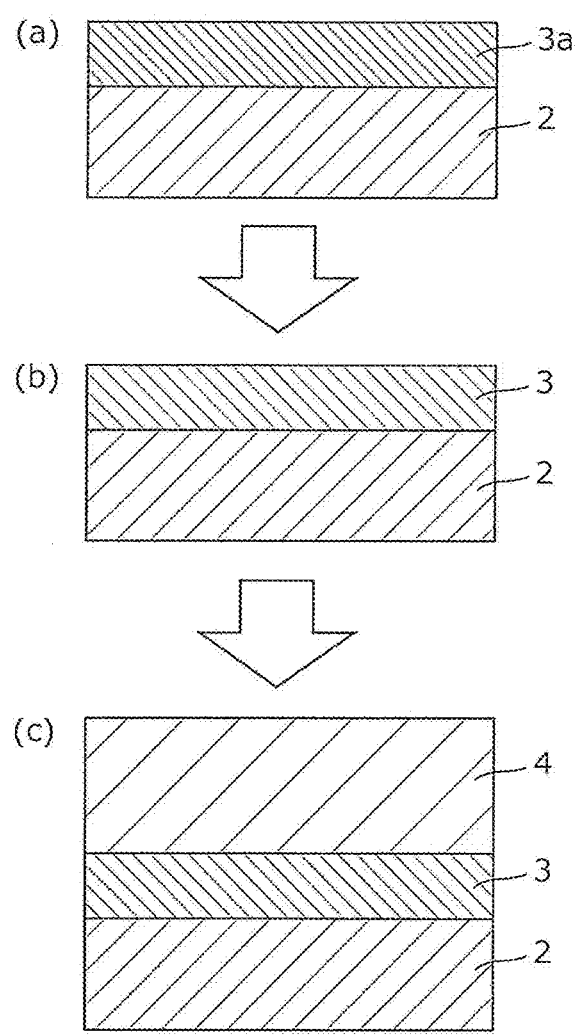
FIG. 2 is a schematic diagram illustrating a method for manufacturing the nitride semiconductor substrate illustrated in FIG. 1.

First, a nitride semiconductor substrate according to an embodiment is described, with reference to FIGS. 1 and 2. FIG. 1 is a schematic diagram of a nitride semiconductor substrate according to the present embodiment. FIG. 2 is a schematic diagram illustrating a method for manufacturing the nitride semiconductor substrate illustrated in FIG. 1.

As illustrated in FIG. 1, a nitride semiconductor substrate 1 according to the present embodiment has a configuration in which a sapphire substrate 2 which is an example of a substrate, an aluminum nitride buffer layer (AlN buffer layer) 3 which is an example of a buffer layer that includes a first group III nitride semiconductor, and an aluminum nitride layer (AlN layer) 4 which is an example of a second group III nitride semiconductor regrown on the buffer layer are stacked. Note that the substrate is not limited only to a sapphire substrate, and may be a substrate which includes at least one of sapphire, silicon carbide (SiC), and aluminum nitride (AlN). The first group III nitride semiconductor and the second group III nitride semiconductor are not limited only to aluminum nitride (AlN), and may be aluminum nitride (AlN), aluminum gallium nitride (AlGaN), or an aluminum gallium indium nitride (AlGaInN) represented by $Al_xGa_yIn_{(1-x-y)}N$, where $0 \leq x \leq 1$, $0 \leq y \leq 1$, and $(x+y) \leq 1$.

Specifically, in the present embodiment, as illustrated in (a) of FIG. 2, the nitride semiconductor substrate 1 includes a precursor 3a of the AlN buffer layer formed on the (0001) plane of the sapphire substrate 2. The precursor 3a of the AlN buffer layer is formed as the AlN buffer layer 3 as illustrated in (b) of FIG. 2, by being annealed at a predetermined temperature. Furthermore, the AlN layer 4 is further formed on the AlN buffer layer 3, as illustrated in (c) of FIG. 2.

Such a configuration allows the nitride semiconductor substrate 1 which includes the AlN layer 4 having a flat surface and high quality to be formed.

[Device which Manufactures Nitride Semiconductor Substrate]

Figure 3A:
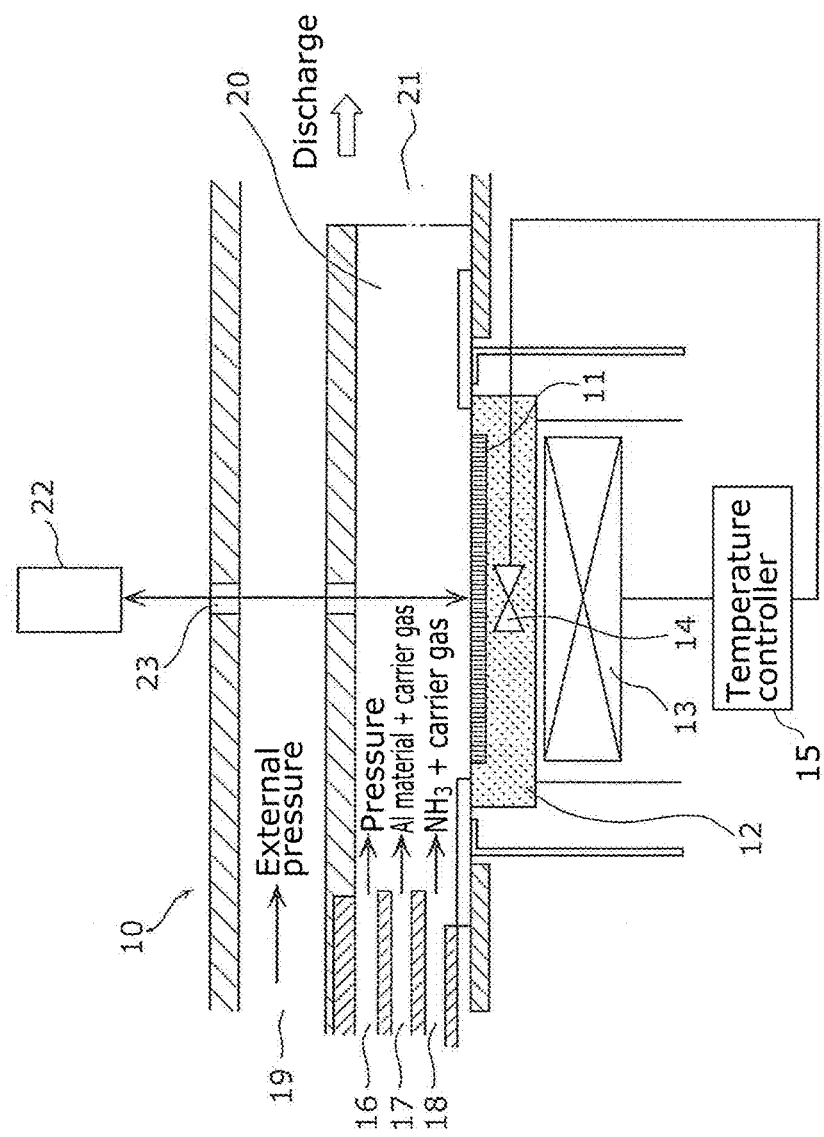
FIG. 3A is a schematic diagram of a metal organic vapor phase epitaxy (MOVPE) device according to the embodiment.

Next, a description of a device which manufactures the nitride semiconductor substrate according to the embodiment is given, with reference to FIG. 3A. FIG. 3A is a schematic diagram of a metal organic vapor phase epitaxy (MOVPE) device that is a device which manufactures the nitride semiconductor substrate according to the present embodiment.

MOVPE is a growing method of depositing a semiconductor thin film on a substrate by thermal decomposition reaction in which an organometallic compound and a hydride, for instance, are used as the materials. As illustrated in FIG. 3A, a MOVPE device 10 includes a substrate tray 12 for placing a substrate 11 to deposit a semiconductor thin film on the sapphire substrate 2, a heater 13, a thermocouple 14, a temperature controller 15, a pressing gas inlet 16, and a material gas inlet 17, a reactant gas inlet 18, an external pressure gas supplying port 19, a reactor 20, a vent 21, a radiation thermometer 22, and a see-through window 23.

The substrate 11 is placed on the substrate tray 12, and heated by the heater 13. The thermocouple 14 placed near the center of the substrate 1 monitors the temperature inside the MOVPE device 10 near the substrate 11, and the temperature controller 15 controls the temperature so that the temperature is set to a desired temperature.

The pressing gas inlet 16 is an inlet for taking in a pressing gas which controls the direction of the reactant gas so that the direction is changed to a direction in which the material gas and the reactant gas are sprayed onto the surface of the substrate. The material gas inlet 17 is for supplying an Al material such as trimethylaluminum (TMAl) and a carrier gas in gaseous form. The reactant gas inlet 18 is for supplying an ammonia ($NH_3$) gas and a carrier gas. The external pressure gas supplying port 19 is for supplying an external pressure gas for setting the atmospheric pressure in the reactor 20 to a desired pressure. The pressing gas, the material gas, the reactant gas, and the external pressure gas which are supplied at constant flow rates are discharged from the vent 21.

The radiation thermometer 22 measures the surface temperature near the center of the substrate 11 from the see-through window 23 of the MOVPE device 10 using infrared rays. Here, $H_2$, $N_2$, or a mixed gas of $H_2$ and $N_2$ is used for the pressing gas, the carrier gas, and the external pressure gas.

Figure 3B:
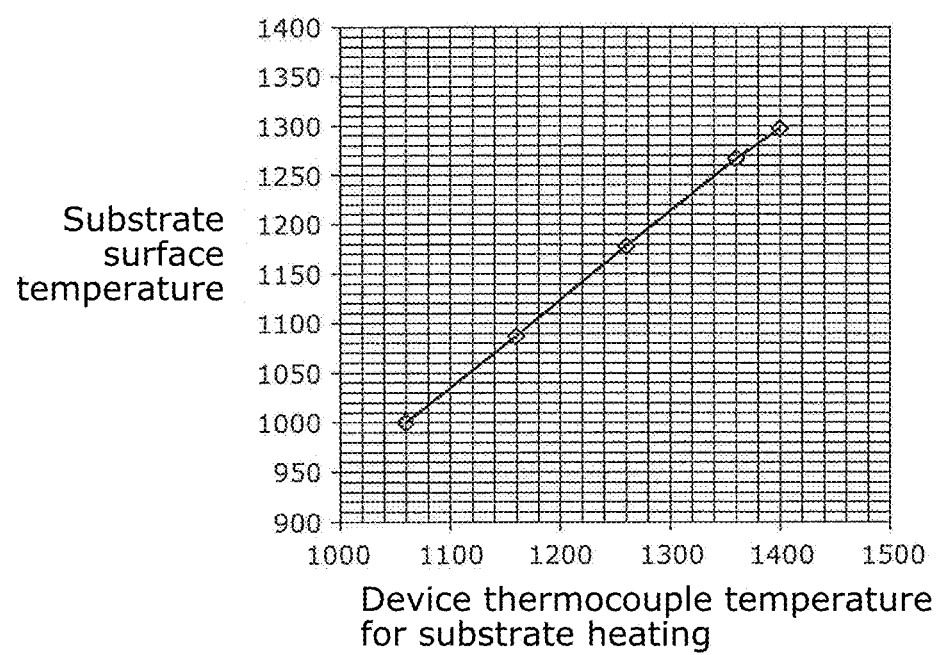
FIG. 3B is a correlation diagram showing values measured by a thermocouple and values of a substrate surface temperature measured by a radiation thermometer in the MOVPE device according to the embodiment.

FIG. 3B is a correlation diagram showing values of the temperature measured by the thermocouple 14 described above (hereinafter also referred to as "device thermocouple temperature") and values of the substrate temperature measured by the radiation thermometer 22 (hereinafter also referred to as "substrate surface temperature"). The substrate temperature is a surface temperature of the substrate 11, and the case where the sapphire substrate 2 is used as the substrate 11 is described as an example.

FIG. 3B illustrates points indicating substrate temperatures of 1001° C., 1087° C., 1179° C., 1266° C., and 1295° C. measured for device thermocouple temperatures of 1060° C., 1160° C., 1260° C., 1360° C., and 1400° C., and an approximate line passing through the points. The approximate line is represented by the following expression and passes through two points, namely, (1060, 1001) and (1400, 1295) as (tx, ty), where tx denotes the device thermocouple temperature, and ty denotes the substrate temperature.

Substrate temperature $ty=0.865 \times$ device thermocouple temperature $tx+84.1$ A difference between the device thermocouple temperature and the substrate temperature arises because the thermocouple 14 is disposed near the heater 13 than the surface of the substrate 11 and a difference in calibration value as a thermometer, for instance, is included. Note that a correlation of the values of the substrate temperature measured by the thermocouple 14 and the radiation thermometer 22 may be different from the correlation described above according to the type of the substrate 11 placed on the substrate tray 12.

[Method for Manufacturing Nitride Semiconductor Substrate]

Figure 4:
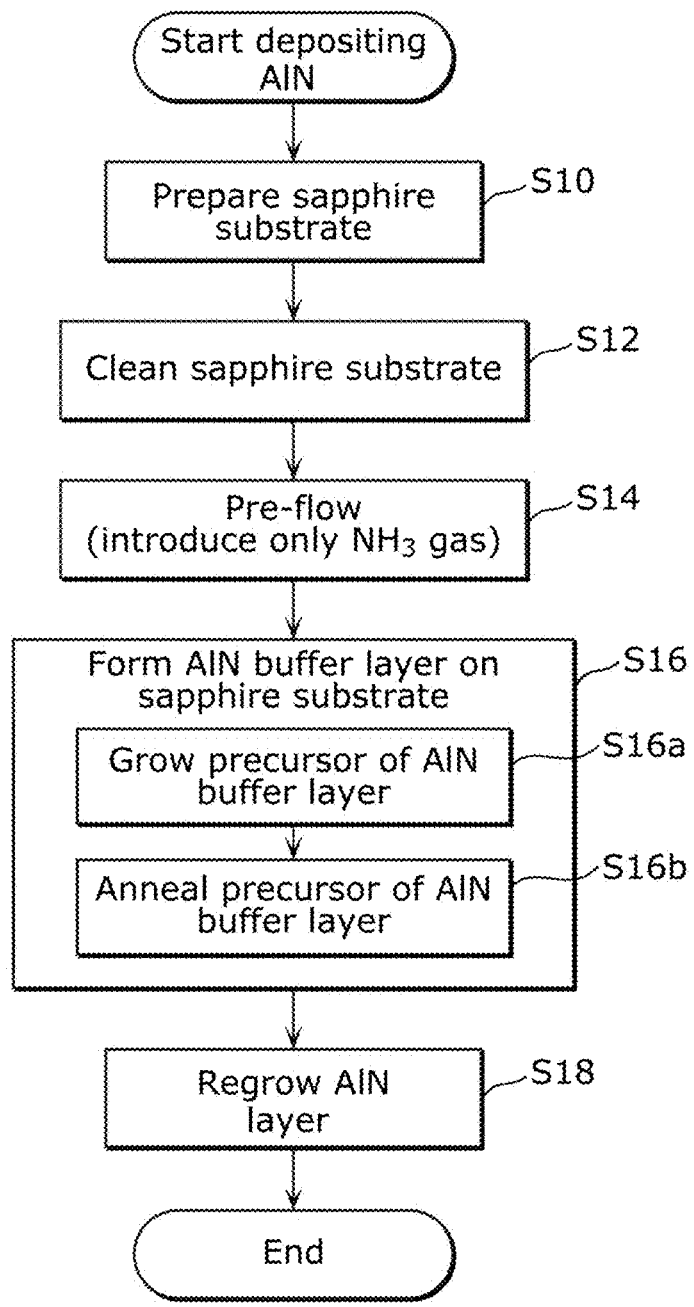
FIG. 4 is a flowchart illustrating a method for manufacturing the nitride semiconductor substrate according to the embodiment.
Figure 5:
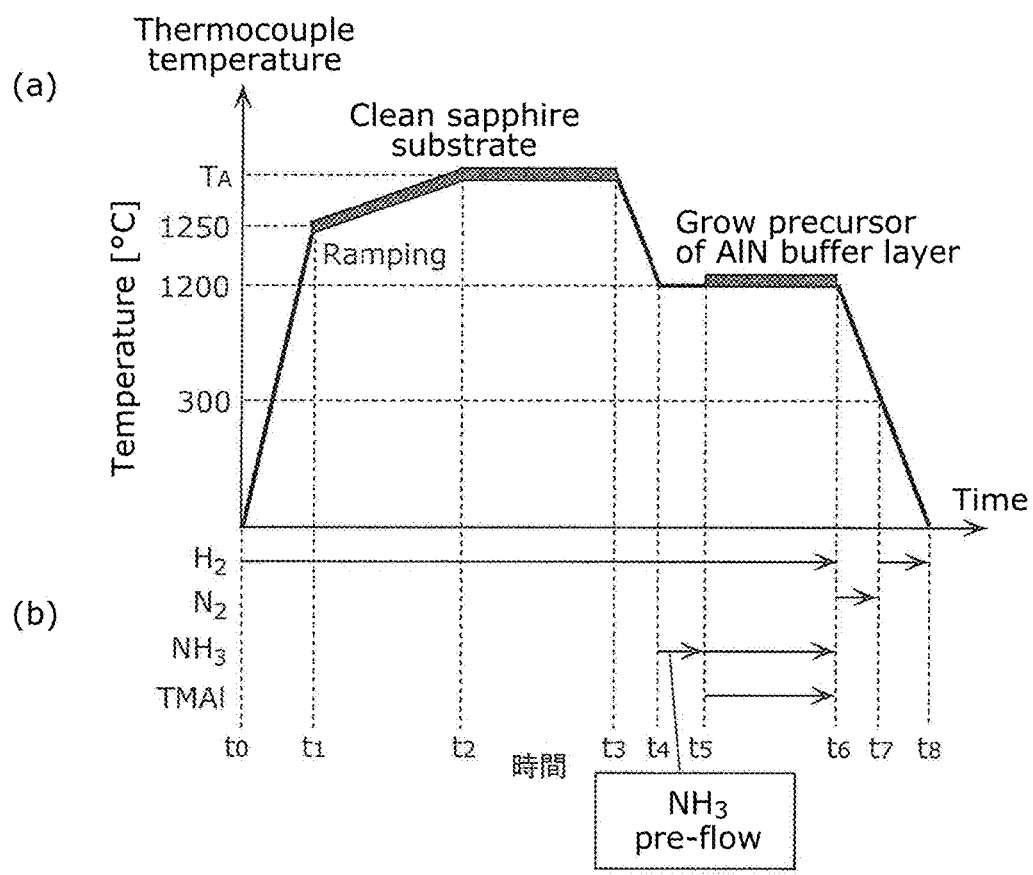
FIG. 5 is a time chart illustrating the method for manufacturing the nitride semiconductor substrate according to the embodiment.

Next, a method for manufacturing a nitride semiconductor substrate according to the embodiment is described with reference to FIGS. 4 and 5. FIG. 4 is a flowchart illustrating the method for manufacturing the nitride semiconductor substrate according to the present embodiment. FIG. 5 is a time chart illustrating the method for manufacturing the nitride semiconductor substrate according to the present embodiment.

An AlN layer is deposited on the sapphire substrate 2 by MOVPE described with reference to FIG. 3A. Note that a method for depositing an AlN layer is not limited to MOVPE, and sputtering, hydride vapor phase epitaxy (HVPE), or molecular beam epitaxy (MBE), for instance, may be applied. The surface orientation of the sapphire substrate 2 on which an AlN layer is deposited is not limited to a sapphire c-plane, and may be an a-plane, an r-plane, an n-plane, an m-plane, or an off-angled plane having an error difference of ±4 from the planes. Furthermore, the material of the substrate is not limited to sapphire, but may be SiC, AlN, or the like.

As illustrated in FIG. 4, the sapphire substrate 2 is prepared first (step S10). Step S10 is an example of a preparation step of preparing a substrate which includes at least one of sapphire, silicon carbide, and aluminum nitride. Here, for example, the sapphire substrate 2 having a 2-inch diameter and a c-plane orientation is prepared. The sapphire substrate 2 is placed on the substrate tray 12 of the MOVPE device 10.

Next, the surface of the sapphire substrate 2 is cleaned (step S12). This step is called a cleaning step. The sapphire substrate 2 is cleaned by introducing an $H_2$ gas in a reaction vessel and heating the sapphire substrate 2 in an $H_2$ gas atmosphere under a pressure of 30 Torr.

Specifically, as illustrated in (a) of FIG. 5, heating the sapphire substrate 2 placed on the substrate tray 12 starts at time t0, and the device thermocouple temperature for substrate heating is rapidly increased until time t1 when the device thermocouple temperature for substrate heating reaches 1250° C. (the substrate temperature of about 1165° C.). When the device thermocouple temperature for substrate heating reaches 1250° C., the device thermocouple temperature for substrate heating is gradually increased by the heater 13 until time t2 when the device thermocouple temperature for substrate heating reaches 1300° C. (the substrate temperature of about 1210° C.). Such gradual heating is aimed at preventing the sapphire substrate 2 from being heated to a temperature higher than or equal to the preset temperature. Once the device thermocouple temperature for substrate heating reaches 1300° C., the sapphire substrate 2 is continuously heated at the device thermocouple temperature for substrate heating of 1300° C. until time t3. The time period from time t1 to t2 is 5 minutes, and furthermore the time period from time t2 to time t3 is 5 minutes. Thus, the time period from time t1 to time t3 is 10 minutes, for example. If a longer time period, for example, 30 minutes, is spent for cleaning, the surface of the sapphire substrate 2 is roughened.

If cleaning the sapphire substrate 2 is completed at time t3, the sapphire substrate 2 is naturally cooled down to a temperature for forming the precursor 3a of an AlN buffer layer (here, the device thermocouple temperature for substrate heating of 1200° C. (the substrate temperature of about 1120° C.)), from time t3 to time t4.

Next, before forming the precursor 3a of the AlN buffer layer on the sapphire substrate 2, an $NH_3$ gas is precedently introduced from time t4 to time t5 (step S14). This step is called a pre-flow step. A time period from time t4 to time t5 is 30 seconds, for example.

A time period for the pre-flow step depends on the shape of the MOVPE device 10, yet in the MOVPE device 10 that is used, the gas is replaced in about 3 seconds, yielding effects of the precedent introduction. Accordingly, a time period for the pre-flow step may be longer than a time period for replacing the gas inside reactor 20 which is a reaction vessel. Through the pre-flow step, cleaning the surface of the sapphire substrate 2 in the $H_2$ gas atmosphere removes O atoms. The pre-flow step using an $NH_3$ gas precedently introduces nitrogen atoms onto the surface of the sapphire substrate 2, and thus Al atoms and N atoms on the surface of the sapphire substrate 2 are uniformly bonded on the entire surface of the sapphire substrate 2. Accordingly, in the AlN layer 4 formed on the sapphire substrate 2, good crystals having less misorientation grow within the surface of the sapphire substrate 2, as later described.

Next, an AlN buffer layer forming step of growing the AlN buffer layer 3 on the sapphire substrate 2 is performed (step S16). Step S16 is an example of a buffer layer forming step of forming a buffer layer which includes a group III nitride semiconductor (first group III nitride semiconductor) on the substrate.

As illustrated in FIG. 4, step S16 includes a step (step S16a) of growing the precursor 3a of the AlN buffer layer, and a step (step S16b) of annealing (performing heat treatment on) the grown precursor 3a of the AlN buffer layer. Step S16a is an example of a group III nitride semiconductor forming step of forming a group III nitride semiconductor on the substrate, and step S16b is an example of an annealing step of annealing the substrate on which the group III nitride semiconductor is formed, in a gas-tight state in which the principal surface of the group III nitride semiconductor is covered with a cover member for inhibiting components of the group III nitride semiconductor from dissociating from the principal surface of the formed group III nitride semiconductor. Here, "dissociation" refers to leaving and going out, and includes sublimation, evaporation, and diffusion. The "principal surface" of a semiconductor (or substrate) refers to, when another material is stacked (or formed) thereon, the surface on a side where the other material is stacked (or formed). Note that a state as disclosed in PTL 2 in which substrates each of which includes an AlN epitaxial film are placed so that a space is reduced and the gas-tight state as disclosed in the present invention involve different technical ideas, and furthermore in PTL 2, advantageous effects are yielded by supplying an oxygen containing gas and a nitrogen gas at constant flow rates, whereas in the present invention, a substantially gas-tight state is created. Thus, PTL 2 and the present invention involve different technical ideas.

Specifically, as step S16a mentioned above, trimethylaluminum (TMAl) which is a typical group III material, and ammonia ($NH_3$) which is a typical group V material are supplied into the MOVPE device 10 at time t5, and the precursor 3a of the AlN buffer layer is formed until time t6. The precursor 3a of the AlN buffer layer is, for example, an aggregate of crystalline islands that are crystals each grown into an island shape, the crystals having nuclei formed under conditions that a carrier gas is $H_2$, a growth pressure is 30 Torr, the flow rate of TMAl is 15 sccm, the flow rate of $NH_3$ is 1.0 slm, and the device thermocouple temperature for substrate heating is 1200° C. (substrate temperature is about 1120° C.). The precursor 3a of the AlN buffer layer is formed to have a thickness of 300 nm, for example. A time period for forming the precursor 3a of the AlN buffer layer to have a thickness of 300 nm is 20 minutes, for example.

Note that in the present embodiment, although the precursor 3a of the AlN buffer layer is formed at a device thermocouple temperature for substrate heating of 1200° C. (the substrate temperature of about 1120° C.), a temperature at which a buffer layer which includes a group III nitride semiconductor is deposited is not limited to such a temperature, and the precursor 3a of the AlN buffer layer may be formed at a device thermocouple temperature of 1300° C. or lower (a substrate temperature of about 1210° C. or lower).

After that, as illustrated in (b) of FIG. 5, in order to protect the surface of the precursor 3a of the AlN buffer layer, the sapphire substrate 2 on which the precursor 3a of the AlN buffer layer is formed is naturally cooled in a mixed gas atmosphere of $N_2$ and $NH_3$ until time t7 at which the device thermocouple temperature for substrate heating falls down to 300° C. Furthermore, the sapphire substrate 2 on which the precursor 3a of the AlN buffer layer is formed is naturally cooled in an $H_2$ atmosphere until time t8 at which the device thermocouple temperature for substrate heating falls down to a room temperature.

Note that the thickness of the precursor 3a of the AlN buffer layer is not limited to 300 nm, and may be a thickness which allows the AlN buffer layer to be used as a typical thin film. For example, the thickness of the precursor 3a of the AlN buffer layer may be 50 nm or greater. Note that if the crystallinity of the precursor 3a of the AlN buffer layer is considered as important, the thickness of the precursor 3a of the AlN buffer layer is preferably, for example, 300 nm or greater and 1 μm or less (0.05 μm to 1 μm, for example). If the thickness of the precursor 3a of the AlN buffer layer is 3 μm or greater, cracks may occur, and thus the thickness of buffer layer 3 which includes a group III nitride semiconductor is preferably 50 nm or greater and 3 μm or less.

After that, as step S16b described above, the precursor 3a of the AlN buffer layer is annealed, and the AlN buffer layer 3 is formed. Specifically, a substrate on which the group III nitride semiconductor is formed (here, the sapphire substrate 2 on which the precursor 3a of the AlN buffer layer is formed) in the gas-tight state in which the principal surface of the group III nitride semiconductor formed in step S16a described above (here, the precursor 3a of the AlN buffer layer) is covered with a cover member for inhibiting components of the group III nitride semiconductor (such as nitrogen, aluminum, gallium, and indium) from dissociating from the principal surface of the group III nitride semiconductor (here, the precursor 3a of the AlN buffer layer) is annealed (undergoes a heat treatment). In the annealing step, the sapphire substrate 2 is annealed using an annealing device (hereinafter also referred to as a "heating device"), at a substrate temperature in a range from 1400° C. to 1750° C. and in an atmosphere of an inert gas such as nitrogen, argon, or helium or a mixed gas obtained by adding an ammonia gas to an inert gas.

Note that in the preparation step for the annealing step, the sapphire substrate 2 on which the precursor 3a of the AlN buffer layer is formed is placed in the annealing device, and the air inside the annealing device is discharged to form a vacuum, and thereafter a gas is replaced by introducing an inert gas or a mixed gas. After that, the temperature of the sapphire substrate 2 is increased. At this time, a timing for starting an increase in the temperature may be after discharging the air inside the annealing device to form a vacuum. In increasing the temperature, the temperature is increased to, for example, about 1000° C. at high speed at a heating rate that is the upper limit of the capability of the annealing device, and thereafter is increase at a decreased heating rate.

For the pressure of the inert gas or the mixed gas in the annealing device, a range from 0.1 to 10 atmospheres (76 Torr to 7600 Torr) is the range with which annealing effects can be expected, yet the range is set to a range from about 0.5 to 2 atmospheres in relation to, for instance, the explosion-proof intensity at a high temperature. Theoretically, if the pressure of such gases is increased, improvement in crystallinity and reduction of surface roughness of the AlN buffer layer 3 can be expected, yet the pressure of the gases was set to about 1 atmosphere in the experiment.

Note that although described later, the annealing device may be a heating container having a certain volume, a function of controlling the substrate temperature in a range from 500° C. to 1800° C., and a function of controlling the pressure and flow rates of an inert gas and a mixed gas that are to be introduced into the annealing device and replaced with the gas inside. The "gas-tight state" achieved in the annealing device will be later described in detail.

After that, as illustrated in FIG. 4, the sapphire substrate which includes an AlN buffer layer is placed in the reaction vessel of the MOVPE device, for instance, and the AlN layer 4 as the second group III nitride semiconductor is further formed, by regrowth, on the AlN buffer layer 3 as the first group III nitride semiconductor (step S18). For example, the AlN layer 4 is formed under conditions that a carrier gas is a mixed gas of $N_2:H_2=85:15$, a growth pressure is 30 Torr, and the device thermocouple temperature for substrate heating is 1450° C. (a substrate temperature of about 1340° C.). Accordingly, the AlN layer 4 which newly grows on the AlN buffer layer 3 is formed to have a thickness of 700 nm, for example.

Note that the AlN layer 4 may be formed successively after the AlN buffer layer 3 is formed on the sapphire substrate 2. Alternatively, after the sapphire substrate 2 is taken out from the reaction vessel, a plurality of sapphire substrates 2 are placed in another reaction vessel, and the AlN layer 4 may be formed simultaneously on the sapphire substrates 2.

The second group III nitride semiconductor regrown on the first group III nitride semiconductor is not limited to an aluminum nitride, and may be one of an aluminum nitride (AlN), an aluminum gallium nitride (AlGaN), and an aluminum gallium indium nitride (AlGaInN) which are represented by $Al_xGa_yIn_{(1-x-y)}N$, where $0 \leq x \leq 1$, $0 \leq y \leq 1$, and $(x+y) \leq 1$.

Next, the gas-tight state in the above annealing step (step S16b) is described.

The gas-tight state is achieved within the annealing device in the annealing step (step S16b), and is a state in which the principal surface of the group III nitride semiconductor is covered with a cover member for inhibiting components of the group III nitride semiconductor (such as nitrogen, aluminum, gallium, and indium), from dissociating from the principal surface of the group III nitride semiconductor formed as a buffer layer, as described above. Specifically, the gas-tight state is achieved by inhibiting components of the group III nitride semiconductor from dissociating from the principal surface of the group III nitride semiconductor using a physical method. In this state, a stagnant state occurs in which a gas between the cover member and the principal surface of the group III nitride semiconductor does not substantially flow. Annealing the nitride semiconductor substrate in such a gas-tight state inhibits the principal surface of the group III nitride semiconductor from being roughened due to components of the group III nitride semiconductor dissociating from the principal surface. Furthermore, the nitride semiconductor substrate can be annealed at a higher temperature, thus achieving a nitride semiconductor substrate on which a high-quality group III nitride semiconductor having a flat surface is formed. The following illustrates specific examples of the gas-tight state.

Figure 6A:
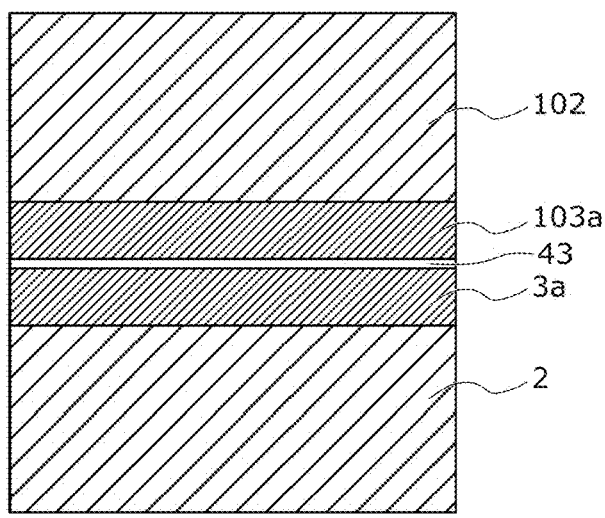
FIG. 6A is a diagram illustrating an example of a gas-tight state in an annealing step (step S16) in FIG. 4.

FIG. 6A is a diagram illustrating an example of the gas-tight state in the annealing step described above (step S16b). Here, FIG. 6A illustrates a cross-sectional view in a state in which above the sapphire substrate 2 on which the precursor 3a of the AlN buffer layer is formed, another sapphire substrate 102 on which a precursor 103a of an AlN buffer layer is formed is placed such that the precursors 3a and 103a of the aluminum nitride buffer layers face each other. According to this aspect, the precursors 3a and 103a of the aluminum nitride buffer layers face each other, being in contact with each other, yet the precursors 3a and 103a of the AlN buffer layers each have a structure in which the surface center portion is recessed by about 5 μm to 20 μm. Thus, a gas-tight space 43 having a maximum spacing of 10 μm to 40 μm is formed by the surfaces of the precursors 3a and 103a of the AlN buffer layers which face each other.

The gas-tight state illustrated in FIG. 6A corresponds to a state in which two substrates (the substrate and another substrate) manufactured through the steps up to step 16a are prepared, the other substrate is placed above the substrate (in this example, the other substrate is placed on the substrate) such that a group III nitride semiconductor of the substrate and a group III nitride semiconductor of the other substrate face each other. For the sapphire substrate 2 located below, the sapphire substrate 102 located above corresponds to a cover member, and in contrast, for the sapphire substrate 102 located above, the sapphire substrate 2 located below corresponds to a cover member.

Such a gas-tight state is simply achieved by merely placing another nitride semiconductor substrate on a nitride semiconductor substrate in such orientations that group III nitride semiconductors face each other. Thus, the gas-tight state is readily achieved without using a special jig. Furthermore, two nitride semiconductor substrates are simultaneously annealed without preparing special cover members. Since the temperature is high during annealing, the substrates warp differently depending on thermal expansion. Thus, the gas-tight state slightly changes, yet the evaluation result obtained after annealing shows that such a slight change gives little influence.

Note that in FIG. 6A, the cover member is the sapphire substrate 2 on which the precursor 3a of the AlN buffer layer is formed (or the other sapphire substrate 102 on which the precursor 103a of the AlN buffer layer is formed). Nevertheless, the present invention is not limited to this, and the cover member may include at least one material among a group III nitride semiconductor such as an aluminum nitride, carbon, boron nitride (BN), pyrolytic boron nitride (PBN), aluminum oxide (sapphire), ceramic, silicon carbide, refractory metal, zirconia, and tantalum carbide (TaC). Furthermore, one of the facing precursors 3a and 103a of the AlN buffer layers on the sapphire substrates may be the AlN buffer layer 3 or 103 which has already been annealed. For example, as illustrated in a variation in FIG. 6B, the cover member placed on the sapphire substrate 2 on which the precursor 3a of the AlN buffer layer is formed may be a sapphire substrate 102 on which a group III nitride semiconductor is not formed.

Furthermore, the upper and lower relation of the sapphire substrate 2 on which the precursor 3a of the AlN buffer layer is formed and the sapphire substrate 102 on which a group III nitride semiconductor is not formed may be reversed. Furthermore, two or more sapphire substrates 2 on each of which the precursor 3a of an AlN buffer layer is formed are stacked in the same direction, whereby the precursor 3a of the aluminum nitride buffer layer and the sapphire substrate 102 in FIG. 6A face each other, thus yielding similar advantageous effects. Moreover, similar advantageous effects can also be obtained by placing the sapphire substrate 2 on which the precursor 3a of the AlN buffer layer is formed, on a flat stand for resting substrates such that the precursor 3a of the AlN buffer layer is located at a lower position.

Figure 6B:
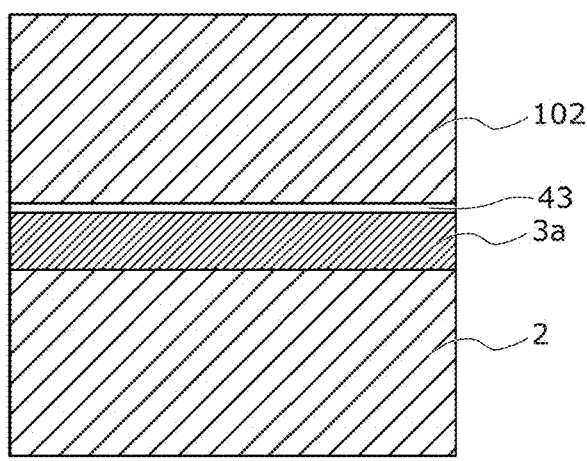
FIG. 6B is a diagram illustrating a variation of the gas-tight state in FIG. 6A.
Figure 6C:
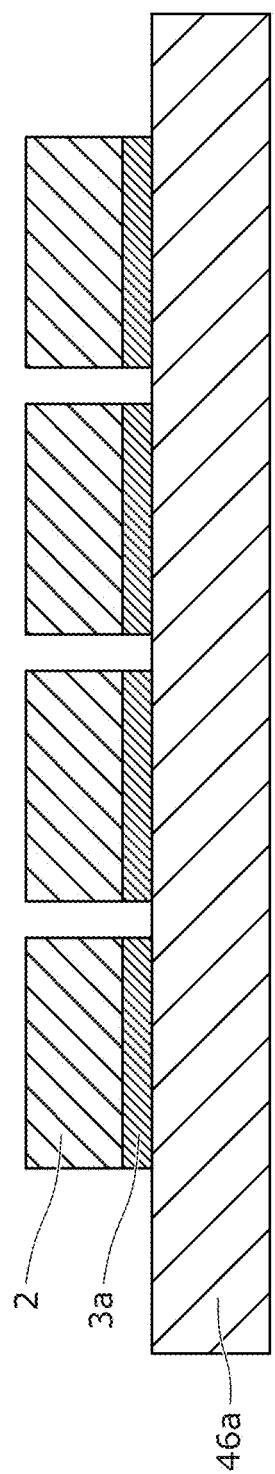
FIG. 6C is a diagram illustrating another variation of the gas-tight state in FIG. 6A.

For example, similar advantageous effects can also be obtained by placing a plurality of sapphire substrates 2 on each of which the precursor 3a of an AlN buffer layer is formed are placed on a base 46a in such a manner that the precursors 3a of the AlN buffer layers face downward as illustrated in FIG. 6C. The base 46a includes at least one material among a group III nitride semiconductor such as aluminum nitride, carbon, boron nitride (BN), pyrolytic boron nitride (PBN), aluminum oxide (sapphire), ceramic, silicon carbide, refractory metal, zirconia, and tantalum carbide (TaC), for example. The state illustrated in FIG. 6C corresponds to a state in which a plurality of sapphire substrates 2 having an upper and lower relation reversed from the relation illustrated in FIG. 6B are arranged.

Note that in FIG. 6C, four nitride semiconductor substrates are arranged on the base 46a in one direction, yet the number of nitride semiconductor substrates and the direction in which the nitride semiconductor substrates are arranged are not limited to these, and a plurality of nitride semiconductor substrates may be two-dimensionally arranged on the base 46a. Furthermore, a plurality of bases 46a each in the state as illustrated in FIG. 6C may be stacked by stacking the bases 46a using spacers, for instance. Such a configuration allows a great number of nitride semiconductor substrates to be simultaneously annealed in the gas-tight state. Here, providing grooves forming protrusions and recesses in a range from about 10 µm to 100 µm in the surface of the base 46a or roughening the surface of the base 46a prevents the precursors 3a of the AlN buffer layers on the sapphire substrates 2 from sticking to the base, and workability of placing and taking out the nitride semiconductor substrates can also be increased.

Figure 6D:
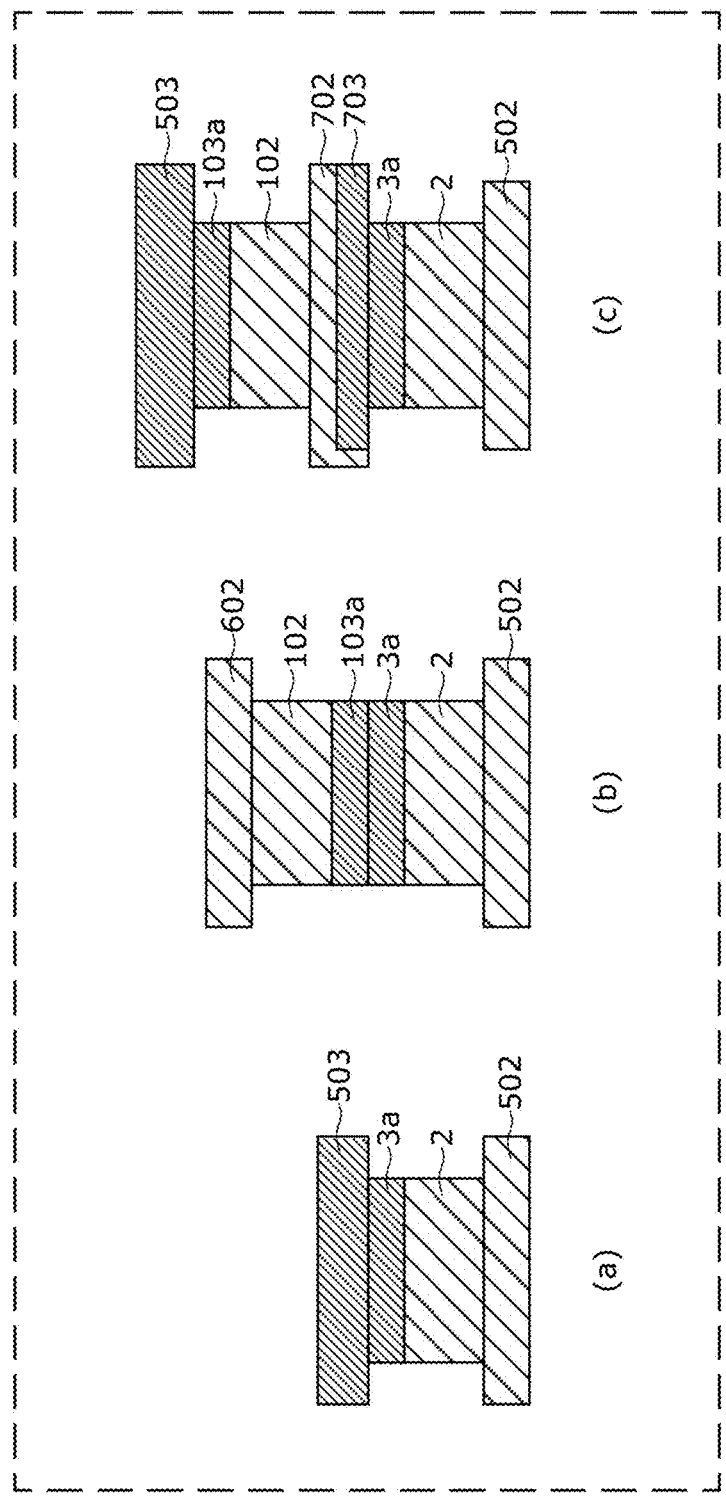
FIG. 6D is a diagram illustrating a variation of the gas-tight state in the annealing step (step S16) in FIG. 4.

Note that only one side of a nitride semiconductor substrate (the sapphire substrate 2 on which the precursor 3a of the AlN buffer layer is formed) (in other words, the surface of the precursor 3a of the AlN buffer layer) is brought into the gas-tight state as illustrated in FIGS. 6A to 6C, yet both sides of the nitride semiconductor substrate (in other words, also the surface of the sapphire substrate 2) may be brought into the gas-tight state as illustrated in FIG. 6D. At this time, opposite surfaces of substrates preferably include the same material.

In (a) of FIG. 6D, the sapphire substrate 2 on which the precursor 3a of an AlN buffer layer is formed is placed on a sapphire substrate 502, and an AlN substrate 503 is further placed on the precursor 3a. In (b) of FIG. 6D, the sapphire substrate 2 on which the precursor 3a of an AlN buffer layer is formed is placed on the sapphire substrate 502, another sapphire substrate 102 on which the precursor 103a of an AlN buffer layer is formed is further placed on the precursor 3a in such orientations that the precursors 3a and 103a of the AlN buffer layers face each other, and a sapphire substrate 602 is further placed on the other sapphire substrate 102. In (c) of FIG. 6D, the sapphire substrate 2 on which the precursor 3a of an AlN buffer layer is formed is placed on the sapphire substrate 502, a sapphire substrate 702 in which an AlN layer 703 is formed in at least a portion that faces the precursor 3a of the AlN buffer layer is placed on the precursor 3a in such orientations that the precursor 3a of the AlN buffer layer and the AlN layer 703 face each other, another sapphire substrate 102 on which the precursor 103a of an AlN buffer layer is formed is further placed on the sapphire substrate 702, and the AlN substrate 503 is further placed on the precursor 103a.

Also in any of (a) to (c) in FIG. 6D, among a sapphire substrate on which a precursor of an AlN buffer layer to be annealed is formed, the surface of the precursor of the AlN buffer layer is brought into the gas-tight state by being sealed by a layer which includes AlN that is the same material, and the surface of the sapphire substrate is brought into the gas-tight state by being sealed by a layer which includes sapphire that is the same material. As described above, each side of a nitride semiconductor substrate are brought into the gas-tight state by a substrate which includes the same material sealing a surface of the nitride semiconductor substrate which faces the substrate. Accordingly, not only the surface of an AlN buffer layer is inhibited from being roughened, but also the surface of a sapphire substrate is inhibited from being roughened by inhibiting decomposition by a nitrogen gas, for instance.

Figure 7A:
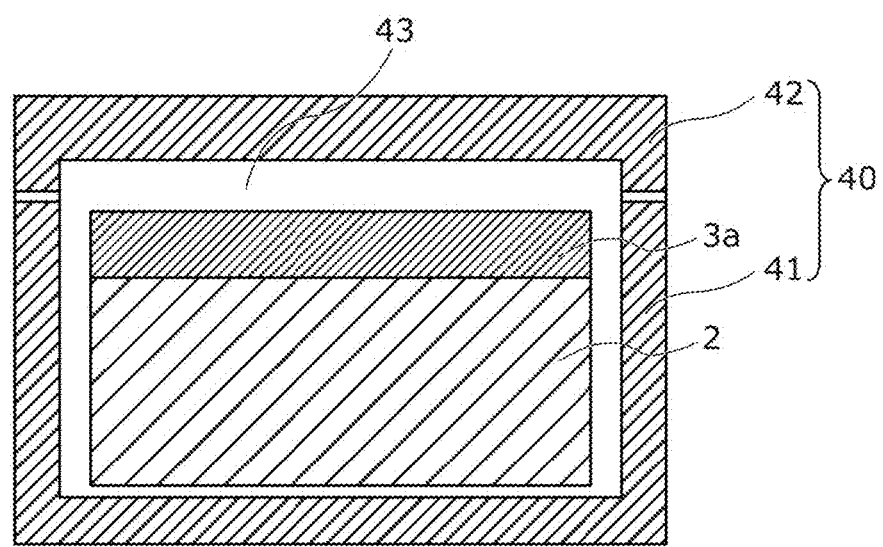
FIG. 7A is a diagram illustrating another example of the gas-tight state in the annealing step (step S16) in FIG. 4.

FIG. 7A is a diagram illustrating another example of the gas-tight state in the above annealing step (step S16b). Here, FIG. 7A illustrates a cross-sectional view in a state where the sapphire substrate 2 on which the precursor 3a of an AlN buffer layer is formed is placed in a tight container 40. The tight container 40 includes at least one material among, for example, a group III nitride semiconductor such as aluminum nitride, carbon, boron nitride (BN), pyrolytic boron nitride (PBN), aluminum oxide (sapphire), ceramic, silicon carbide, refractory metal, zirconia, and tantalum carbide (TaC). The tight container 40 includes a container body 41 and a lid 42, and stores the sapphire substrate 2 on which the precursor 3a of an AlN buffer layer is formed. The tight container 40 is filled with an inert gas such as nitrogen, argon, or helium or a gas obtained by adding ammonia to an inert gas. Using an inert gas as a principal component, an organic metal gas such as ammonia, oxygen, silane ($SiH_4$), monomethylsilane ($SiH_3CH_3$), germane ($GeH_4$), trimethylaluminum (TMA), or trimethylgallium (TMG) may also be mixed to the inert gas. Note that a through hole (not illustrated) which connects a gas-tight space 43 and the outside is preferably formed in at least one of the container body 41 and the lid 42, in order to degas when the gas inside the annealing device is discharged to form a vacuum.

The gas-tight state illustrated in FIG. 7A corresponds to a state in which a substrate on which a group III nitride semiconductor as a buffer layer is formed is placed in the tight container which includes the container body and the lid. A cover member is the lid 42 included in the tight container 40. A distance between the lid 42 and the principal surface of the group III nitride semiconductor (here, the precursor 3a of the AlN buffer layer) is about 0.5 mm, and the gas-tight space 43 is formed therebetween. The distance between the principal surface and the lid 42 is not limited to about 0.5 mm, and advantageous effects are yielded if the distance is within a range of 1 mm or shorter from the contact state illustrated in FIG. 6A.

Since a nitride semiconductor substrate is placed in a tight container in such a gas-tight state, the lid of the tight container functions as a cover member to form a gas-tight state, and furthermore the tight container also forms the gas-tight state. Accordingly, the gas-tight state is more reliably maintained.

Figure 7B:
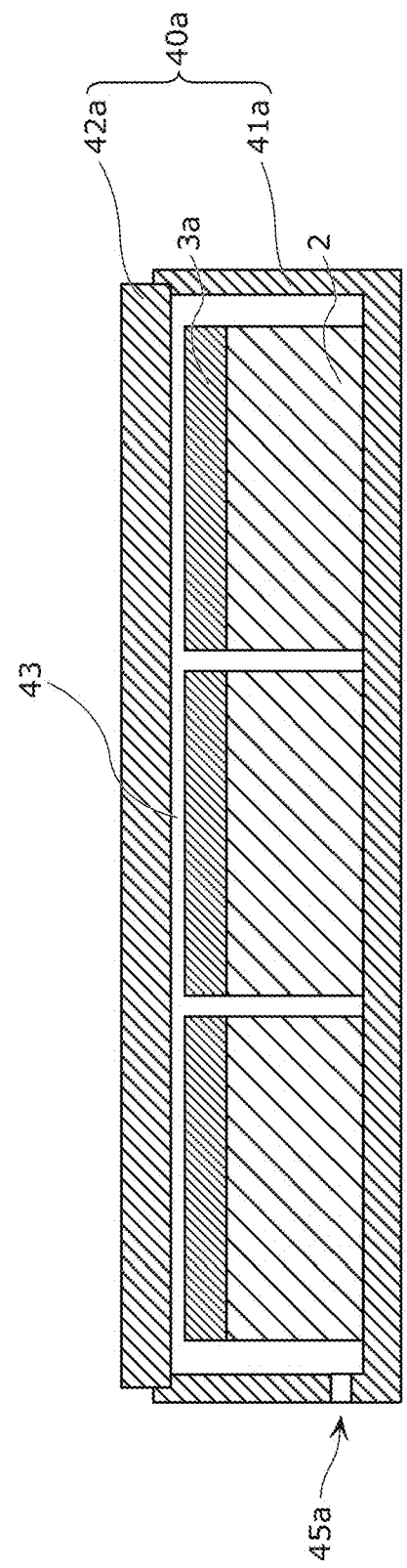
FIG. 7B is a diagram illustrating a variation of the gas-tight state in FIG. 7A.
Figure 7C:
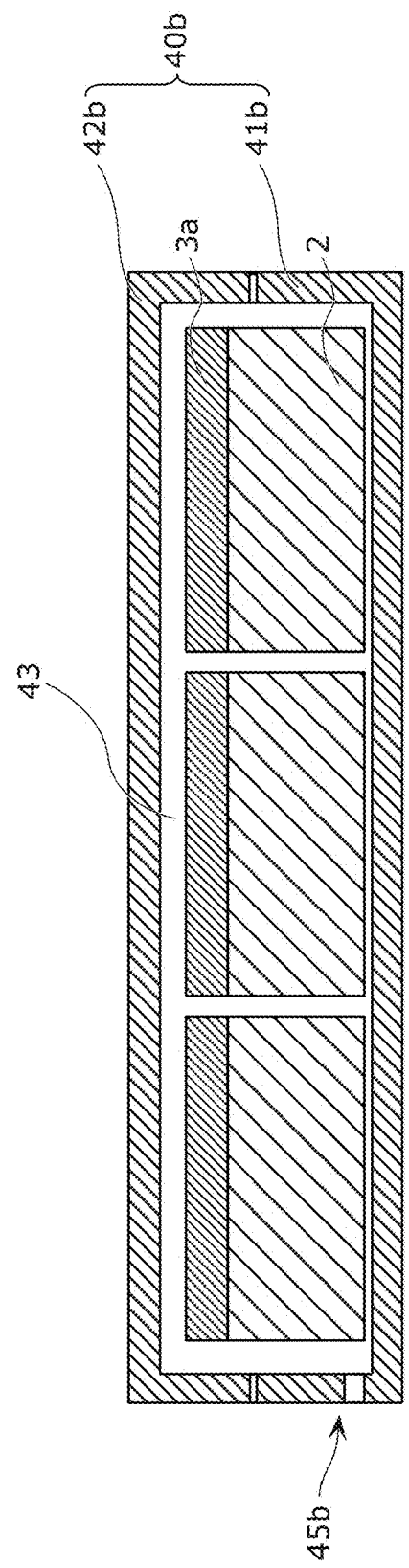
FIG. 7C is a diagram illustrating another variation of the gas-tight state in FIG. 7A.

Note that one nitride semiconductor substrate is placed in one tight container in FIG. 7A, yet the present invention is not limited to such an aspect, and as illustrated in FIGS. 7B and 7C, a plurality of nitride semiconductor substrates may be placed in one tight container and annealed.

Figure 7D:
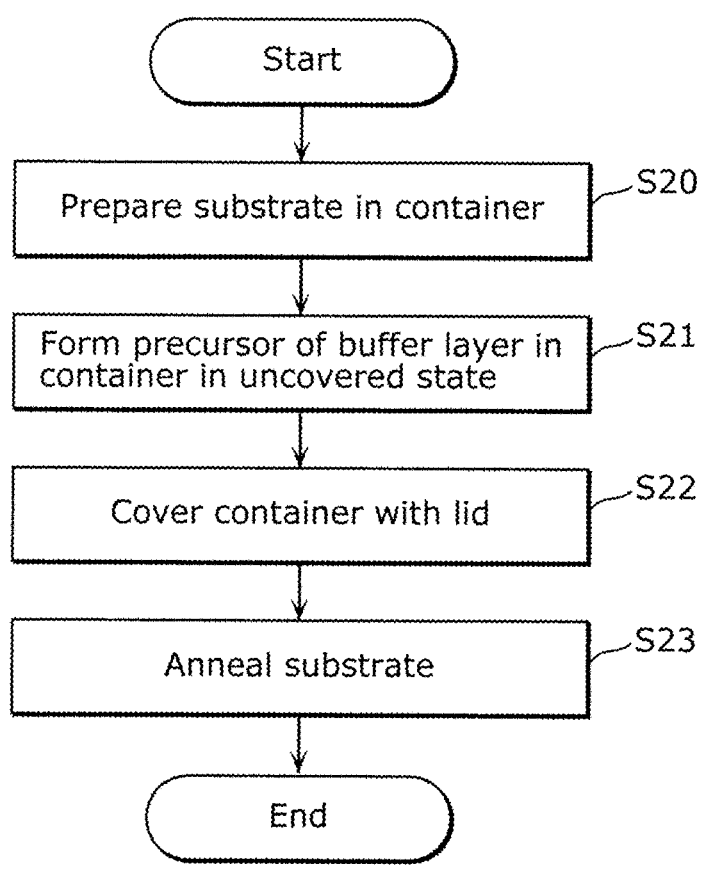
FIG. 7D is a flowchart illustrating a method for manufacturing the nitride semiconductor substrate using the gas-tight state in FIG. 7B.

In FIG. 7B, three sapphire substrates 2 on each of which the precursor 3a of an AlN buffer layer is formed are placed in a tight container 40a which includes a container body 41a which includes, for example, carbon and a lid 42a which includes, for example, sapphire. A through hole 45a for gas replacement is provided in a portion of the lateral surface of the container body 41a near a bottom surface. A cover member is the lid 42a included in the tight container 40a. A distance between the lid 42a and the principal surface of a group III nitride semiconductor (here, the precursor 3a of an AlN buffer layer) is about 0.5 mm, and the gas-tight space 43 is formed therebetween. Yet, the distance between the principal surface and the lid 42a is not limited to about 0.5 mm, as mentioned above. The container body 41a can be coated with boron nitride, silicon carbide, or the like in order to avoid the influence of carbon to the AlN buffer layer. Furthermore, the container body 41a may include a polycrystalline aluminum oxide, sapphire, polycrystalline AlN, or the like. The shapes of the container body 41a and the lid 42a are not limited to those in FIG. 7B, and the lid 42a may be simply placed on the container body 41a as a lid having an area greater than the opening area of the container body 41a. If such a container structure is applied, as illustrated in the flowchart in FIG. 7D, a film depositing step using sputtering, for instance, is performed on the container body 41a, and an ambient gas is replaced after film deposition has ended (or specifically, a substrate is prepared in the container (20), and the precursor of a buffer layer is formed in the container in an uncovered state (S21)), after which the lid 42a is slid from the outside to cover the container body 41a (so that the gas-tight state is created in the container by covering the container with the lid (S22)) without greatly lowering the temperature and high temperature processing is performed. Accordingly, the film depositing step and the annealing step can be successively performed (S23), thus improving the productive efficiency of nitride semiconductor substrates.

In FIG. 7C, three sapphire substrates 2 on each of which the precursor 3a of an AlN buffer layer is formed are placed in a tight container 40b which includes a container body 41b coated with, for example, silicon carbide and a lid 42b which includes, for example, sapphire. In the lateral surface of the container body 41b, a through hole 45b for gas replacement is provided in a portion near the bottom surface. A cover member is the lid 42b included in the tight container 40b. A distance between the lid 42b and the principal surface of a group III nitride semiconductor (here, the precursor 3a of an AlN buffer layer) is about 0.5 mm, and the gas-tight space 43 is formed therebetween, yet the distance between the principal surface and the lid 42a is not limited to about 0.5 mm, as mentioned above.

The configurations illustrated in FIGS. 7B and 7C allow a plurality of nitride semiconductor substrates to be simultaneously annealed in the gas-tight state, thus improving efficiency of producing nitride semiconductor substrates. Note that for portions of the container close to the sapphire substrate and the AlN buffer layer, the material same as the material of the sapphire substrate/the AlN buffer layer may be used, or specifically, the container bodies 41, 41a, and 41b preferably include sapphire, and the lids 42, 42a, and 42b preferably include AlN.

Figure 8:
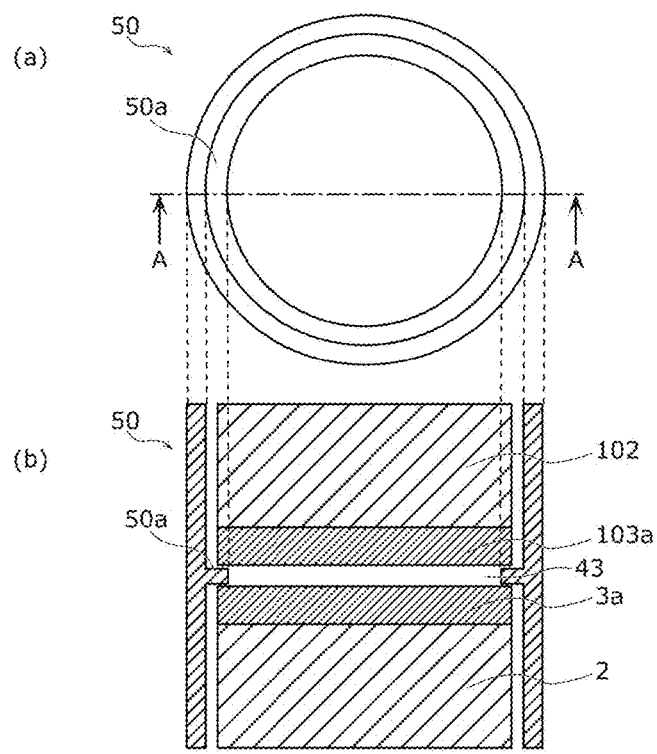
FIG. 8 is a diagram illustrating another example of the gas-tight state in the annealing step (step S16b) in FIG. 4.

FIG. 8 is a diagram illustrating another example of the gas-tight state in the above annealing step (step S16b). Here, FIG. 8 illustrates a top view ((a) of FIG. 8) and a cross-sectional view ((b) of FIG. 8) taken along AA in (a) of FIG. 8 in a state in which another sapphire substrate 102 on which a precursor 103a of an AlN buffer layer is formed is fixed above the sapphire substrate 2 on which the precursor 3a of the AlN buffer layer is formed in such an orientation that the precursors 3a and 103a of the AlN buffer layers face each other. More specifically, the two sapphire substrates 2 and 102 are fixed to each other by a belt member 50 which covers the lateral surfaces of the two sapphire substrates 2 and 102. The belt member 50 has a cylindrical structure as illustrated in (a) of FIG. 8, and includes, on the internal surface, a protrusion 50a as a spacer which separates the two sapphire substrates 2 and 102 by a certain distance (1 mm or shorter, or preferably 0.1 mm or shorter). The two sapphire substrates 2 and 102 are fixed to each other by the belt member 50, sandwiching the protrusion 50a, in a state in which the precursors 3a and 103a of the AlN buffer layers face each other. Consequently, a gas-tight space 43 surrounded by the two sapphire substrates 2 and 102 and the protrusion 50a is formed. For example, the belt member 50 may include at least one material among a group III nitride semiconductor such as aluminum nitride, carbon, boron nitride (BN), pyrolytic boron nitride (PBN), aluminum oxide (sapphire), ceramic, silicon carbide, refractory metal, zirconia, and tantalum carbide (TaC).

Note that the protrusion 50a is not essential and may not be included. In such a case, the two sapphire substrates 2 and 102 are in contact at perimeter portions such that the precursors 3a and 103a of the aluminum nitride buffer layers face each other, as illustrated in FIG. 6A.

The gas-tight state illustrated in FIG. 8 corresponds to a state in which two substrates (the substrate and another substrate) manufactured through the steps up to step 16a described above are prepared, and the other substrate is placed above the substrate in such a manner that the group III nitride semiconductor of the substrate and the group III nitride semiconductor of the other substrate face each other, sandwiching a spacer provided at a perimeter portion of the substrate. Similarly to the case in FIG. 6A, the sapphire substrate 102 located above corresponds to a cover member for the sapphire substrate 2 located below, and on the contrary, the sapphire substrate 2 located below corresponds to a cover member for the sapphire substrate 102 located above.

In such a gas-tight state, above a nitride semiconductor substrate, another nitride semiconductor substrate is placed with a spacer sandwiched therebetween, and thus the group III nitride semiconductors of the two nitride semiconductor substrates are prevented from being in contact, and the entire surfaces of the two group III nitride semiconductors are flattened by annealing. Furthermore, the two nitride semiconductor substrates are reliably fixed by the belt member 50.

Figure 9A:
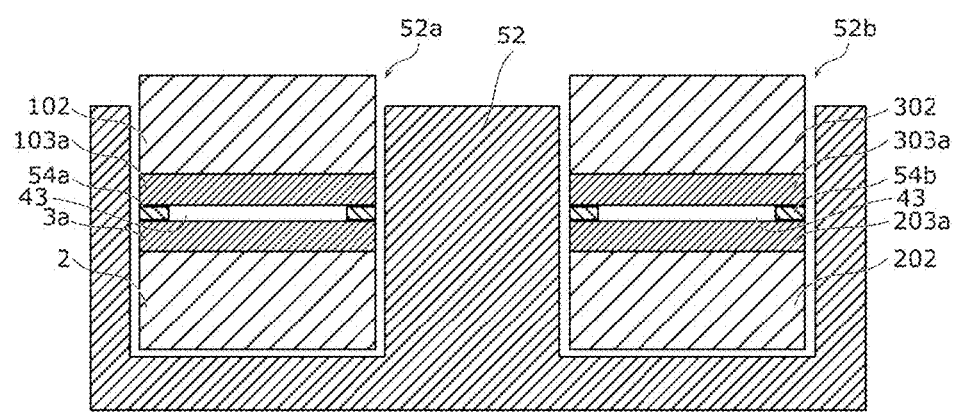
FIG. 9A is a diagram illustrating yet another example of the gas-tight state in the annealing step (step S16b) in FIG. 4.

FIG. 9A is a diagram illustrating another example of the gas-tight state in the above annealing step (step S16b). Here, FIG. 9A illustrates a state (cross-sectional view) in which two sapphire substrates on each of which a precursor of an AlN buffer layer is formed are stacked with a spacer sandwiched therebetween and placed in each of recesses 52a and 52b formed in a substrate holder 52, in such orientations that the precursors of the aluminum nitride buffer layers face each other. Specifically, in the recess 52a of the substrate holder 52, the sapphire substrate 102 on which the precursor 103a of the AlN buffer layer is formed is stacked and placed above the sapphire substrate 2 on which the precursor 3a of the AlN buffer layer is formed, with a spacer 54a sandwiched therebetween in such an orientation that the precursors 3a and 103a of the aluminum nitride buffer layers face each other. Similarly, in the recess 52b of the substrate holder 52, a sapphire substrate 302 on which a precursor 303a of an AlN buffer layer is formed is stacked and placed above a sapphire substrate 202 on which a precursor 203a of an AlN buffer layer is formed, with a spacer 54b sandwiched therebetween in such an orientation that the precursors 203a and 303a of the AlN buffer layers face each other.

The substrate holder 52 and the spacers 54a and 54b include at least one material among a group III nitride semiconductor such as aluminum nitride, carbon, boron nitride (BN), pyrolytic boron nitride (PBN), aluminum oxide (sapphire), ceramic, silicon carbide, refractory metal, zirconia, and tantalum carbide (TaC), for example. The spacers 54a and 54b are, for example, plates having a circular ring shape according to the external shapes of the sapphire substrates, and separate the sapphire substrates 2 and 102 (202 and 302) located above and below by a certain distance (1 mm or shorter, and preferably 0.1 mm), thus forming the gas-tight spaces 43 each surrounded by a spacer and the two sapphire substrates located above and below.

The gas-tight state illustrated in FIG. 9A corresponds to a state in which two substrates manufactured through the steps up to step S16a described above (the substrate and another substrate) are prepared, and the other substrate is placed above the substrate with a spacer provided at the perimeter portion of the substrate sandwiched therebetween such that a group III nitride semiconductor of the substrate and a group III nitride semiconductor of the other substrate face each other. Similarly to FIG. 6A, the sapphire substrate 102 (or 302) located above corresponds to a cover member for the sapphire substrate 2 (or 202) located below, and on the contrary, the sapphire substrate 2 (or 202) located below corresponds to a cover member for the sapphire substrate 102 (or 302) located above.

With such a gas-tight state, above a nitride semiconductor substrate, another nitride semiconductor substrate is placed with a spacer sandwiched therebetween, and thus group III nitride semiconductors of the two nitride semiconductor substrates are prevented from being in contact, and the entire surfaces of the two group III nitride semiconductors are flattened by annealing. In addition, the nitride semiconductor substrates are placed in recesses, and prevented from being moved during annealing. Furthermore, a plurality of nitride semiconductor substrates are simultaneously annealed in the gas-tight state, thus improving efficiency of producing nitride semiconductor substrates.

Note that the annealing method in which a substrate holder is used is not limited only to the method illustrated in FIG. 9A, and as illustrated in FIG. 9B, similar advantageous effects are obtained also by placing, on a base 46b, a plurality of sapphire substrates 2 on each of which a precursor 3a of an AlN buffer layer is formed in a state in which the plurality of sapphire substrates 2 are placed in substrate holders 51 with the precursors 3a of the AlN buffer layers facing downward. Each of the substrate holders 51 functions as a holder which holds the sapphire substrate 2 with the precursor 3a of the AlN buffer layer facing downward, and further functions as a spacer for forming a gas-tight space between the precursor 3a of an AlN buffer layer and the base 46b. For example, the substrate holder 51 and the base 46b each include at least one material among a group III nitride semiconductor such as aluminum nitride, carbon, boron nitride (BN), pyrolytic boron nitride (PBN), aluminum oxide (sapphire), ceramic, silicon carbide, refractory metal, zirconia, and tantalum carbide (TaC).

Note that in FIG. 9B, a plurality of nitride semiconductor substrates are disposed on the base 46b in one direction, but may be disposed two-dimensionally. In addition, the state illustrated in FIG. 9B may be stacked by stacking bases 46b using spacers, for instance. Furthermore, if the substrate holders 51 are fixed to the base 46b, bases 46b each in the state as illustrated in FIG. 9B may be vertically stacked. Such a configuration allows a great number of nitride semiconductor substrates to be simultaneously annealed in the gas-tight state.

The structure of the belt member 50 illustrated in FIG. 8 and the substrate holders 52 and 51 illustrated in FIGS. 9A and 9B, respectively, is not limited to a cylindrical structure, and as long as the structure allows a nitride semiconductor substrate to be securely placed thereon without being displaced, the structure may include three or more pillars, or may be a structure having a ring shape obtained by hollowing a polygon such as a triangle or a square, or a structure having an rectangular cylindrical shape, for example.

Carbon is suitable for a material of a container for heating which stores a nitride semiconductor substrate for annealing, and thus if a substrate holder made using a material other than carbon is used, a carbon container for heating that is to be placed in a substrate holder is prepared, whereby a nitride semiconductor substrate can be efficiently annealed. Since the depth of the carbon container for heating is sufficient if two substrates are prevented from being displaced, the carbon container may have a depth greater than the thickness of one nitride semiconductor substrate (for example, 330 µm), and thus may not have a thickness of two nitride semiconductor substrates.

Figure 10:
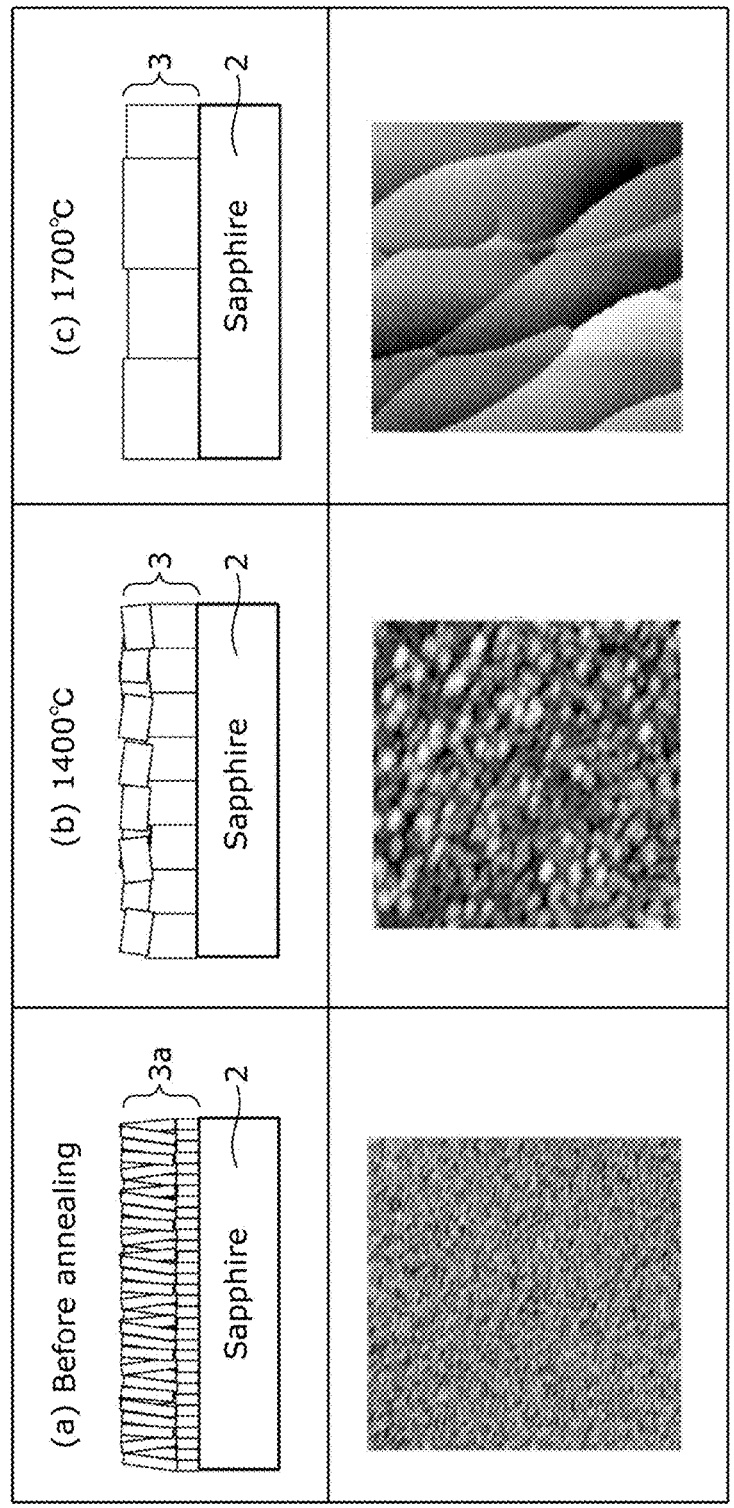
FIG. 10 is diagram illustrating a mechanism of flattening a surface of an AlN buffer layer through the annealing step (step S16b), and images observed using an atomic force microscope.

Through the annealing step (step S16b) in the gas-tight states as described above, the surface of the AlN buffer layer 3 is flattened, and a nitride semiconductor substrate on which a high-quality AlN buffer layer 3 is formed can be achieved. FIG. 10 is diagram illustrating a mechanism of flattening the surface of an AlN buffer layer (schematic structures) through the annealing step (step S16b), and images observed using an atomic force microscope (AFM). Specifically, (a), (b), and (c) of FIG. 10 illustrate schematic structures of AlN buffer layers (upper row) and images observed using an AFM (lower row) before annealing, after annealing at 1400° C. of the substrate temperature, and after annealing at 1700° C. of the substrate temperature, respectively.

As illustrated in (a) of FIG. 10, the precursor 3a of an AlN buffer layer formed on the c-plane of the sapphire substrate 2 grows slow in an in-plane direction of the sapphire substrate 2 due to lattice mismatch of sapphire and AlN, and thus an aggregate of AlN crystal grains which are favorably aligned in the direction of the (0001) plane, but not favorably aligned in the in-plane orientation and are rotated by 1 to 2 degrees is formed. Accordingly, threading dislocations are formed at the interface between crystal grains. The surface roughness of the precursor 3a of an AlN buffer layer is about 0.5 nm, for example.

The precursor 3a of an AlN buffer layer becomes the AlN buffer layer 3 by being annealed in the annealing step (step S16b) described above. In the annealing step, the precursor 3a of an AlN buffer layer is annealed at a temperature (for example, the substrate temperature of 1400° C.) higher than the temperature for forming the precursor 3a of an AlN buffer layer, whereby the migration of the surfaces of Al atoms is facilitated. Al atoms left from AlN by being annealed are incorporated into sites stable in view of energy, and rearranged. Accordingly, as illustrated in (b) of FIG. 10, AlN undergoes solid-phase growth using crystal islands having aligned orientation as nuclei to form grains, and consequently the AlN buffer layer 3 is formed. The grain size is, for example, 250 nm, and surface roughness is maintained at about 0.5 nm.

For example, if the substrate temperature is increased to 1700° C., adjacent grains are combined in the AlN buffer layer 3, and the surface of the AlN buffer layer 3 is flattened, as illustrated in (c) of FIG. 10. Although dislocation is present at the boundary of grains, grains are combined and formed into a larger grain, whereby the number of grains which occupy per unit area decreases with an increase in temperature of a substrate annealed. Accordingly, the number of dislocations present per unit area also decreases. Thus, the threading dislocation density in the annealed AlN buffer layer 3 is decreased, and thus a high-quality AlN buffer layer 3 having a favorably flat surface can be obtained.

Thus, the annealing step (step S16b) in the gas-tight state gives the aluminum nitride buffer layer 3 a flat surface and gives the surface side of the aluminum nitride buffer layer 3 an Al polarity. Accordingly, the aluminum nitride buffer layer 3 becomes a high-quality buffer layer which has excellent crystallinity. Note that although not illustrated, annealing at 1750° C. of the substrate temperature improves the crystallinity of the AlN buffer layer 3, nevertheless the surface of the AlN buffer layer 3 is roughened, and the surface roughness is 1 nm or more.

[Characteristics and Advantageous Effects of Nitride Semiconductor Substrate]

The following describes characteristics of a nitride semiconductor substrate manufactured using the manufacturing method according to the present embodiment, with reference to FIGS. 11 to 27.

Figure 11:
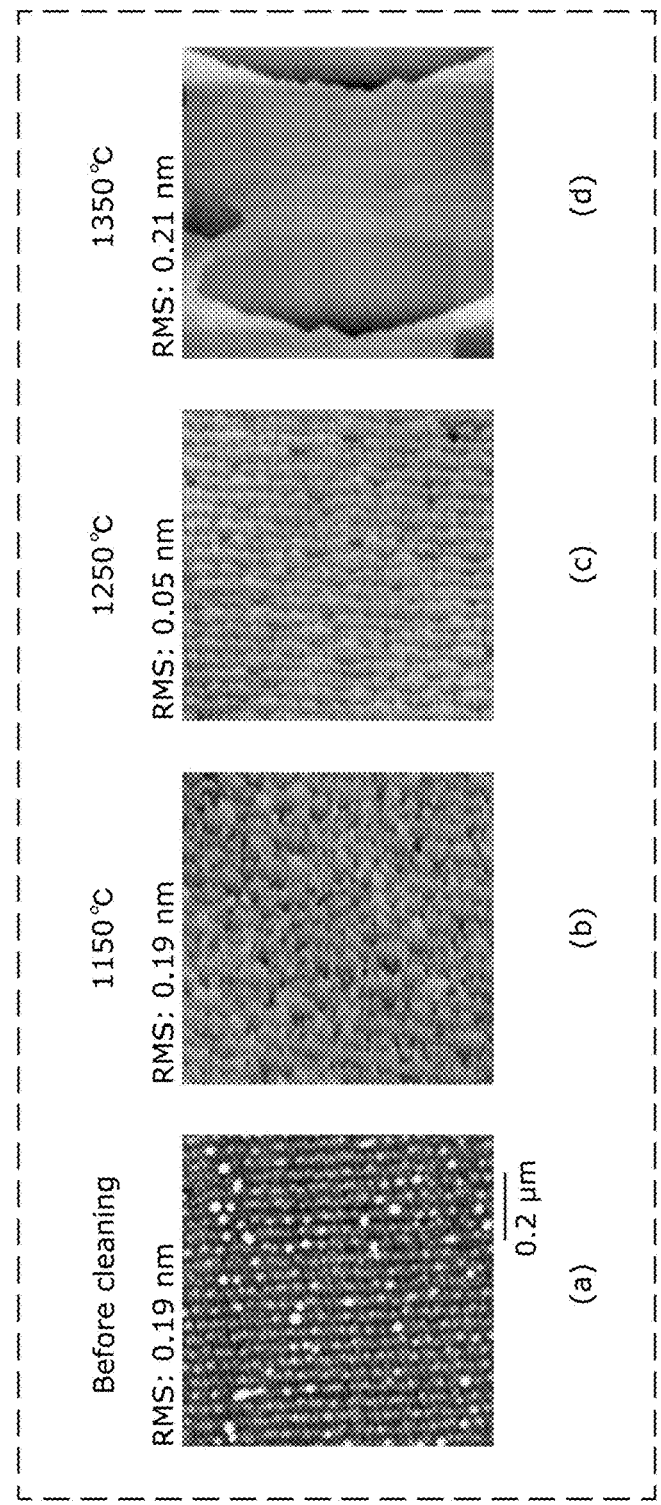
FIG. 11 is a diagram illustrating surface states of cleaned sapphire substrates according to the embodiment.
Figure 12:
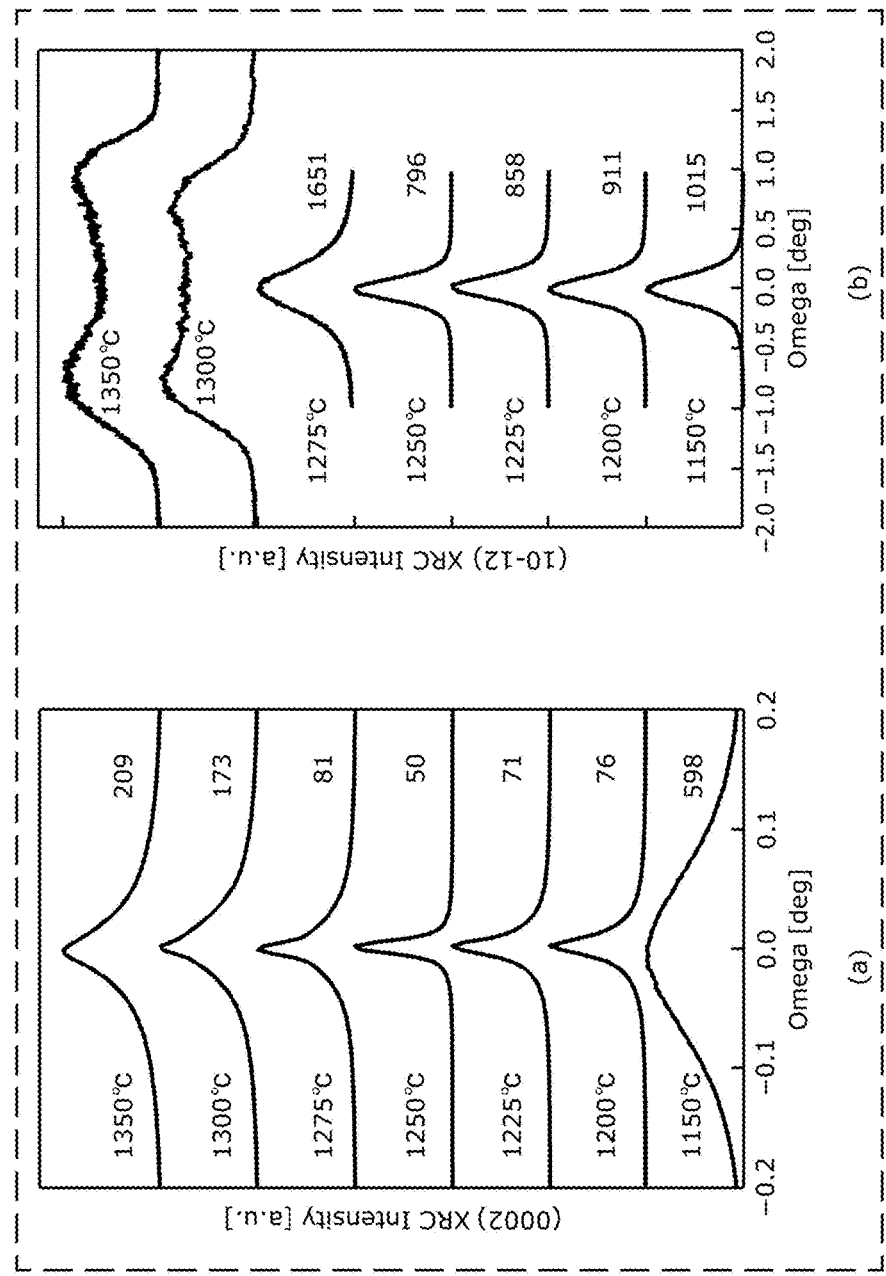
FIG. 12 is a diagram illustrating crystallinity of aluminum nitride when an annealing temperature for cleaning a sapphire substrate is changed according to the embodiment.
Figure 13:
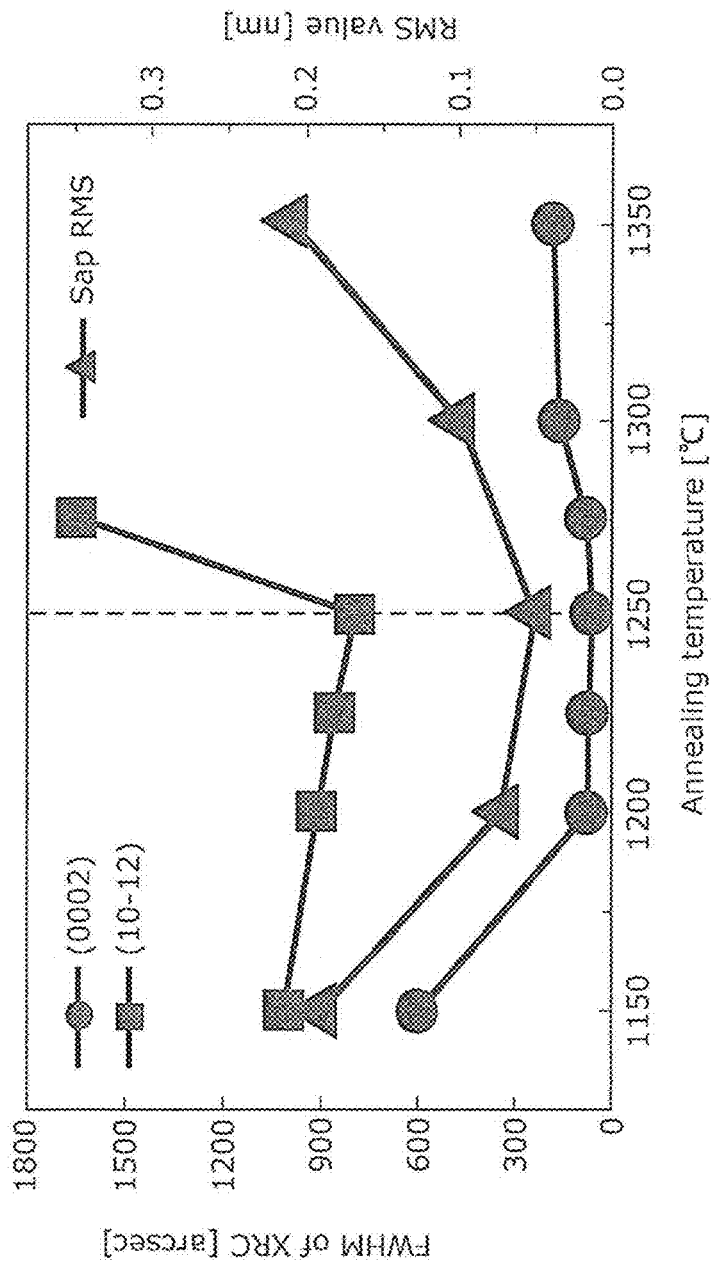
FIG. 13 is a diagram illustrating a relation between crystallinity of aluminum nitride and an annealing temperature for cleaning a sapphire substrate according to the embodiment.
Figure 14:
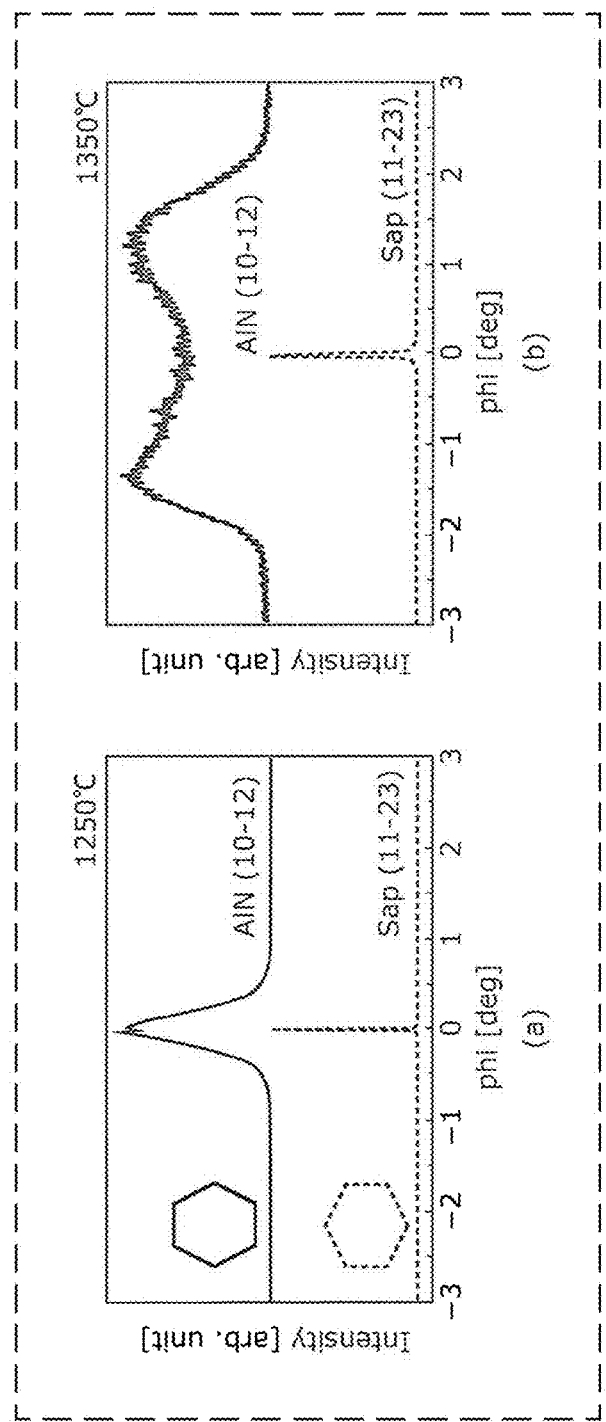
FIG. 14 is a diagram illustrating a relation between an annealing temperature for cleaning a sapphire substrate and crystallinity of the sapphire substrate and aluminum nitride according to the embodiment.

First, characteristics of the sapphire substrate 2 which has been subjected to the cleaning step are to be described. FIG. 11 is a diagram illustrating surface states of the sapphire substrate 2 according to the present embodiment after cleaning. FIG. 12 is a diagram illustrating the crystallinity of an aluminum nitride when the annealing temperature for cleaning the sapphire substrate 2 is changed according to the present embodiment. FIG. 13 is a diagram illustrating a relation between crystallinity of AlN and an annealing temperature for cleaning the sapphire substrate 2 according to the present embodiment. FIG. 14 is a diagram illustrating a relation between the annealing temperature for cleaning the sapphire substrate 2 and the crystallinity of the sapphire substrate 2 and AlN according to the present embodiment.

FIG. 11 illustrates observed images obtained by observing the surface roughness of the sapphire substrate 2 in a 1-μm square region using an atomic force microscope (AFM) when the device thermocouple temperature for substrate heating for the sapphire substrate 2 in the cleaning step is set to 1150° C. (about 1080° C. of the substrate temperature), 1250° C. (about 1165° C. of the substrate temperature), and 1350° C. (about 1250° C. of the substrate temperature). FIG. 11 illustrates observation results of the surface roughness of the sapphire substrate 2 obtained before cleaning (annealing) in (a), when the device thermocouple temperature for substrate heating is 1150° C. in (b), when the device thermocouple temperature for substrate heating is 1250° C. in (c), and when the device thermocouple temperature for substrate heating is 1350° C. in (d).

The surface state of the sapphire substrate 2 greatly influences the precursor 3a of the AlN buffer layer formed on the sapphire substrate 2 and the surface state of the AlN layer 4. If the precursor 3a of an AlN buffer layer and the AlN layer 4 are formed above the sapphire substrate 2 having a rough surface, the precursor 3a of the AlN buffer layer and the AlN layer 4 are also given rough surfaces, and thus it is difficult to form a high-quality nitride semiconductor substrate 1 having a flat surface.

As illustrated in (a) of FIG. 11, granular unevenness is observed from the sapphire substrate 2 before subjected to cleaning. The surface roughness of the sapphire substrate 2 at this time is 0.19 nm, for example.

If the sapphire substrate 2 is heated to 1150° C. of the device thermocouple temperature for substrate heating, the granular unevenness illustrated in (a) of FIG. 11 disappears from the surface of the sapphire substrate 2, and atomic layer steps are observed, as illustrated in (b) of FIG. 11. The surface roughness of the sapphire substrate 2 at this time is 0.19 nm, for example. Thus, (b) of FIG. 11 shows that satisfactory results can be obtained if the device thermocouple temperature is 1150° C. (about 1080° C. of the substrate temperature) as the heating temperature for the sapphire substrate 2 in the cleaning step. Note that it has been found that satisfactory results can be obtained if, although not illustrated, the device thermocouple temperature is 970° C. (about 920° C. of the substrate temperature) as the lower limit of the heating temperature for the sapphire substrate 2 in the cleaning step.

If the sapphire substrate 2 is heated to 1250° C. of the device thermocouple temperature for substrate heating, the granular unevenness illustrated in (a) of FIG. 11 disappears from the surface of the sapphire substrate 2, and atomic layer steps are observed uniformly in a large area, as illustrated in (c) of FIG. 11. The surface roughness of the sapphire substrate 2 at this time is 0.05 nm, for example, and is thus further flattened compared to the case where the device thermocouple temperature for substrate heating is 1150° C. ((b) of FIG. 11). Ideally, an atomic layer step is preferably a uniformly formed step of two atoms or one atom. Thus, as is clear from (c) of FIG. 11, satisfactory results can be obtained if the heating temperature for the sapphire substrate 2 in the cleaning step is close to 1250° C. of the device thermocouple temperature (about 1165° C. of the substrate temperature).

Furthermore, if the sapphire substrate 2 is heated to 1350° C. of the device thermocouple temperature for substrate heating, step bunching is observed as illustrated in (d) of FIG. 11. Accordingly, as can be seen from (d) of FIG. 11, an atomic layer step is not observed, and a large recess appears in the surface of the sapphire substrate 2, so that the surface has a rough structure. Thus, as can be seen from (d) of FIG. 11, satisfactory results cannot be obtained if the heating temperature for the sapphire substrate 2 in the cleaning step is increased to 1350° C. of the device thermocouple temperature (about 1250° C. of the substrate temperature).

Note that step bunching starts to appear when the sapphire substrate 2 is heated to about 1300° C. of the device thermocouple temperature for substrate heating. The height of the recess at this time is 1.45 nm, for example. Thus, the upper limit of the heating temperature of the sapphire substrate 2 in the cleaning step is preferably 1300° C. of the device thermocouple temperature (about 1210° C. of the substrate temperature).

As described above, from the observation results illustrated in FIG. 11, if the heating temperature for the sapphire substrate 2 in the cleaning step is in a range from 970° C. to 1300° C. of the device thermocouple temperature (in a range from about 920° C. to 1210° C. of the substrate temperature), crystallinity of the surface of the sapphire substrate can be improved.

FIG. 12 illustrates results of checking crystallinity of a sample obtained by cleaning the sapphire substrate 2 at different temperatures and forming a precursor of an AlN buffer layer on the sapphire substrate 2 at 1200° C., and thereafter further growing the AlN layer 4 at 1500° C. The $NH_3$ pre-flow step lasts 30 seconds. Crystallinity of the AlN layer 4 can be checked based on a value of a full width at half maximum (FWHM) of a diffraction peak obtained by omega (ω) rocking curve (X-ray rocking curve, hereinafter referred to as XRC) measurement of the (0002) plane and the (10-12) plane using X-ray diffraction (XRD). If this value (hereinafter referred to as XRC FWHM) is smaller, or in other words, the obtained diffraction peak appears sharper, crystallinity is shown to be favorable. Note that the unit of a XRC FWHM is arcsec ("). The spread width of an incident X ray used is 32 arcsec.

Part (a) of FIG. 12 illustrates observation results obtained by XRC measurement on the (0002) plane of an AlN layer. The XRC FWHM of the (0002) plane of an AlN layer is observed to be 598 arcsec when the sapphire substrate 2 is cleaned at 1150° C. of the device thermocouple temperature for substrate heating, 76 arcsec when the sapphire substrate 2 is cleaned at 1200° C. of the device thermocouple temperature for substrate heating, 71 arcsec when the sapphire substrate 2 is cleaned at 1225° C. of the device thermocouple temperature for substrate heating, 50 arcsec when the sapphire substrate 2 is cleaned at 1250° C. of the device thermocouple temperature for substrate heating, 81 arcsec when the sapphire substrate 2 is cleaned at 1275° C. of the device thermocouple temperature for substrate heating, 173 arcsec when the sapphire substrate 2 is cleaned at 1300° C. of the device thermocouple temperature for substrate heating, and 209 arcsec when the sapphire substrate 2 is cleaned at 1350° C. of the device thermocouple temperature for substrate heating.

Part (b) of FIG. 12 illustrates the observation results obtained by XRC measurement on the (10-12) plane of an AlN layer. The XRC FWHM of the (10-12) plane of an AlN layer is observed to be 1015 arcsec when the sapphire substrate 2 is cleaned at 1150° C. of the device thermocouple temperature for substrate heating, 911 arcsec when the sapphire substrate 2 is cleaned at 1200° C. of the device thermocouple temperature for substrate heating, 858 arcsec when the sapphire substrate 2 is cleaned at 1225° C. of the device thermocouple temperature for substrate heating, 796 arcsec when the sapphire substrate 2 is cleaned at 1250° C. of the device thermocouple temperature for substrate heating, and 1651 arcsec when the sapphire substrate 2 is cleaned at 1275° C. of the device thermocouple temperature for substrate heating. When the sapphire substrate 2 is cleaned at 1350° C. and 1350° C. of the device thermocouple temperature for substrate heating, the observation results obtained by XRC measurement show double peaks, and thus has confirmed that crystallinity is not satisfactory.

As illustrated in FIG. 13, a relation between the annealing temperature for cleaning the sapphire substrate 2 and crystallinity of the AlN layer 4, the XRC FWHM of the (0002) plane of an AlN layer is small when the sapphire substrate 2 is cleaned at a device thermocouple temperature for substrate heating in a range from 1200° C. to 1300° C., and is gradually increased when the device thermocouple temperature for substrate heating exceeds 1275° C. Furthermore, the XRC FWHM of the (10-12) plane of an AlN layer is small when the sapphire substrate 2 is cleaned at a device thermocouple temperature for substrate heating in a range from 1150° C. to 1275° C., and greatly increased when the device thermocouple temperature for substrate heating exceeds 1275° C.

Surface roughness (RMS) of the surface of the sapphire substrate 2 is small at a device thermocouple temperature for substrate heating in a range from 1200° C. to 1300° C., and is the smallest when the device thermocouple temperature for substrate heating is 1250° C. Accordingly, this shows that there is a correlation with the surface flatness of the surface of the sapphire substrate 2, and when the flatness of the surface of the sapphire substrate 2 is favorable, the flatness of the surface of the AlN layer 4 is also favorable.

FIG. 14 is a diagram illustrating diffraction peaks obtained by φ (phi) measurement on the (10-12) plane of the AlN layer and the (11-23) plane of the sapphire substrate 2 through X-ray diffraction (XRD) when annealing for cleaning a sapphire substrate is performed at 1250° C. and 1350° C. of the device thermocouple temperature for substrate heating. As illustrated in (a) of FIG. 14, as can be seen from both the (10-12) plane of the AlN layer and the (11-23) plane of the sapphire substrate 2 at 1250° C. of the device thermocouple temperature for substrate heating, diffraction peaks are observed when phi is 0 deg., and crystals are growing epitaxially. Thus, the orientations of the crystals on the (10-12) plane of the AlN layer and the crystals on the (11-23) plane of the sapphire substrate 2 are aligned. On the other hand, as illustrated in (b) of FIG. 14, when the device thermocouple temperature for substrate heating is 1350° C., although the diffraction peak of the (11-23) plane of the sapphire substrate 2 is observed when phi is 0 deg., so-called double peaks are viewed from the (10-12) plane of the AlN layer, or in other words, diffraction peaks are observed at two points about when phi is +1.5 deg. and −1.5 deg., which shows that crystallinity has deteriorated since the crystallinity exhibits wide diffraction.

Thus, annealing for cleaning the sapphire substrate 2 is preferably carried out at a temperature that improves the flatness of the surface of the sapphire substrate 2.

As describes above, in the step of cleaning the surface of the sapphire substrate 2, the lower limit of the annealing temperature for cleaning is desirably at least 970° C. of the device thermocouple temperature for substrate heating (about 920° C. of the substrate temperature) at which atomic layer steps that appear in the sapphire substrate 2 have a small width, preferably at least 1150° C. of the device thermocouple temperature for substrate heating (about 1080° C. of the substrate temperature), and more preferably at least 1200° C. of the device thermocouple temperature (about 1120° C. of the substrate temperature). Furthermore, the upper limit of the annealing temperature for cleaning the sapphire substrate 2 is preferably set to 1300° C. of the device thermocouple temperature for substrate heating (about 1210° C. of the substrate temperature) at which step bunching does not occur in the sapphire substrate 2.

Figure 15:
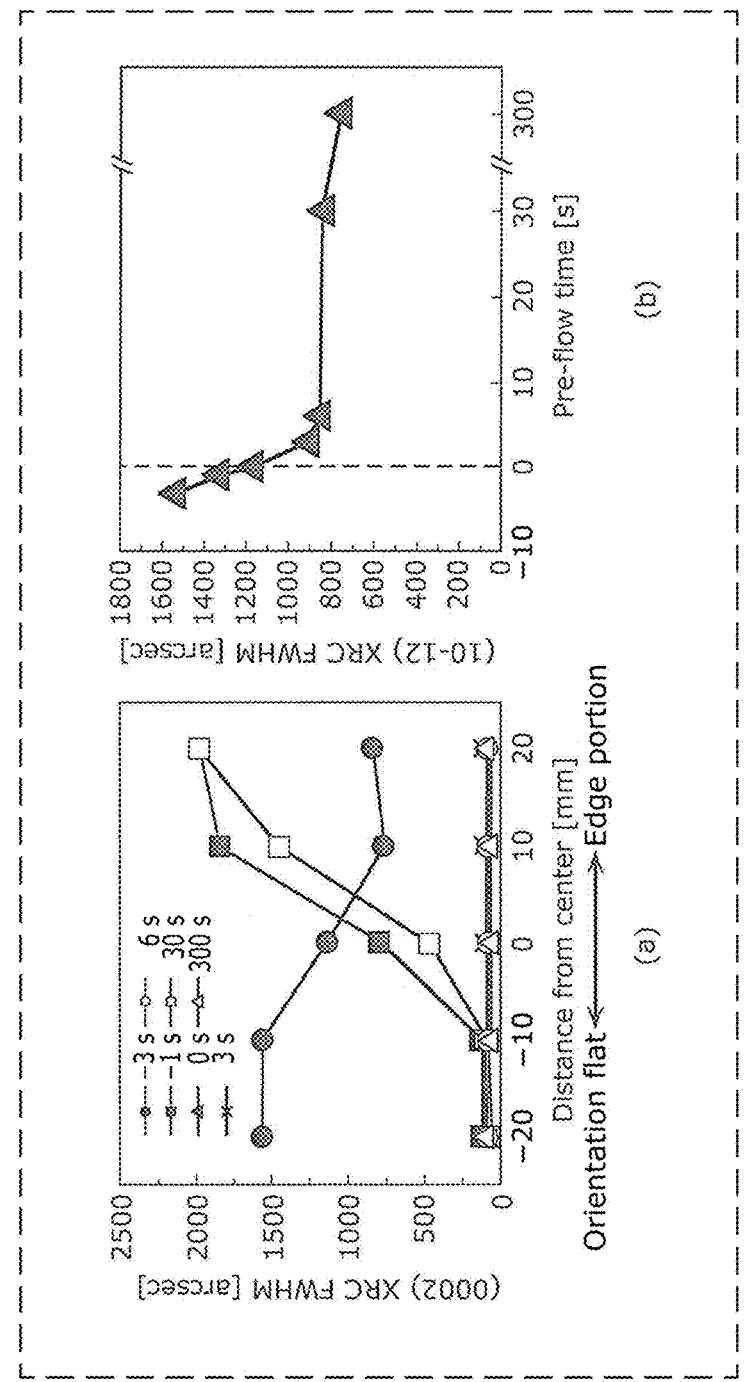
FIG. 15 is a diagram illustrating a relation between a pre-flow for an AlN buffer layer and crystallinity of aluminum nitride according to the embodiment.

The following describes characteristics of a precursor of an AlN buffer layer when a pre-flow is carried out in the step of forming the precursor 3a of an AlN buffer layer. FIG. 15 is a diagram illustrating a relation between a pre-flow for and crystallinity of a precursor of an AlN buffer layer.

Part (a) of FIG. 15 is a diagram illustrating a distribution of XRC FWHMs of the (0002) plane of the AlN layer 4 on a wafer having a 50-mm diameter, based on the distance from the center of the wafer when a pre-flow time is changed to −3 seconds, −1 second, 0 seconds, 3 seconds, 6 seconds, 30 seconds, and 300 seconds.

A pre-flow time indicates a time by which introduction of an $NH_3$ gas precedes relative to a reference time when a time at which a TMAl gas is introduced is used as the reference time (0 seconds). Stated differently, a pre-flow time is 3 seconds when an $NH_3$ gas is introduced 3 seconds earlier than a time (reference time) at which a TMAl gas is introduced, whereas a pre-flow time is −3 seconds when an $NH_3$ gas is introduced 3 seconds later than the reference time or in other words, when a TMAl gas is precedently introduced.

As illustrated in (a) of FIG. 15, when a pre-flow time is changed to −3 seconds, −1 second, and 0 seconds for the (0002) plane of the precursor 3a of an AlN layer, the crystallinity of the AlN layer 4 varies depending on the positions of portions of the sapphire substrate 2. Specifically, the XRC FWHM of a region of the sapphire substrate 2 on the orientation flat side is greater than the XRC FWHM of a region opposite the orientation flat side. Accordingly, crystallinity of the sapphire substrate 2 in the direction of the tilt angle has variations.

In contrast, when a pre-flow time is changed to 3 seconds, 6 seconds, 30 seconds, and 300 seconds, the XRC FWHM of a region of the sapphire substrate 2 on the orientation flat side and the XRC FWHM of a region opposite the orientation flat side are substantially the same, and show little variation. Furthermore, when a pre-flow time is changed to 3 seconds, 6 seconds, 30 seconds, and 300 seconds, the XRC FWHM is smaller and crystallinity is more favorable than in the case where the pre-flow time is changed to −3 seconds, −1 second, and 0 seconds.

As illustrated in (b) of FIG. 15, the XRC FWHM of the (10-12) plane of the precursor 3a of the AlN layer is decreased with an increase in the pre-flow time by changing to −3 seconds, −1 second, 0 second, 3 seconds, and 6 seconds, and the XRC FWHM shows substantially a constant value when the pre-flow period is in a range from 3 seconds to 30 seconds. Accordingly, crystallinity is favorable when the pre-flow period is in a range from 3 seconds to 30 seconds. Note that when the pre-flow time is set to 300 seconds, the surface of the precursor 3a of the AlN layer is nitrided at an edge of the sapphire substrate 2, and crystallinity is not satisfactory.

O atoms are removed from the surface of the sapphire substrate 2 due to cleaning in an $H_2$ gas atmosphere. A pre-flow is carried out by precedently introducing an $NH_3$ gas. The $NH_3$ pre-flow allows nitrogen atoms to be precedently introduced onto the surface of the sapphire substrate 2. Thus, Al atoms on the surface of the sapphire substrate 2 and N atoms are uniformly bonded on the entire sapphire substrate 2. Accordingly, as later described, the precursor 3a of the AlN layer formed on the sapphire substrate 2 grows into a crystal having good quality and little misorientation within a plane. For example, when the pre-flow time is set to 30 seconds, the XRC FWHM of the (0002) plane of the precursor 3a of the AlN layer is 72 arcsec, and the XRC FWHM of the (10-12) plane is 833 arcsec, so that the precursor 3a of the AlN layer having fewest variations in crystallinity can be obtained.

In order to check advantageous effects of the annealing step in the gas-tight state (step S16b), a plurality of nitride semiconductor substrates each including a sapphire substrate and an AlN buffer layer (AlN film) formed on the sapphire substrate were manufactured and evaluated under various conditions. The following describes the results of the evaluations.

FIG. 16 is a diagram illustrating manufacturing conditions for and evaluation results of a plurality of nitride semiconductor substrates manufactured for evaluation and each having an AlN film serving as a buffer layer formed. A time period for annealing is an hour. Here, FIG. 16 illustrates a substrate temperature ("temperature ([° C.])") in the annealing step (step S16b), "an AlN film deposition method", "AlN film thickness [nm]", the "gas-tight state" in the annealing step, and "ambient gas" in the annealing step, as manufacturing conditions for 18 samples of nitride semiconductor substrates (substrates No. 1a to 11a, substrates No. 1b to 3b, and substrates No. 1c to 4c). As evaluation results, FIG. 16 illustrates XRC FWHMs of the (0002) planes and the (10-12) planes of AlN films before and after annealing ("XRC before annealing", "(0002) [arcsec]", "(10-12) [arcsec]", "XRC after annealing", "(0002) [arcsec]", and "(10-12) [arcsec]"), and the "surface state" of the AlN films.

Note that in the "gas-tight state", "AlN/Sap." means the gas-tight state illustrated in FIG. 6A, that is, a gas-tight space formed using, as a cover member, a sapphire substrate on which an AlN film is formed, "AlN box" means the gas-tight state illustrated in FIG. 7A, that is, a gas-tight space formed by placing a sapphire substrate on which an AlN film is formed in a tight container, "Sap." means the gas-tight state illustrated in FIG. 6B, that is, a gas-tight space formed using a sapphire substrate as a cover member. In addition, in the "surface state", "good" means that the surface roughness (RMS) of an AlN film observed using an atomic force microscope (AFM) was less than 1 nm, "fair" means that the surface roughness (RMS) of an AlN film observed using an atomic force microscope (AFM) was 1 nm or more and 10 nm or less, and "poor" means that the surface of an AlN film was not specular and had considerable roughness, and thus could not be observed using an atomic force microscope (AFM).

Part (a) of FIG. 16 illustrates an example of the present embodiment, and the manufacturing conditions for and the evaluation results of 11 types of substrates No. 1a to 11a manufactured in the "AlN/Sap." state as the "gas-tight state". Part (b) of FIG. 16 illustrates another example of the present embodiment, and manufacturing conditions for and the evaluation results of three types of nitride semiconductor substrates manufactured using "AlN box" and "Sap." as the "gas-tight state". Part (c) of FIG. 16 is a comparative example, and illustrates manufacturing conditions for and the evaluation results of four types of substrates No. 1c to 4c which were manufactured in the "not gas-tight" state as the "gas-tight state" (an opened state which is not gas-tight).

As can be seen from the comparison of substrates according to the comparative example illustrated in (c) of FIG. 16 (substrates annealed in the opened state) with substrates according to the examples (substrates annealed in the gas-tight state) illustrated in (a) and (b) of FIG. 16 with regard to the XRC FWHMs of the (0002) planes and the (10-12) planes after annealing in FIG. 16, the XRC FWHMs of the AlN films significantly decrease, and crystallinity of the AlN films significantly improve by annealing the substrates in the gas-tight states as illustrated in FIGS. 6A and 7A at a substrate temperature in a range from 1400° C. to 1750° C., compared with the case where substrates are annealed in the opened state.

In particular, with regard to the XRC FWHMs of the (0002) planes of AlN films, nitride semiconductor substrates having 100 arcsec or less as a result of annealing in the gas-tight state, or in other words, having extremely high crystallinity (substrates No. 1a, No. 2a, No. 4a, No. 5a, No. 7a, No. 8a, No. 1b, and No. 3b) can be obtained. Furthermore, the XRC FWHMs of the (10-12) planes of the AlN films show that nitride semiconductor substrates which include AlN films whose (10-12) planes have XRC FWHMs improved by being annealed in the gas-tight state to be 1/10 or less of the XRC FWHMs before annealing are obtained, and also nitride semiconductor substrates having extremely high crystallinity since the XRC FWHMs of the (10-12) planes of the AlN films are 400 arcsec or less (substrates No. 4a, No. 5a, No. 7a to No. 10a, and No. 3b) are obtained.

With regard to the "surface state" in FIG. 16, as is clear from the comparison of substrates (substrates annealed in the opened state) according to the comparative example illustrated in (c) of FIG. 16 with substrates (substrates annealed in the gas-tight state) according to the examples illustrated in (a) and (b) of FIG. 16, the surface state of an AlN film is further flattened through annealing at a substrate temperature of 1400° C. or higher and 1750° C. or lower in the gas-tight state as illustrated in FIGS. 6A and 7A, compared to the case where the substrates are annealed in the opened state.

Figure 17:
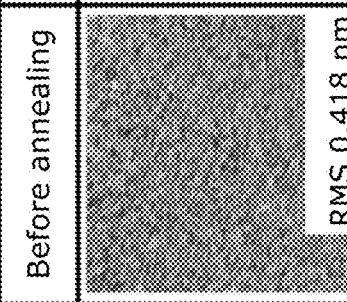
FIG. 17 is a diagram illustrating surface states of AlN films before and after annealing in the annealing step (step S16b) in the embodiment, the AlN films serving as buffer layers and being formed in two types of nitride semiconductor substrates.

FIG. 17 is a diagram illustrating the surface states of AlN films before and after annealing in the annealing step (step S16b) in the present embodiment, the AlN films serving as buffer layers and being formed in two types of nitride semiconductor substrates (substrates which include AlN films having a thickness of about 170 nm and about 340 nm). Here, FIG. 17 illustrates observed images of surfaces of AlN films using an atomic force microscope (AFM) and surface roughness (RMS values) before annealing, after annealing at a substrate temperature of 1600° C., after annealing at a substrate temperature of 1650° C., and after annealing at a substrate temperature of 1700° C. The sign following "#" in FIG. 17 indicates a substrate that is to be observed, and corresponds to the "substrate No." illustrated in FIG. 16.

As is clear from the observed images illustrated in FIG. 17, the substrates according to this example each include an AlN film whose surface is flattened by annealing. Furthermore, as is clear from the observed images of the AlN films having a thickness of 340 nm illustrated in FIG. 17, the higher the temperature during annealing is, the smaller the roughness (RMS) of the surfaces of the AlN films, so that the surfaces are flattened.

Figure 18:
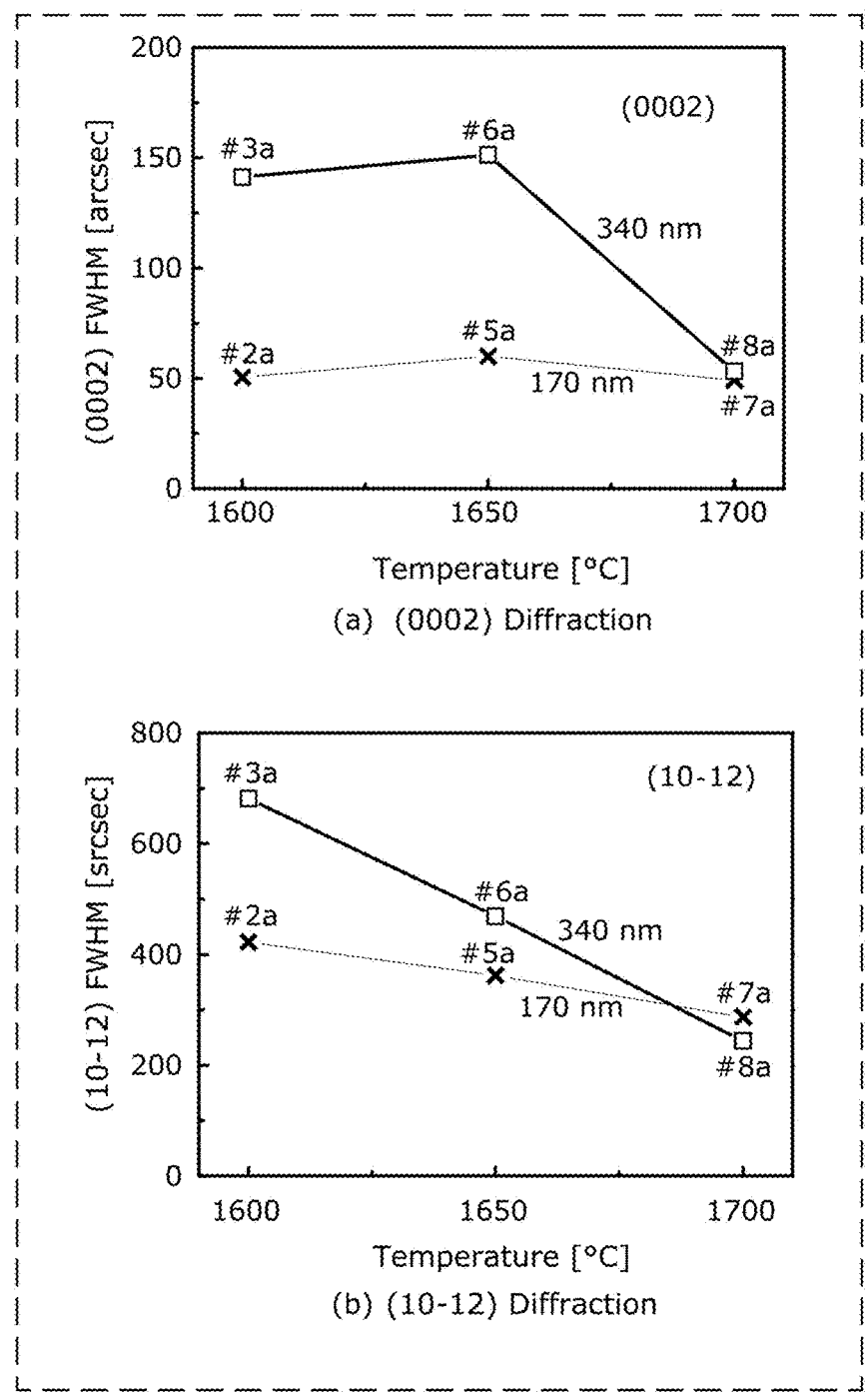
FIG. 18 is a diagram illustrating a relation between a temperature (° C.) in the annealing step (step S16b) and X-ray rocking curve (XRC) full widths at half maximum (FWHMs) of AlN films serving as buffer layers and formed in two types of nitride semiconductor substrates in the embodiment.

FIG. 18 is a diagram illustrating a relation between a substrate temperature (° C.) in the annealing step (step S16b) and XRC FWHMs of AlN films serving as buffer layers and formed in two types of nitride semiconductor substrates (substrates which include AlN films having a thickness of about 170 nm and a thickness of about 340 nm) in the present embodiment. Specifically, (a) of FIG. 18 illustrates a relation between a substrate temperature (° C.) in the annealing step and XRC FWHMs of the (0002) planes of AlN films, whereas (b) of FIG. 18 illustrates a relation between a substrate temperature (° C.) in the annealing step and XRC FWHMs of the (10-12) planes of AlN films. The sign following "#" in (b) of FIG. 18 indicates a substrate which is a plotted target, and corresponds to the "substrate No." illustrated in FIG. 16.

As is clear from the relation illustrated in FIG. 18, for substrates which include AlN films having a thickness of about 340 nm (No. 3a, No. 6a, and No. 8a), the higher a temperature for annealing is, the smaller XRC FWHMs are, and thus crystallinity improves.

At a substrate temperature of 1700° C., the XRC FWHMs of all the (0002) planes and the (10-12) planes of AlN films of two types of nitride semiconductor substrates (substrates which include AlN films having a thickness of about 170 nm and about 340 nm) appear to converge on substantially the same values (50 arcsec or less for the (0002) planes and 400 arcsec or less for the (10-12) planes). Stated differently, annealing at a substrate temperature of 1700° C. is considered to have completed flattening the entire AlN film (the entirety in the film thickness direction).

Figure 19:
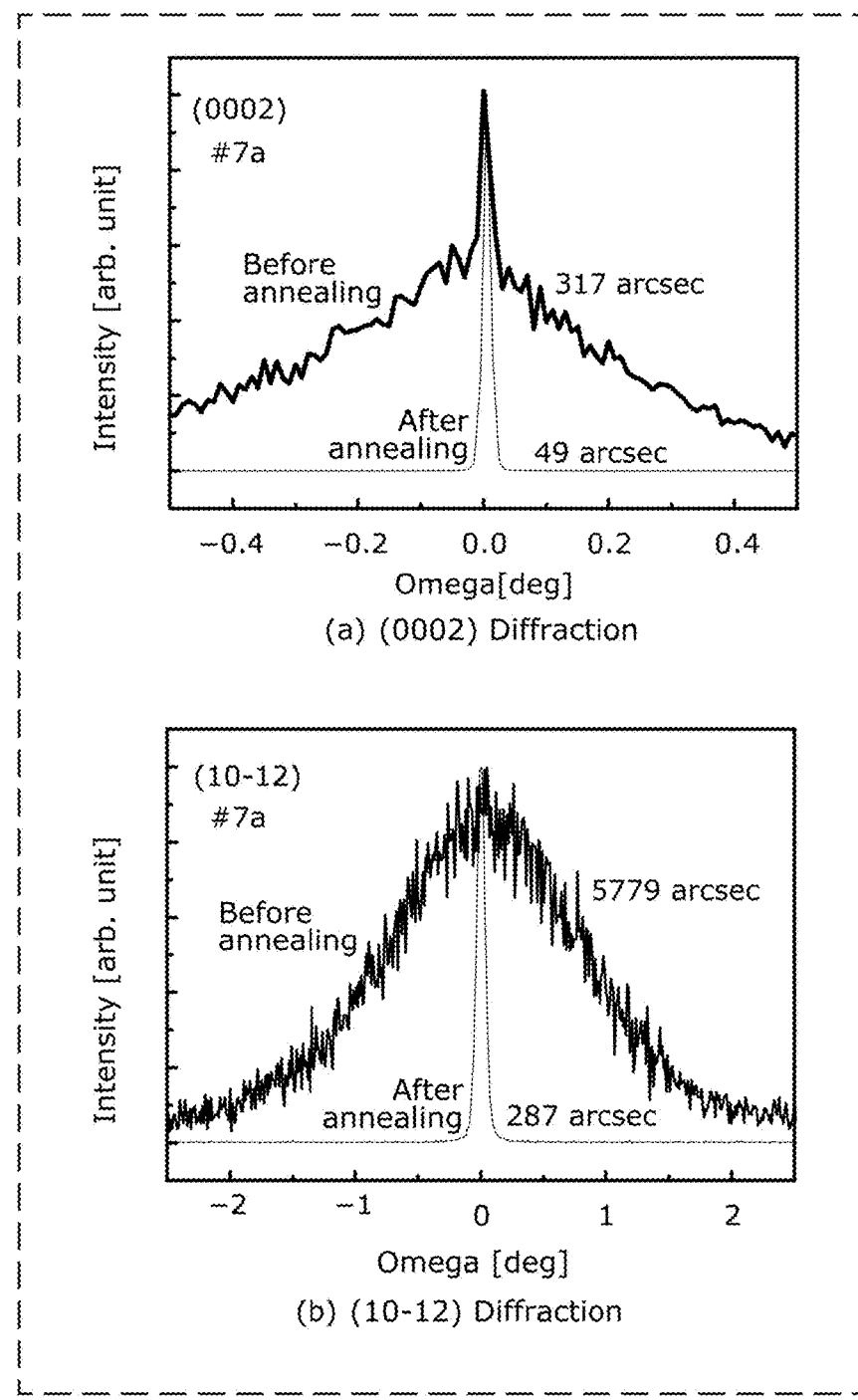
FIG. 19 is a diagram illustrating a change in an XRC FWHM of an AlN film serving as a buffer layer and formed in a nitride semiconductor substrate, before and after annealing in the annealing step (step S16b) in the embodiment.

FIG. 19 is a diagram illustrating a change in the XRC FWHM of an AlN film serving as a buffer layer and formed in a nitride semiconductor substrate, before and after annealing in the annealing step (step S16b) in the present embodiment. Specifically, (a) of FIG. 19 illustrates, with regard to the (0002) plane of an AlN film of the substrate No. 7a in FIG. 16, XRC diffraction peaks of the AlN film and a change in the XRC FWHM before and after annealing at a substrate temperature of 1700° C. Part (b) of FIG. 19 illustrates, with regard to the (10-12) plane of an AlN film of the substrate No. 7a in FIG. 16, XRC diffraction peaks of the AlN film and a change in the XRC FWHM before and after annealing at a substrate temperature of 1700° C.

As is clear from (a) of FIG. 19, the XRC FWHM of the (0002) plane of the AlN film of the substrate No. 7a is 317 arcsec before annealing, and is 49 arcsec after annealing at a substrate temperature of 1700° C. Thus, crystallinity of the AlN film has significantly improved. In addition, as is clear from (b) of FIG. 19, the XRC FWHM of the (10-12) plane of the AlN film of the substrate No. 7a is 5779 arcsec before annealing, and is 287 arcsec after annealing at a substrate temperature of 1700° C. Thus, crystallinity of the AlN film has significantly improved.

Figure 20:
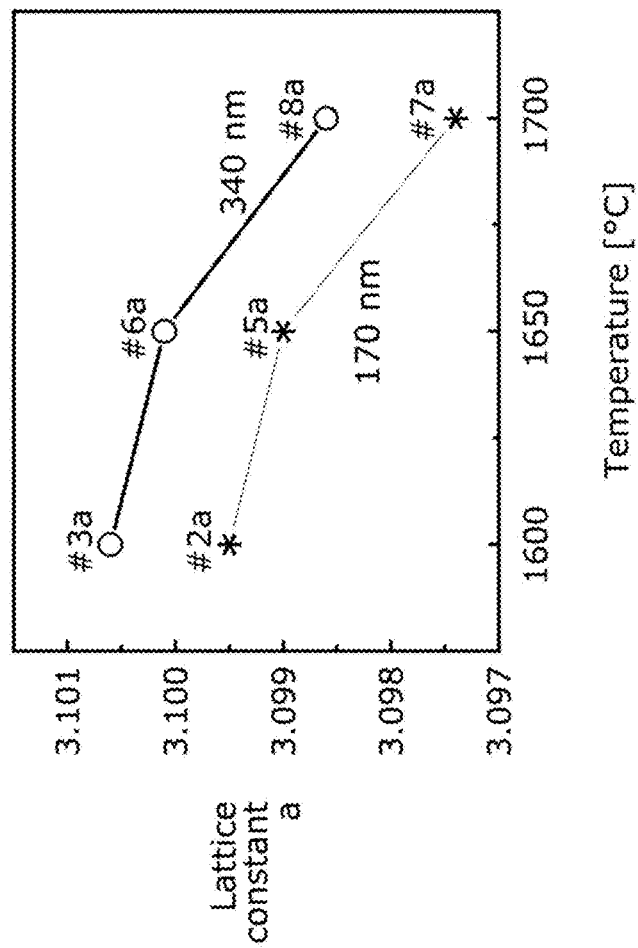
FIG. 20 is a diagram illustrating a relation between a temperature (° C.) in the annealing step (step S16b) and lattice constants a of AlN films measured by X diffraction in the embodiment, the AlN films serving as buffer layers and being formed in two types of nitride semiconductor substrates.

FIG. 20 is a diagram illustrating a relation between a substrate temperature (° C.) in the annealing step (step S16b) and the lattice constants a of the AlN films measured by X diffraction in the present embodiment, the AlN films serving as buffer layers and being formed in two types of nitride semiconductor substrates (substrates which include AlN films having a thickness of about 170 nm and a thickness of about 340 nm). The sign following "#" in FIG. 20 indicates a substrate which is a plotted target, and corresponds to the "substrate No." illustrated in FIG. 16.

As is clear from FIG. 20, in either case where an AlN film has a thickness of about 170 nm or about 340 nm, the higher the temperature for annealing is, the smaller the lattice constant a of the AlN film is. This is because annealing reduces the boundary between crystal grains in the AlN layers (grain boundary).

Figure 21:
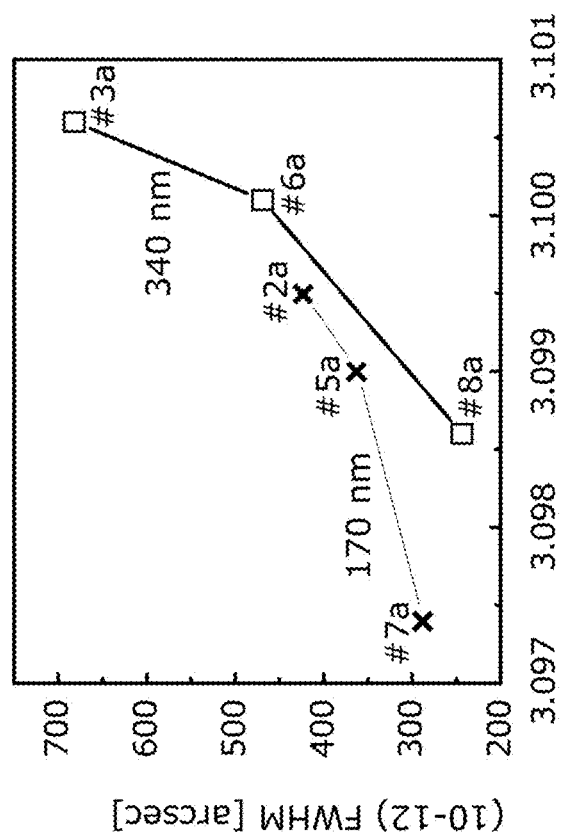
FIG. 21 is a diagram illustrating a relation between lattice constants a of AlN films and XRC FWHMs of the (10-12) planes of the AlN films in the present embodiment, the AlN films serving as buffer layers and being formed in two types of nitride semiconductor substrates.

FIG. 21 is a diagram illustrating a relation between the lattice constants a of AlN films and the XRC FWHMs of the (10-12) planes of the AlN films, the AlN films serving as buffer layers and being formed in two types of nitride semiconductor substrates (the AlN films having a thickness of 170 nm and a thickness of 340 nm) in the present embodiment. Specifically, FIG. 21 is a diagram illustrating a plotted relation for the same substrates between the lattice constant a illustrated in FIG. 20 and the XRC FWHMs of the (10-12) planes of the AlN films. The sign following "#" in FIG. 21 indicates a substrate which is a plotted target, and corresponds to the "substrate No." illustrated in FIG. 16.

As is clear from FIG. 21, in either case where an AlN film has a thickness of about 170 nm or about 340 nm, the smaller the lattice constant a of an AlN film is, the smaller the XRC FWHM of the (10-12) plane of the AlN film is, and thus excellent crystallinity is exhibited.

Figure 22:
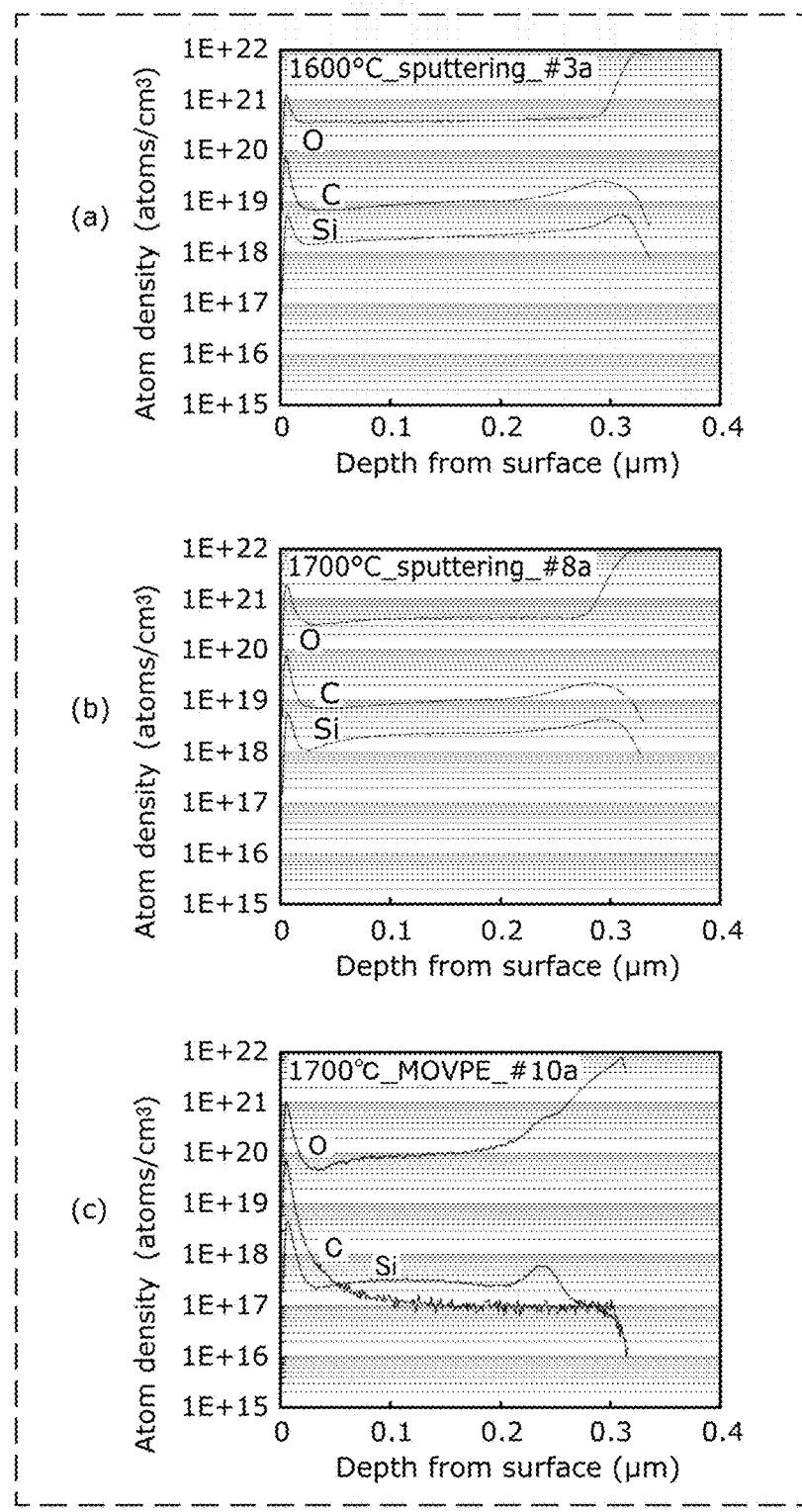
FIG. 22 is a diagram illustrating concentration profiles of impurities of AlN films serving as buffer layers and formed in three types of nitride semiconductor substrates in the present embodiment.

FIG. 22 is a diagram illustrating concentration profiles of impurities (oxygen atoms (O), carbon atoms (C), and silicon atoms (Si)) (a relation between the depth from the surface and the concentration of the impurities) of AlN films as buffer layers formed in three types of nitride semiconductor substrates in the present embodiment. The sign following "#" in FIG. 22 indicates a substrate which is a plotted target, and corresponds to the "substrate No." illustrated in FIG. 16. Specifically, a method for depositing an AlN film and a substrate temperature in the annealing step are sputtering and 1600° C. in (a) of FIG. 22, sputtering and 1700° C. in (b) of FIG. 22, and MOVPE and 1700° C. in (c) of FIG. 22.

FIG. 22 shows the following. Specifically, from the profiles showing concentrations of oxygen atoms in the AlN films included in two types of nitride semiconductor substrates annealed at different temperatures (1600° C. and 1700° C.) but deposited by the same sputtering ((a) and (b) of FIG. 22), it can be seen that oxygen atoms from sapphire substrates are diffused in the AlN films, and the higher the annealing temperature is, the higher concentration of the oxygen atoms is.

From the profiles showing concentrations of carbon atoms and silicon atoms in AlN films included in nitride semiconductor substrates annealed at the same temperature (1700° C.), but deposited using different methods, that is, sputtering and MOVPE ((b) and (c) of FIG. 22), carbon atoms and silicon atoms observed in the AlN film deposited by sputtering can be determined as the atoms mixed in the AlN film before annealing, and furthermore, it can be seen that the AlN film deposited by MOVPE includes less mixture of carbon atoms and silicon atoms in the AlN film than the mixture included in the AlN film deposited by sputtering ((c) of FIG. 22).

Furthermore, the AlN film as a buffer layer deposited by sputtering includes $10^{18}/cm^3$ or more of silicon atoms, $10^{18}/cm^3$ or more of oxygen atoms, and $10^{18}/cm^3$ or more of carbon atoms as impurities. Nevertheless, the XRC FWHM of the (10-12) plane of an AlN film is to be a value greater than 1000 arcsec when the substrate is annealed in the opened state ((c) of FIG. 16), yet when the substrate is annealed in the gas-tight state, the XRC FWHM is 1000 arcsec or less ((a) and (b) of FIG. 16). Specifically, FIG. 22 shows that even in the case where an AlN film as a buffer layer which includes impurities such as silicon atoms, oxygen atoms, and carbon atoms is formed by sputtering, the annealing step (step S16b) of the present embodiment achieves a nitride semiconductor substrate having the (10-12) plane whose XRC FWHM is 1000 arcsec or less so that crystallinity is extremely high.

Figure 23:
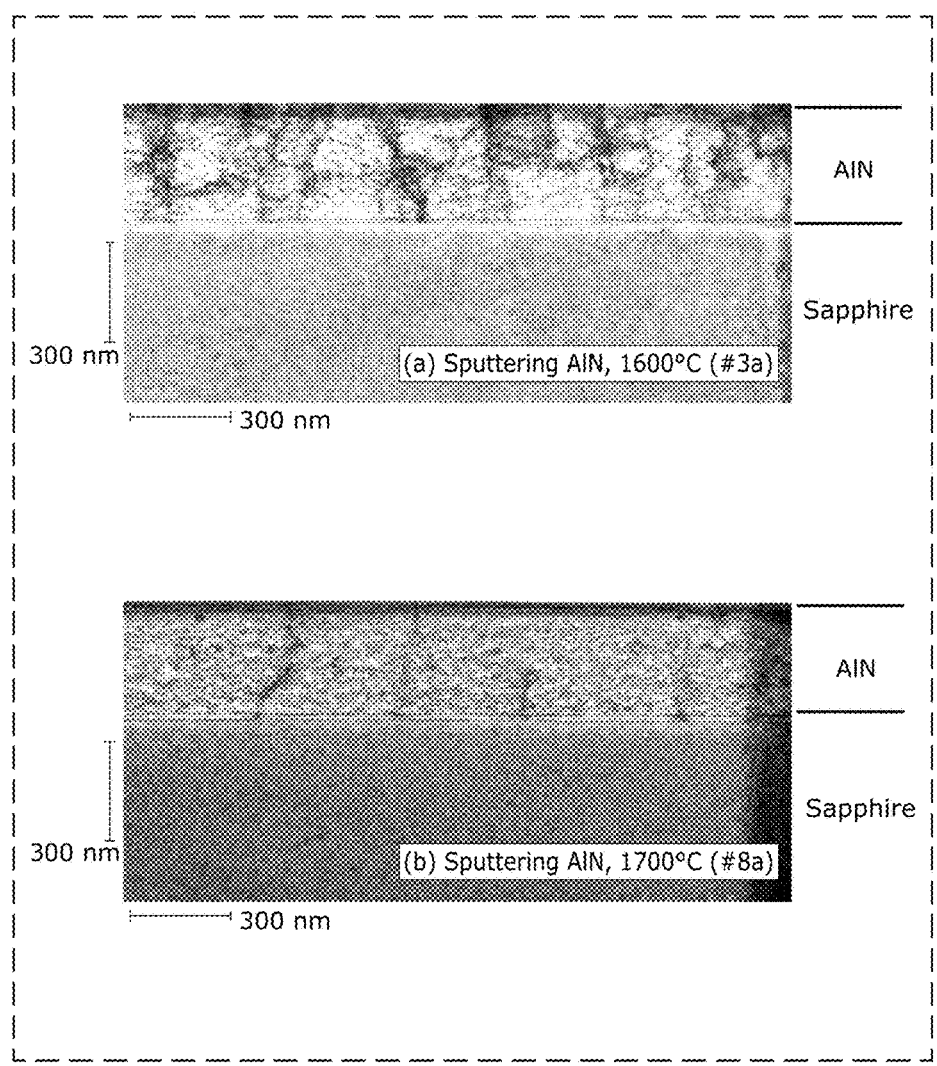
FIG. 23 is a diagram illustrating cross-sectional images of two types of nitride semiconductor substrates in which AlN films as buffer layers are formed in the embodiment, the images being observed using a transmission electron microscope.

FIG. 23 is a diagram illustrating cross-sectional images of two types of nitride semiconductor substrates in which AlN films as buffer layers are formed in the present embodiment, the images being observed using a transmission electron microscope under a condition that electron rays enter along a zone axis. Specifically, the method for depositing an AlN film and a substrate temperature in the annealing step (step S16b) are sputtering and 1600° C. in (a) of FIG. 23, and sputtering and 1700° C. in (b) of FIG. 23. Such two types of nitride semiconductor substrates correspond to the substrate No. 3a illustrated in FIG. 16 ((a) of FIG. 23) and the substrate No. 8a ((b) of FIG. 23).

In the cross sections of the AlN films illustrated in (a) and (b) of FIG. 23, a linear pattern which extends in a substantially thickness direction is dislocation. A dislocation density is estimated to be $4.5 \times 10^9$ cm$^{-2}$ in (a) of FIG. 23, and is estimated to be $9 \times 10^8$ cm$^{-2}$ in (b) of FIG. 23. This shows that a dislocation density of the nitride semiconductor substrate annealed at 1700° C. is decreased to one fifth of the dislocation density of the nitride semiconductor substrate annealed at 1600° C.

FIG. 24 is a diagram illustrating manufacturing conditions for and evaluation results of a plurality of nitride semiconductor substrates having AlN films as buffer layers formed and manufactured for evaluation. In particular, FIG. 24 illustrates evaluation results obtained when the spacing between the principal surface of a group III nitride semiconductor (AlN film) and a cover member is changed in the annealing step (step S16b). Here, FIG. 24 illustrates manufacturing conditions for and evaluation results of samples of four nitride semiconductor substrates (the substrates No. 3d, 3e, 4d, and 4e).

Note that items of manufacturing conditions and evaluation results in the table are basically the same as those illustrated in FIG. 16. Note that "spacing (μm)" is added as one of the manufacturing conditions. "Spacing (μm)" is the distance between an AlN film and a cover member. As stated in the row of the "cover substance" in the table, cover members for the substrates No. 3d to 4d are "AlN/Sap. (a state in which another substrate on which an AlN film is formed is placed facing a target substrate in order to form the gas-tight state illustrated in FIG. 6A)", and a cover member for the substrate No. 4e is "none (no cover member)." "Temperature {° C.}" in the table is a temperature directly under the substrate. "RMS (nm)" is added as an evaluation item.

As can be seen from the evaluation items "XRC after annealing", "surface state", and "RMS" in FIG. 24, an annealing treatment is performed in the gas-tight state using a cover member (substrates No. 3d to 4d), whereby crystallinity of an AlN film (in particular, crystallinity of the (0002) plane) has improved, compared to the case where a substrate is annealed in the opened state (substrate No. 4e). Specifically, the distance between the principal surface of a group III nitride semiconductor and a cover member is desirably 1 mm or shorter (860 μm as an example), preferably 0.5 mm or shorter (430 μm as an example), and still more preferably 0 mm (the state in which another substrate is placed facing a substrate, as illustrated in FIG. 6A). Note that even in the state where another substrate is placed on the substrate as shown in FIG. 6A, both substrates have a structure in which the center portions of the surfaces are recessed by about 5 μm to 20 μm, as mentioned above, and thus a gas-tight space having a maximum spacing of 10 μm to 40 μm is considered to be formed.

Figure 25A:
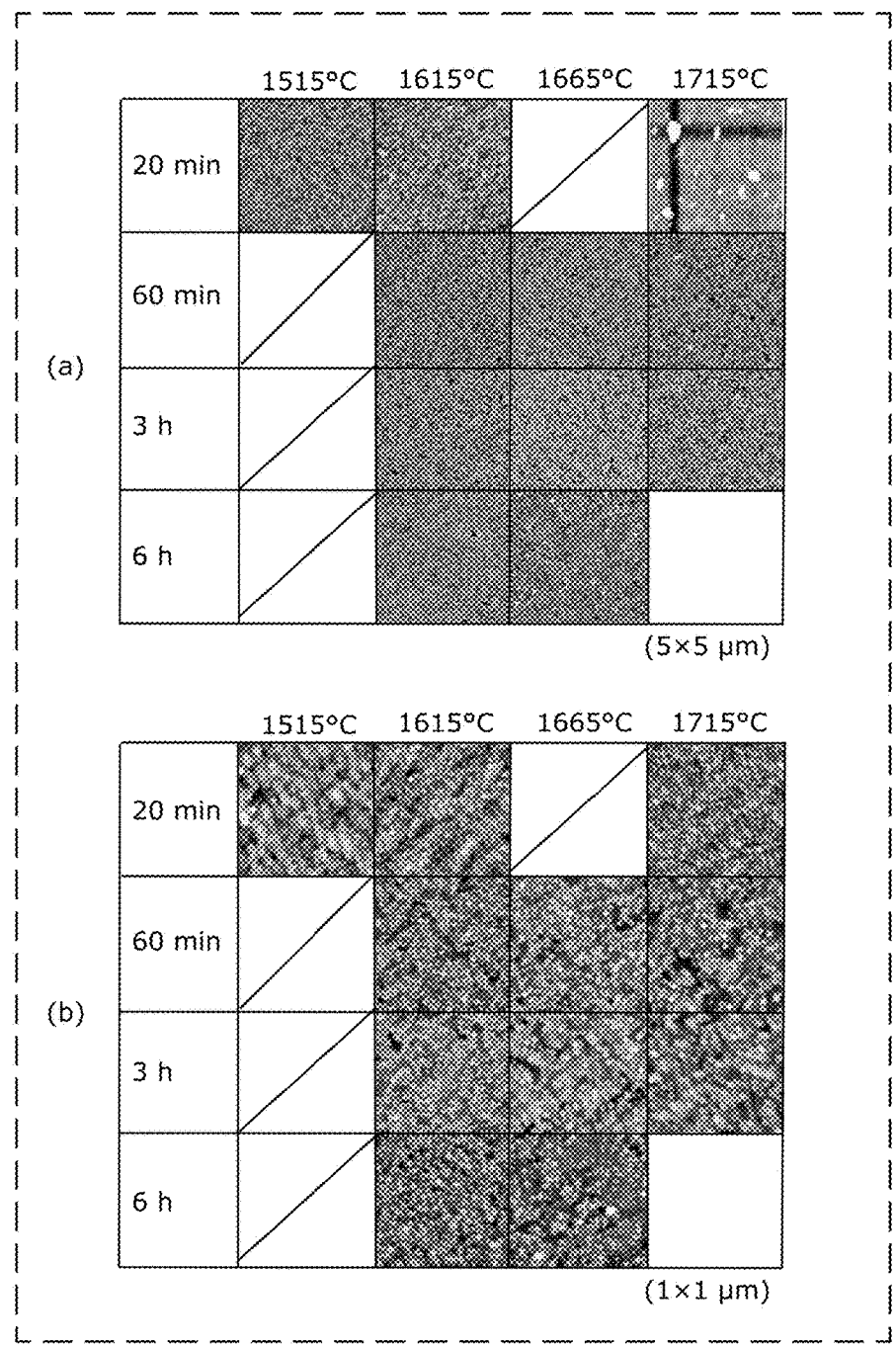
FIG. 25A is a diagram illustrating images of the surfaces of AlN films as buffer layers observed using an atomic force microscope (AFM) and obtained when nitride semiconductor substrates are manufactured at different substrate temperatures and different annealing times in the annealing step (step S16b).

FIG. 25A is a diagram illustrating images of the surfaces of AlN films as buffer layers observed using an atomic force microscope (AFM) and obtained when nitride semiconductor substrates according to the present embodiment are manufactured at different substrate temperatures and different annealing times in the annealing step (step S16b) ((a) of FIG. 25A shows 5-μm square observed images, and (b) of FIG. 25A shows 1-μm square observed images). Here, nitride semiconductor substrates have been subjected to the annealing step under manufacturing conditions that are combinations of substrate temperatures of 1515° C., 1615° C., 1665° C., and 1715° C. and annealing times of 20 min, 60 min, 3 h, and 6 h (some of the combinations are excluded).

Figure 25B:
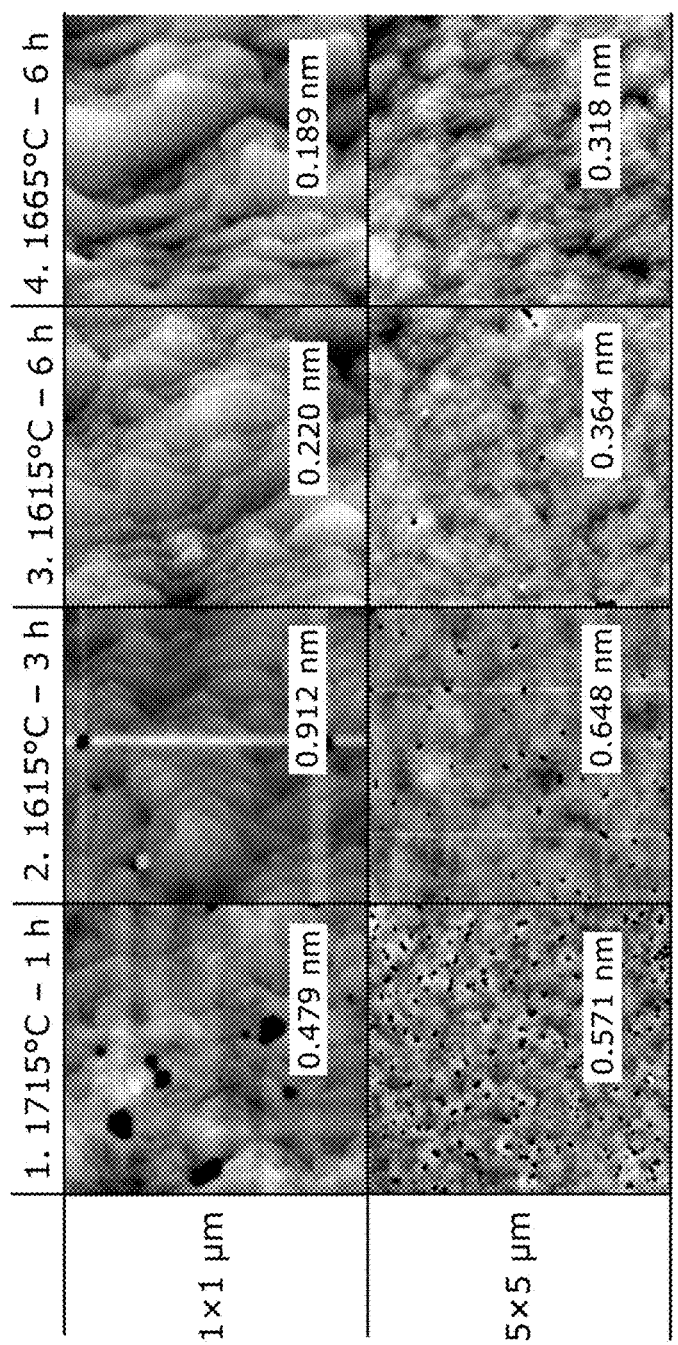
FIG. 25B is a diagram illustrating surface roughness (RMS values) obtained from some of the observed images illustrated in FIG. 25A.

FIG. 25B is a diagram illustrating the surface roughness (RMS values) obtained from some of the observed images illustrated in FIG. 25A (combinations of substrate temperatures and annealing times are 1 h at 1715° C., 3 h at 1615° C., 6 h at 1615° C., and 6 h at 1665° C.). Note that as described with regard to the observation images illustrated in FIG. 11, atomic layer steps are observed on the surfaces of all the substrates illustrated in FIG. 25B.

As can be seen from the observed images and RMS illustrated in FIGS. 25A and 25B, the surfaces of AlN films have less roughness (RMS) and are further flattened as the substrate temperature during annealing is higher and the annealing time is longer.

The following describes a surface treatment which is a desirable step performed after the annealing step. The method for manufacturing the nitride semiconductor substrate according to the present embodiment may include: an annealing step of forming an AlN buffer layer by annealing a substrate in which a group III nitride semiconductor is formed on a substrate which includes at least one of sapphire, silicon carbide, and aluminum nitride; and a surface treatment step of treating a surface of the annealed substrate. In the surface treatment step, the AlN buffer layer is left for a certain time period under an atmosphere of a mixed gas of ammonia and hydrogen or nitrogen at an ambient temperature in a range from 1000° C. to 1300° C.

Figure 26:
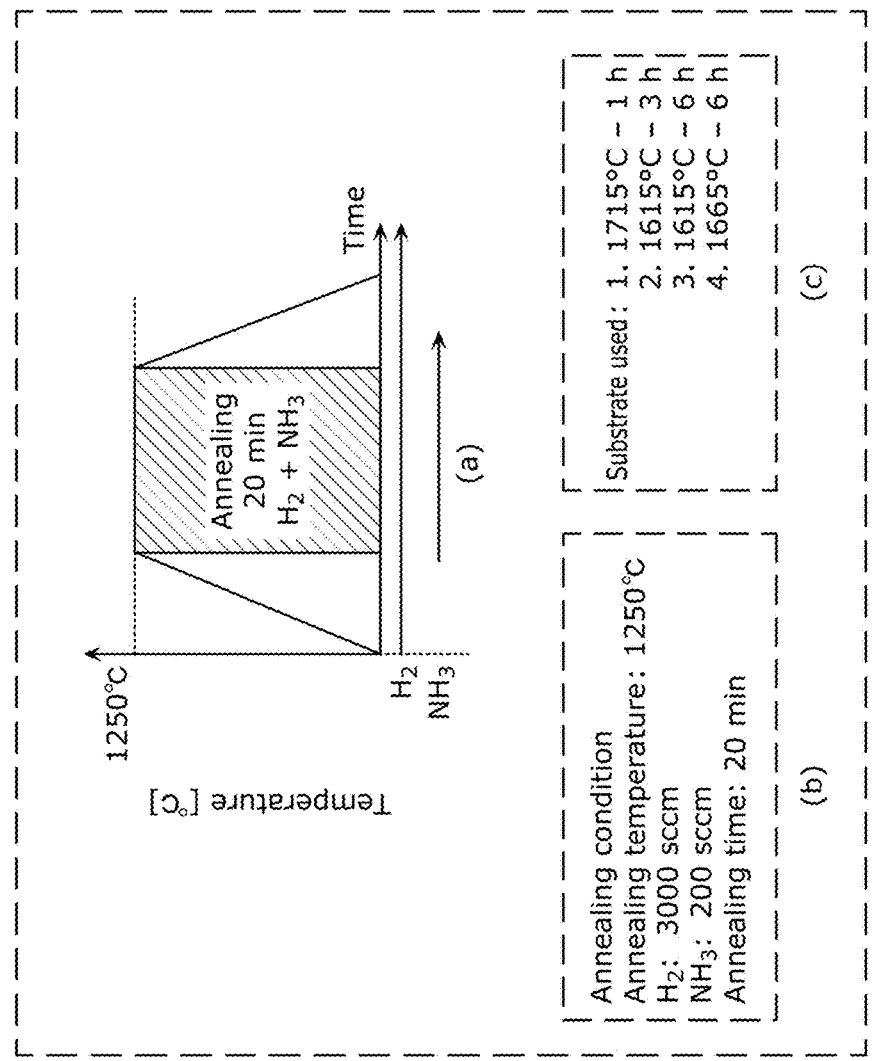
FIG. 26 is a diagram illustrating conditions in an experiment in which a surface treatment is performed, as a post-process, on a nitride semiconductor substrate obtained through the annealing step (step S16b).

FIG. 26 is a diagram illustrating conditions in an experiment in which a surface treatment is performed, as a post-process, on a nitride semiconductor substrate obtained through the annealing step (step S16b) in the present embodiment. Here, as various conditions in the experiment conducted using an annealing device, a time course of a substrate temperature ((a) of FIG. 26), a condition of an experiment ("annealing condition" in (b) of FIG. 26), and four types of nitride semiconductor substrates subjected to the experiment (four types of substrates used for obtaining observed images illustrated in FIGS. 25A and 25B ((c) of FIG. 26))). Specifically, a surface treatment (annealing) is performed on the four types of nitride semiconductor substrates obtained through the annealing step to cause the substrates to react for 20 minutes at a substrate temperature of 1250° C., in an atmosphere of a mixed gas of a hydrogen gas and an ammonia gas, and at an atmospheric pressure of 30 Torr to 100 Torr (step S16b). The hydrogen gas flow rate at this time was about 3000 sccm, and the ammonia gas flow rate at this time was about 200 sccm. Such a surface treatment on the nitride semiconductor substrates removed the deposit which appeared on the surface of the nitride semiconductor substrate and cleaned the surface, thereby forming a favorable surface.

Note that the time course of the substrate temperature illustrated in (a) of FIG. 26 shows that the substrate temperature is increased to 1250° C., yet it is not necessary to increase the substrate temperature from a lower value, and the substrate temperature may be decreased to 1250° C. after the annealing step (step S16b). Note that if AlN buffer layers are facing each other or if the gas-tight condition is achieved using a container, for instance, it is necessary to expose an AlN buffer layer using a certain means. For example, in the cases as illustrated in FIGS. 7A to 7C, such a surface treatment step can be started without decreasing the temperature by removing a lid using a robot arm. Further, a mixed gas of a hydrogen gas and an ammonia gas is used as a gas for a surface treatment as illustrated in (b) of FIG. 26, yet a similar result is considered to be obtained even if a mixed gas of a nitrogen gas and an ammonia gas is used. A mixed gas of ammonia and hydrogen or nitrogen may contain an inert gas other than nitrogen, such as argon or helium, and a mixed gas which includes an organic metal gas such as trimethylaluminum (TMA) or trimethylgallium (TMG) may be used.

Figure 27:
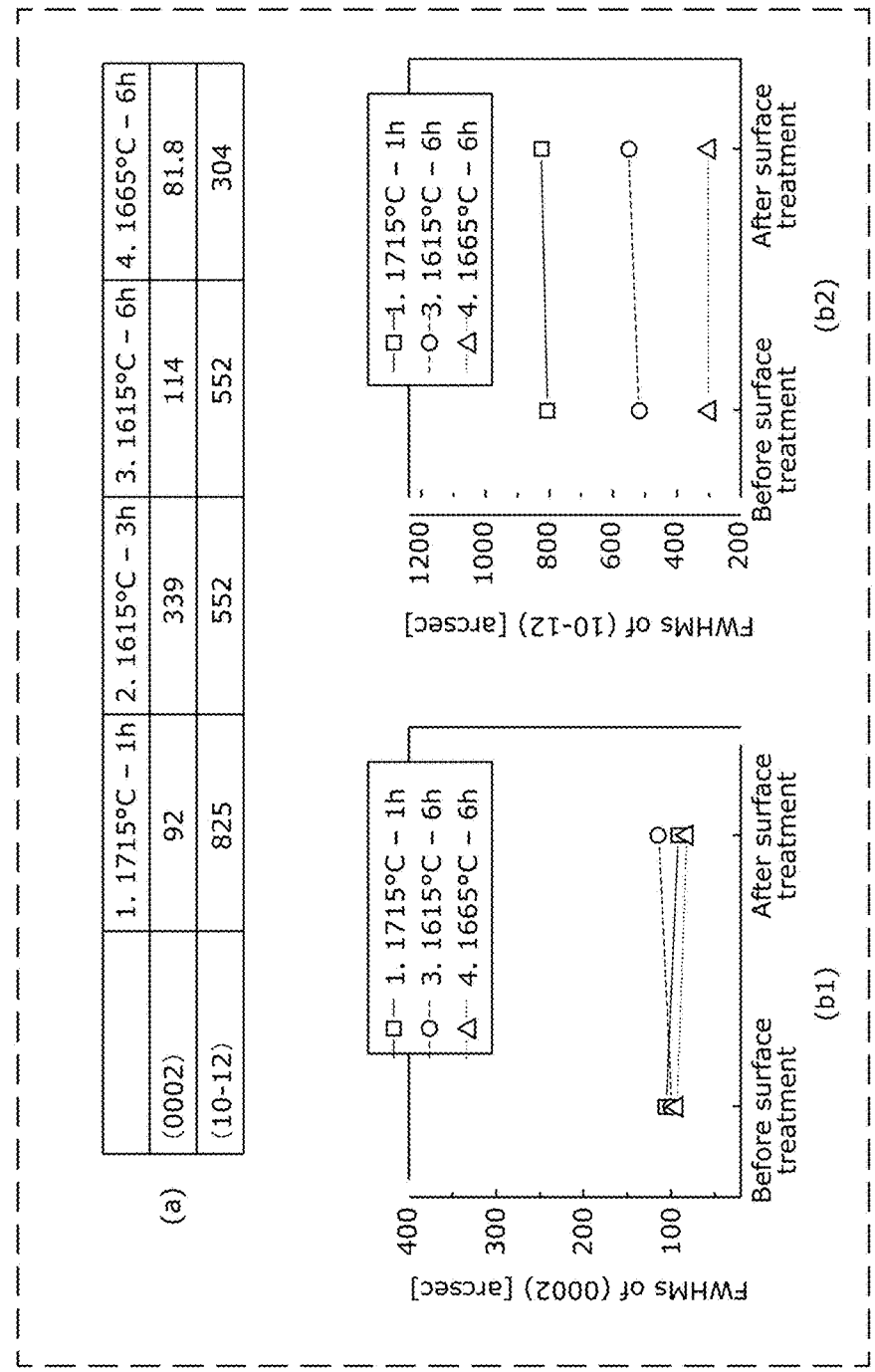
FIG. 27 is a diagram illustrating results (crystalline change) of the experiment illustrated in FIG. 26.

FIG. 27 is a diagram illustrating results (here, crystalline change) of the experiment illustrated in FIG. 26. Here, with regard to the four types of nitride semiconductor substrates used for the experiment, FIG. 27 illustrates XRC FWHMs of the (0002) planes and the (10-12) planes of AlN films as buffer layers after the surface treatment ((a) of FIG. 27), XRC FWHMs of the (0002) planes of AlN films before and after the surface treatment ((b1) of FIG. 27), and XRC FWHMs of the (10-12) planes of AlN films before and after the surface treatment ((b2) of FIG. 27). The results of the experiments illustrated in FIG. 27 show that the surface treatment (low-temperature annealing) illustrated in FIG. 26 did not change the crystallinity of the AlN films. However, a deposit which has appeared on the surface of a nitride semiconductor substrate was removed and cleaned so that a favorable surface was formed. Thus, insertion of the surface treatment step as a post-process of S16b in FIG. 4 and as a pre-process of S18 that is a step of re-growing an AlN layer further improves the quality of the AlN layer re-grown in S18.

Next, a device for heating semiconductor substrates which performs the above annealing treatment is to be described.

Figure 28:
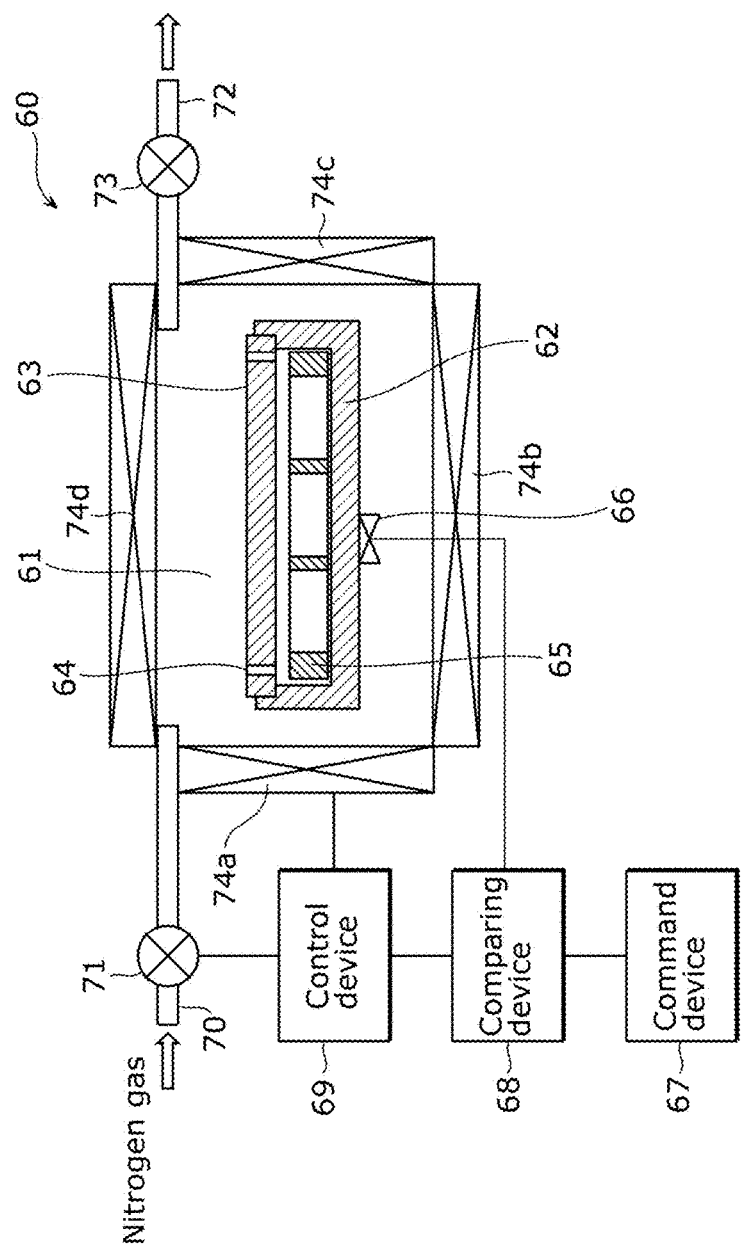
FIG. 28 is a block diagram illustrating a schematic structure of a device for heating substrates.

FIG. 28 is a diagram illustrating a schematic structure of a heating device. To simplify the diagram, only a sectional view seen from the front and a main configuration are illustrated. In FIG. 28, 60 denotes the entirety of a heating device. 61 denotes a furnace space in the heating device 60. FIG. 28 is a cross-sectional view, and although the illustration is omitted, there is an openable/closable door in the front or back, through which a substrate can be taken in and out. The entire furnace which is the heating device 60 is a container having an approximately rectangular solid shape or an approximate cylindrical shape, and is formed using a highly heat-resistant material such as carbon or boron nitride. 62 denotes a highly-pure carbon container, and is equivalent to the tight container described with reference to FIG. 7. The highly-pure carbon container 62 also functions as a heating member when the method used for the furnace is induction heating, and the material of the container 62 is originally a substance stable at a high temperature, and has features that the material is comparatively easy to be processed and is inexpensive. 63 denotes a lid of the highly-pure carbon container 62, and constitutes a container for achieving a substantially gas-tight state for a sapphire substrate which includes a precursor of an AlN buffer layer to be annealed, together with the container. 64 denotes a degassing hole for discharging a gas in the highly-pure carbon container 62 when a vacuum is formed before heating, and in the present example, holes having an about 1-mm diameter are formed at two spots. Such holes may be provided in the highly-pure carbon container 62. 65 denotes a substrate holder, and highly pure carbon is used also for the substrate holder in this example. Yet, the material can be selected from among a group III nitride semiconductor, carbon, boron nitride, aluminum oxide (sapphire), ceramic, silicon carbide, refractory metal (a material having a high melting point such as molybdenum, tungsten, iridium, or an alloy of such metals), zirconia, and tantalum carbide. 66 denotes a temperature sensor, and although one temperature sensor is illustrated in FIG. 28, a plurality of temperature sensors are provided in order to see a distribution of internal temperatures.

67 denotes a command device, and is a device which issues instructions regarding activation, deactivation, heating control, vacuation, and control of allowing an inert gas to flow in and discharging the inert gas, according to instructions from an operator. More specifically, a computer controlled by a program is used for the command device. The command device also includes a program for increasing the temperature at high speed while allowing a nitrogen gas to flow in after forming a vacuum as mentioned above, and lowering the speeds of increasing the temperatures to about ½ once the temperature is increased to at least 900° C. to 1300° C. 68 denotes a comparing device which converts measured values from the temperature sensor 66 and an air pressure sensor not illustrated into numbers, and compares instructions from the command device 67. The output of the comparing device 68 is conveyed to a control device 69, and the control device 69 outputs signals for controlling an inflow gas control valve 71, a discharge gas control valve 73, and heating heaters 74a to 74d. 70 denotes an inflow gas pipe, and 72 denotes a discharge gas pipe. Nevertheless, the number of inflow gas pipes and the number of discharge gas pipes are not each limited to one. It is more advantageous if the temperature of an inflow gas is high, and thus a heating device for the inflow gas is provided, but not illustrated. The annealing processing as illustrated in FIGS. 6A to 9B is performed on a substrate securely placed with some means inside of such a heating device at a high temperature.

Accordingly, the heating device 60 for semiconductor substrates according to the present embodiment includes, inside of a furnace on which the heating heaters 74a to 74d perform heating control, the substrate holder 65 which holds a substrate which includes a precursor of a buffer layer having a thickness of 0.05 μm to 1 μm and including a group III nitride semiconductor, and includes at least one of sapphire, silicon carbide, and an aluminum nitride, when heating the substrate. Here, a method applied for the heating heaters may be induction heating, electric wave heating, resistance heating, or combustion heating using a gas, petroleum, or the like, as long as the heating heaters are controlled and uniformly heat the furnace. The furnace space 61 in annealing is once vacuumized at a normal temperature. After that, while increasing the temperature by the heating heaters, an inert gas such as nitrogen, argon, or helium or a gas obtained by adding ammonia to such an inert gas flows through the inflow gas control valve 71 and fills the furnace space 61. Ammonia, oxygen, silane ($SiH_4$), monomethyl silane ($SiH_3CH_3$), germane ($GeH_4$), or an organic metal gas such as trimethylaluminum (TMA) or trimethylgallium (TMG) may be mixed in an inert gas as a principal component. The mixing ratio is preferably 20% or lower. Through the discharge gas control valve 73, the nitrogen gas or the like as mentioned above is controlled to maintain a constant pressure and also is discharged such that the amount of impurities generated in the furnace space is at a certain level or less. A gas which can be used here may be a gas of a type other than the above or a mixed gas, excluding a corrosive gas such as chlorine.

Figure 29:
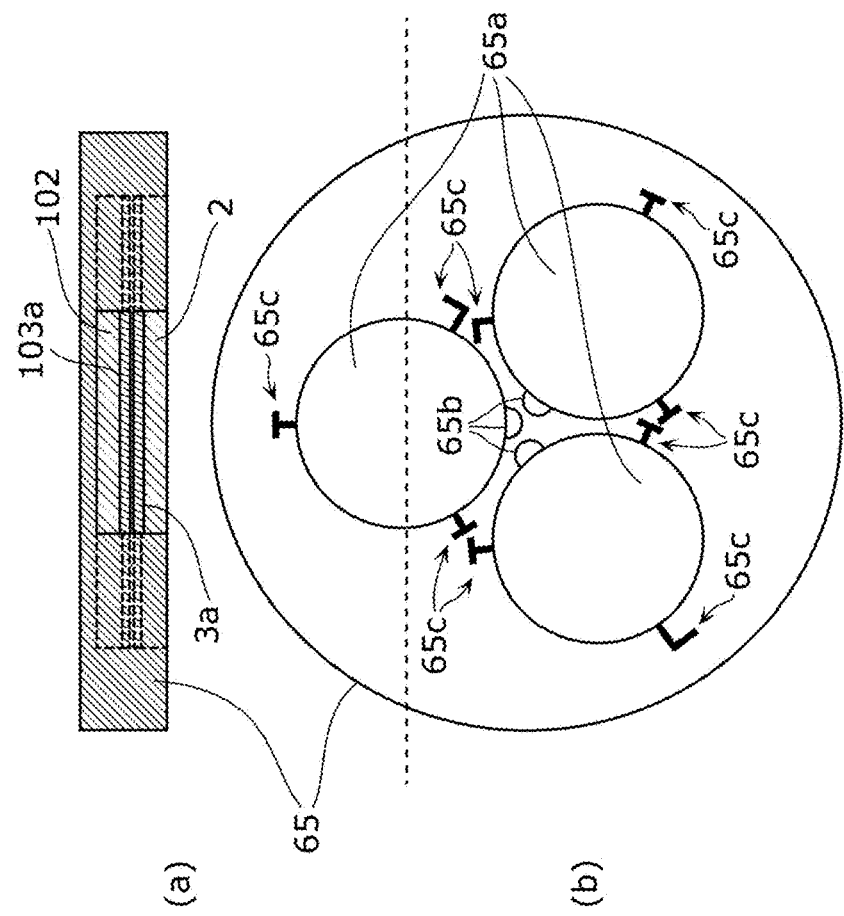
FIG. 29 shows a top view and a cross-sectional view illustrating an example of a substrate holder used in the heating device.

FIG. 29 illustrates a more specific shape of the substrate holder 65. As illustrated in (b) of FIG. 29, the substrate holder 65 has a disc shape in top view, holding portions 65*a* are three cylindrical holes equally provided on a concentric circle in the present embodiment. In the case of a 2-inch substrate, holes having a diameter of about 52 mm and the same shape are provided, and thus at a normal temperature, a gap of about 0.5 mm between the substrate and the holder can be secured along the entire perimeter. The depth is determined by the number of sapphire substrates to be put in, yet when two substrates are to be put in and annealed, if the thickness is at least slightly greater than the thickness of one substrate, the two substrates can be held. For example, if a substrate has a thickness of 0.3 mm, the depth may be 0.4 mm or greater. When covering with a lid in order to increase the gas tightness, the depth can be set to a total thickness of substrates that are to be annealed and plus about 0.1 mm. 65*b* denote semicircular openings in top surface view, which are used when substrates are placed and taken out. One opening 65*b* is provided for each holding portion 65*a*, yet two or three openings 65*b* may be provided for each holding portion 65*a*. 65C denote T-shaped grooves or L-shaped grooves used when placing spacers. T-shaped spacers having a size of about 50 μm to 100 μm are placed if necessary, whereby when many substrates are put in, the substrates are prevented from being adhered due to a high temperature and own weights. If the spacers are unnecessary, such grooves can be omitted. Part (a) of FIG. 29 is a cross-sectional view taken along the dashed line in (b) of FIG. 29, yet the holding portions 65*a* on both edges which originally cannot be seen are also indicated by dashed lines in order to facilitate the understanding. Here, similarly to FIG. 6A, the sapphire substrate 2 on which the precursor 3*a* of an AlN buffer layer is formed and the sapphire substrate 102 on which the precursor 103*a* of an AlN buffer layer is formed are disposed such that the precursors of the AlN buffer layers face each other. According to the substrate holder 65 in this example, two substrates can be placed in each holding portion 65*a*, and thus annealing processing can be performed on six substrates at one time.

Thus, the depth of the substrate holder 65 is greater than the thickness of one substrate, and allows the substrate holder 65 to hold two or more substrates. The material of the substrate holder 65 is at least one of a group III nitride semiconductor, carbon, boron nitride, aluminum oxide (sapphire), ceramic, silicon carbide, refractory metal (such as molybdenum, tungsten, iridium, or an alloy of such metals), zirconia, and tantalum carbide.

Figure 30:
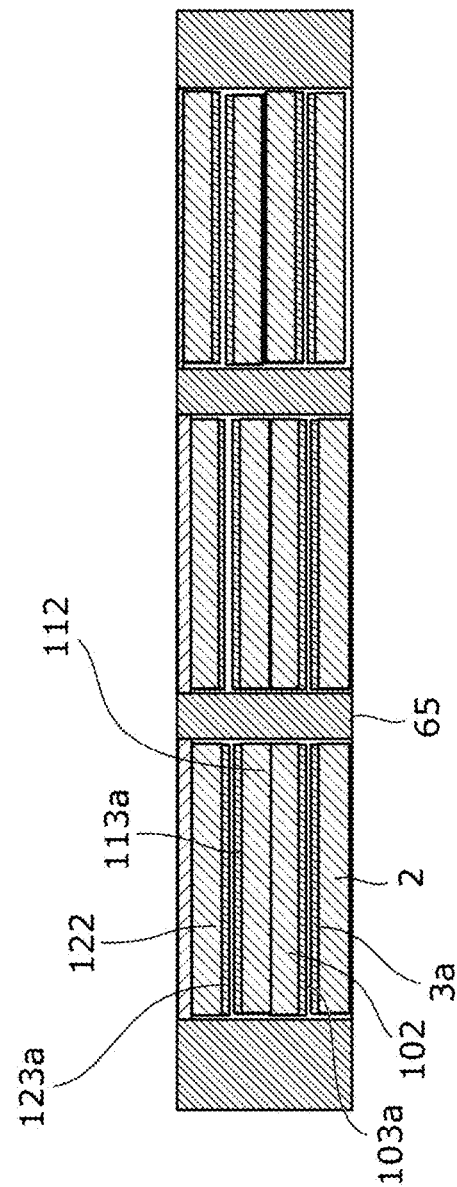
FIG. 30 illustrates an example of the substrate holder.

FIG. 30 illustrates an example in which four substrates are put in each holding portion 65*a*. The holding portions 65*a* may be circularly disposed as illustrated in (b) of FIG. 29, or may be linearly disposed. With regard to the upper two substrates, a sapphire substrate 112 on which a precursor 113*a* of an AlN buffer layer is formed and a sapphire substrate 122 on which a precursor 123*a* of an AlN buffer layer is formed are disposed such that the precursors of the AlN buffer layers face each other. With regard to the lower two substrates, a sapphire substrate 2 on which a precursor 3*a* of an AlN buffer layer is formed and a sapphire substrate 102 on which a precursor 103*a* of an AlN buffer layer is formed are disposed such that the precursors of the AlN buffer layers face each other. Here, it is preferable to put a spacer having a thickness of about 100 μm between the precursors 3*a* and 103*a* of the buffer layers in order to prevent the lower substrates from being adhered. A yield of a portion in contact with the spacer lowers, yet damage onto the entire AlN buffer layer on a sapphire substrate can be decreased. As described above, the substrate holder 65 holds substrates each of which includes a precursor of a buffer layer which includes a group III nitride semiconductor such that the precursors face each other.

Figure 31A:
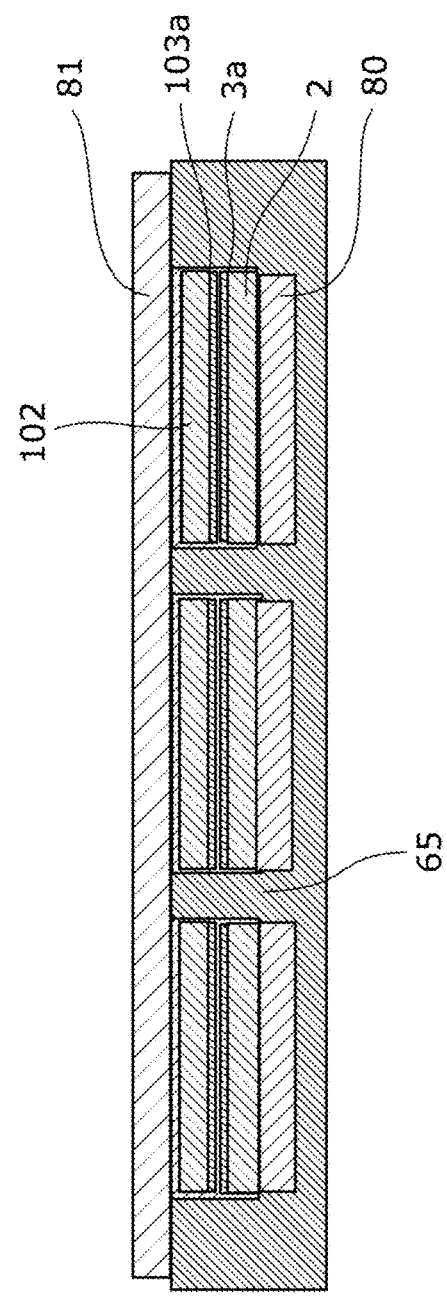
FIG. 31A is a cross-sectional view illustrating an application of the substrate holder.
Figure 31B:
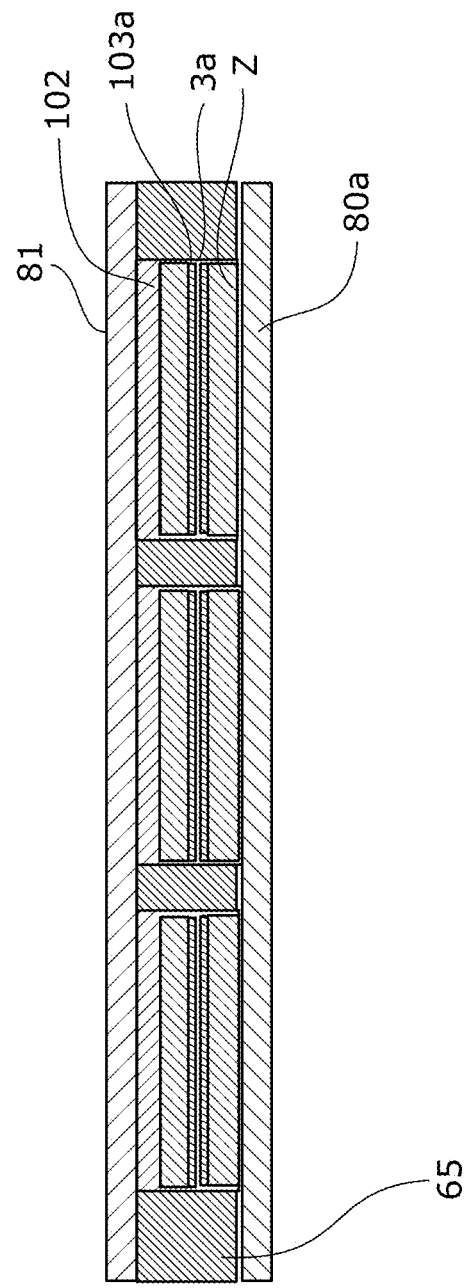
FIG. 31B is a cross-sectional view illustrating an application of the substrate holder.
Figure 31C:
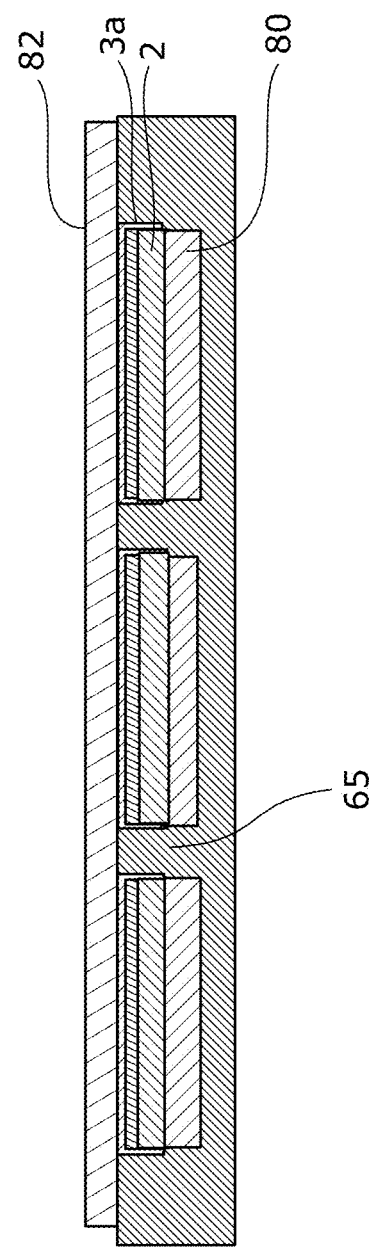
FIG. 31C is a cross-sectional view illustrating an application of the substrate holder.

FIGS. 31A to 31C are diagrams (cross-sectional views illustrating applications of the substrate holder) for describing methods of improving crystal quality of an AlN buffer layer and also improving the accuracy of the bottom surface of the sapphire substrate. FIG. 31A illustrates a slight variation of the substrate holder 65 illustrated in FIG. 29. 80 denotes a sapphire substrate which is a circular plate having the same material as the material of a substrate which includes a precursor of an AlN buffer layer. 81 denotes an upper-side lid which includes sapphire which is the same material as the material of the substrate which includes a precursor of an AlN buffer layer, and when the holding portions 65*a* are linearly disposed, the upper-side lid has a substantially rectangular thin plate shape. The upper-side lid 81 is a disc-shaped thin plate which includes sapphire when the holding portions 65*a* are provided concentrically as illustrated in (b) of FIG. 29.

FIG. 31B is a diagram illustrating a substrate holder which is intended to achieve the same purpose as that of the substrate holder illustrated in FIG. 31A. FIG. 31B illustrates a substrate holder which includes a bottom-side lid 80*a* which includes a material similar to the material of the upper-side lid 81, instead of the sapphire substrates 80.

FIG. 31C is a diagram illustrating another substrate holder. FIG. 31A illustrates that two sapphire substrates each of which includes a precursor of an AlN buffer layer are disposed such that the precursors face each other, whereas in the example of FIG. 31C, when a precursor of an AlN buffer layer of only one sapphire substrate is disposed facing the upper surface, an AlN surface of an upper-side lid 82 which is a substrate which has an AlN thin plate or an AlN film faces the precursor of the buffer layer. Naturally, when the orientation of the precursor of the buffer layer faces downward, the bottom-side lid can be achieved as a lid which includes an AlN film and the upper-side lid can be achieved as a sapphire plate. Specifically, the substrate holder 65 has a bottom-side lid 80*a* and an upper-side lid 81, and when a substrate is placed in the substrate holder 65, the material of the substrate which faces the bottom-side lid 80*a* and the material of the bottom-side lid 80*a* are the same, and the material of the substrate which faces the upper-side lid 81 and the material of the upper-side lid 81 are the same.

In this manner, the upper-side lid and the bottom-side lid which face a substrate include the same material as the material of the substrate in contact, whereby similarly to the gas-tight effects when annealing as described above, the surfaces of both the substrate and the buffer layer can be maintained in extremely favorable states. Thus, this contributes to a remarkable improvement in light emitting capability of a light emitting element manufactured using a substrate processed in the above manner. Naturally, if the material of a substrate is changed to silicon carbide or aluminum nitride, the same material is used also for the upper-side lid and the bottom-side lid, and furthermore if the material of a buffer layer is changed to a material that is a group III nitride semiconductor, the same material can be used also for the upper-side lid and the bottom-side lid.

Note that a description of an aspect in which the holding portions 65a which are cylindrical holes slightly larger than a sapphire substrate on which a precursor of an AlN buffer layer to be annealed is formed are concentrically formed in the disc-shaped substrate holder 65 has been given with reference to FIG. 29. Yet, the present invention is not limited to this aspect, and the holding portions may limit the lateral displacement of a sapphire substrate, and may be triangle recesses, quadrilateral recesses, or polygonal recesses. Furthermore, the substrate holder may be a plate which has a surface shape such as a rectangular parallelepiped shape or another polygonal shape, and in which holding portions are formed vertically and horizontally. Furthermore, the substrate holder 65 may be horizontally disposed relative to the bottom surface of the annealing furnace, or a plurality of substrate holders 65 may be disposed horizontally. How the substrate holder(s) is disposed is not limited to horizontal disposition, and one or more substrate holders may be disposed vertically. In the case of the vertical disposition, applying the aspects in which a substrate holder includes the bottom-side lid and the upper-side lid illustrated in FIGS. 31A to 31C can also limit vertical movement of substrates in holding portions, thus allowing stable production. Furthermore, how a substrate holder is disposed is not limited to horizontal or vertical disposition, and a substrate holder may be disposed aslant at a certain degree, or substrate holders may be stacked. According to the present invention, if a state in which the inside of the furnace can be maintained at a substantially constant temperature and a substantially gas-tight state can be maintained is achieved according to the various aspects as described above, stable annealing that is not greatly influenced by the orientation in which substrates are placed and gas concentration can be achieved, and a sapphire substrate which includes an AlN buffer layer with favorable crystal accuracy can be manufactured.

As described above, the surface of the sapphire substrate 2 included in a nitride semiconductor substrate according to the present embodiment is cleaned by heating the sapphire substrate 2 at a device thermocouple temperature for substrate heating in a range from 970° C. to 1300° C. (a substrate temperature in a range from about 920° C. to 1210° C.). After that, the sapphire substrate 2 is subjected to a pre-flow in an ammonia gas atmosphere, and furthermore, the AlN buffer layer 3 is formed on the sapphire substrate 2. Accordingly, the AlN buffer layer 3 having good crystallinity can be obtained. Consequently, the AlN layer 4 formed on the AlN buffer layer 3 also has good crystallinity, thus obtaining a high-quality AlN layer 4 having a flat surface. Accordingly, a high-quality nitride semiconductor substrate 1 having a flat surface can be obtained.

A buffer layer forming step of forming a buffer layer which includes a group III nitride semiconductor (in the above embodiment, the AlN buffer layer 3) includes a group III nitride semiconductor forming step of forming a group III nitride semiconductor on a substrate (the precursor 3a of an AlN buffer layer in the above embodiment), and an annealing step of annealing the substrate on which the group III nitride semiconductor is formed, in the gas-tight state in which the principal surface of the group III nitride semiconductor is covered with a cover member for inhibiting components of the group III nitride semiconductor from dissociating from the principal surface of the formed group III nitride semiconductor. Accordingly, the nitride semiconductor substrate is annealed in the gas-tight state in which the principal surface of the group III nitride semiconductor is covered with the cover member for inhibiting components of the group III nitride semiconductor from dissociating from the principal surface of the group III nitride semiconductor, and thus the surface of the group III nitride semiconductor is inhibited from being roughened, and a nitride semiconductor substrate in which a high-quality group III nitride semiconductor having a flat surface is formed is achieved. Furthermore, a group III nitride semiconductor which includes AlN, AlGaN, or AlGaInN is regrown on the nitride semiconductor substrate which has such an excellent crystallinity, whereby a nitride semiconductor substrate in which a group III nitride semiconductor having low defect density is formed can be obtained, and a high-quality ultraviolet light emitting element and others can be achieved.

In addition, the nitride semiconductor substrate is annealed in the gas-tight state in which the surface of the group III nitride semiconductor as a buffer layer is inhibited from being roughened, and thus a heat treatment at an extremely high temperature, that is, a substrate temperature in a range from 1400° C. to 1750° C. can be performed. Accordingly, the surface of the group III nitride semiconductor can be flattened, and the boundary (grain boundary) between crystal grains of the group III nitride semiconductor is reduced so that dislocation density is reduced.

Furthermore, the state is a stagnant state in which a gas on the principal surface of the group III nitride semiconductor as a buffer layer does not substantially flow, and thus components of the group III nitride semiconductor are inhibited from dissociating and going out during annealing, and a nitride semiconductor substrate in which a high-quality group III nitride semiconductor having a flat surface is formed is achieved.

A method for manufacturing a nitride semiconductor substrate according to the present embodiment includes: a step of stacking and placing semiconductor substrates each of which includes a sapphire substrate and an AlN layer formed on a surface of the sapphire substrate in a holder which is disposed in an annealing furnace and limits movement of the semiconductor substrates, to inhibit AlN components of the semiconductor substrates from dissociating due to heating the semiconductor substrates; a step of filling inside of the annealing furnace with an inert gas or a gas obtained by adding ammonia to an inert gas; and a step of annealing the semiconductor substrates at a temperature of the semiconductor substrates in a range from 1400° C. to 1750° C. Accordingly, the semiconductor substrates are annealed in a state where the semiconductor substrates are stacked and placed in the annealing furnace, in order to inhibit AlN components from dissociating, due to heating, from the semiconductor substrate in which an AlN layer is formed on the surface of a sapphire substrate, and thus the surface of the AlN layer is inhibited from being roughened, so that a nitride semiconductor substrate in which a high-quality AlN layer having a flat surface is formed is achieved.

Note that the nitride semiconductor substrate and the method for manufacturing the nitride semiconductor substrate according to the embodiment of the present invention are not limited to the embodiment described above.

For example, in the embodiment described above, the method of forming the first and second group III nitride semiconductors is not limited to metal organic vapor phase epitaxy (MOVPE) and sputtering, and hydride vapor phase epitaxy (HVPE), molecular beam epitaxy (MBE), and others may be used.

The first group III nitride semiconductor may be formed successively after a buffer layer such as an AlN buffer layer is formed on a sapphire substrate or the like, or after a nitride semiconductor substrate is once taken out from a reaction vessel, a plurality of such nitride semiconductor substrates are placed in another reaction vessel, and first group III nitride semiconductors may be simultaneously formed on the plurality of nitride semiconductor substrates.

Without annealing in the cleaning step described above, a buffer layer may be formed on a substrate at a temperature higher than a device thermocouple temperature for substrate heating when forming a precursor of an AlN buffer layer, that is, about 1200° C., for example.

The above embodiment has described growing AlN layers as layers of the first and second group III nitride semiconductors, yet instead of the AlN layers, each of the layers of the first and second group III nitride semiconductors may be a layer represented by $Al_xGa_yIn_{(1-x-y)}N$, where $0 \le x \le 1$, $0 \le y \le 1$, and $(x+y) \le 1$, or a structure in which such layers are stacked. High-quality crystals can be achieved in the layer represented by $Al_xGa_yIn_{(1-x-y)}N$, where $0 \le x \le 1$, $0 \le y \le 1$, and $(x+y) \le 1$, and a structure in which such layers are stacked.

Specifically, with regard to GaN in $Al_xGa_yIn_{(1-x-y)}N$ where $x=0$ and $y=1$, a favorable crystal having the (0002) plane whose FWHM is 80 arcsec and the (10-12) plane whose FWHM is 250 arcsec is obtained.

In the case of $Al_xGa_yIn_{(1-x-y)}N$ where $x=0.7$ and $y=0.3$, a favorable $Al_{0.7}Ga_{0.3}N$ mixed crystal having the (0002) plane whose FWHM is 85 arcsec and the (10-12) plane whose FWHM is 387 arcsec is obtained.

AlN when $Al_xGa_yIn_{(1-x-y)}N$ where $x=1$ and $y=0$ and $Al_{0.7}Ga_{0.3}N$ when $Al_xGa_yIn_{(1-x-y)}N$ where $x=0.7$ and $y=0.3$, for instance, are used as ground crystals for forming deep ultra-violet LED devices, for instance. $Al_{0.17}In_{0.83}N$ when $x=0.17$, $y=0$, and $1-x-y=0.83$ is greatly expected as a crystal which lattice-matches GaN.

A layer of a group III nitride semiconductor represented by $Al_xGa_yIn_{(1-x-y)}N$, where $0 \le x \le 1$, $0 \le y \le 1$, and $(x+y) \le 1$, can be obtained by growing crystals of an AlN layer and a layer represented by $Al_xGa_yN$, where $y=1-x$, at 1200° C. to 1500° C., and growing mixed crystals ($1-x-y>0$) including In at a temperature in a range from 600° C. to 1000° C. using nitrogen as a carrier gas, with the application of, for example, MOVPE, using trimethylaluminum (TMA), trimethylgallium (TMG), trimethylindium (TMI) as the group III material, and $NH_3$ as the group V material. Crystals of the layer represented by $Al_xGa_yIn_{(1-x-y)}N$, where $0 \le x \le 1$, $0 \le y \le 1$, and $(x+y) \le 1$, are expected to be favorably grown into a thick film for forming, for instance, LED devices and producing substrates, and favorable crystals having a size of 50 nm to 10 mm are obtained by the manufacturing method described above.

Although the above embodiment has shown an example in which a buffer layer which includes the first group III nitride semiconductor is formed on one side of a sapphire substrate or the like and the second group III nitride semiconductor is regrown on the buffer layer, yet buffer layers which include the first group III nitride semiconductors may be formed on both sides of a substrate and the second group III nitride semiconductors may be regrown on the buffer layers. Accordingly, this inhibits the warp of the substrate.

Note that the manufacturing method disclosed in, for instance, PTL 4 (Japanese Unexamined Patent Application Publication No. H09-312417) can be used as a method for forming group III nitride semiconductors on both sides of a sapphire substrate, for instance. A high-quality nitride semiconductor substrate whose surface is flat can be manufactured by performing the annealing step (step S16b) in the above embodiment, when buffer layers which include first group III nitride semiconductors are formed on both sides of a substrate.

Furthermore, the embodiments and variations described above may be combined.

INDUSTRIAL APPLICABILITY

A nitride semiconductor substrate in which a buffer layer which includes a group III nitride semiconductor is formed on a substrate according to the present invention can be used as a nitride semiconductor substrate that is used for, for example, illumination, sterilization, photolithography, laser machines, medical equipment, light sources for phosphors, spectral distribution analysis, and ultraviolet light emitting elements used as light sources for ultraviolet curing, for instance.

The invention claimed is:

1. A method for manufacturing a nitride semiconductor substrate, the method comprising:
   a step of placing a semiconductor substrate which includes a sapphire substrate and a precursor of an aluminum nitride (AlN) buffer layer in an annealing furnace such that the precursor and a cover member face each other with at most a 0.5-mm spacing therebetween to inhibit dissociation of an AlN component due to heating the semiconductor substrate, the precursor being formed on a surface of the sapphire substrate and including AlN grains; and
   a step of annealing the semiconductor substrate in the annealing furnace in an inert gas atmosphere for at least 20 minutes at a temperature of the semiconductor substrate in a range from 1600° C. to 1750° C., wherein
   a full width at half maximum of an X-ray rocking curve of a (10-12) plane of the annealed semiconductor substrate is less than or equal to 1000 arcsec.

2. The method according to claim 1, wherein
   the semiconductor substrate is placed in the annealing furnace in a state in which movement of the semiconductor substrate is limited from a periphery side by a substrate holder in the annealing furnace.

3. The method according to claim 1, wherein
   the precursor of the AlN buffer layer is formed by sputtering.

4. A method for manufacturing a nitride semiconductor substrate, the method comprising:
   a preparation step of preparing a substrate which includes at least one of sapphire, silicon carbide, and aluminum nitride in a container which is coverable with a lid while the substrate is stored in the container, and includes, in the container, a substrate holder which limits movement of the substrate from a periphery side of the substrate;
   a buffer layer forming step of forming, on the substrate, a precursor of a buffer layer which includes a group III nitride semiconductor represented by $Al_xGa_yIn_{(1-x-y)}N$, where $0 \le x \le 1$, $0 \le y \le 1$, and $(x+y) \le 1$, in the container in an uncovered state;
   a step of creating a gas-tight state in the container by covering the container with the lid after forming the precursor of the buffer layer; and
   an annealing step of annealing the nitride semiconductor substrate on which the precursor of the buffer layer which includes the group III nitride semiconductor is formed through the buffer layer forming step, in an inert gas atmosphere and at a temperature higher than a temperature in the buffer layer forming step.

5. A method for manufacturing a nitride semiconductor substrate, the method comprising:
a step of placing, in an annealing furnace, a semiconductor substrate which includes: a substrate which includes one of sapphire, silicon carbide, and aluminum nitride; and a precursor of a buffer layer which includes a group III nitride semiconductor represented by $Al_xGa_yIn_{(1-x-y)}N$, where $0 \leq x \leq 1$, $0 \leq y \leq 1$, and $(x+y) \leq 1$, such that the precursor and a cover member face each other with at most a 0.5-mm spacing therebetween to inhibit dissociation of a component of the group III nitride semiconductor due to heating the semiconductor substrate, the precursor being formed on a surface of the substrate and including group III nitride semiconductor grains; and
a step of annealing the semiconductor substrate in the annealing furnace in an inert gas atmosphere for at least 20 minutes at a temperature of the semiconductor substrate in a range from 1400° C. to 1750° C.

6. The method according to claim 5, wherein
the semiconductor substrate is placed in the annealing furnace in a state in which movement of the semiconductor substrate is limited from a periphery side by a substrate holder in the annealing furnace.

7. The method according to claim 6, wherein
the cover member is another semiconductor substrate on which a precursor of a buffer layer which includes a group III nitride semiconductor same as the precursor of the buffer layer which includes the group III nitride semiconductor is formed, and
the other semiconductor substrate is placed above the semiconductor substrate such that the buffer layer which includes the group III nitride semiconductor formed on the semiconductor substrate and the buffer layer which includes the group III nitride semiconductor formed on the other semiconductor substrate face each other.

8. The method according to claim 7, wherein
the substrate holder has a depth that allows the substrate holder to hold at least two semiconductor substrates each of which is either the semiconductor substrate or the other semiconductor substrate, and
the substrate holder has at least three disposition grooves in each of which a spacer for forming a spacing between the precursors formed on the at least two semiconductor substrates when the at least two semiconductor substrates are stacked.

9. The method according to claim 6, wherein
a bottom-side lid which forms a bottom of the substrate holder is further provided, and
a surface of the cover member or the bottom-side lid which faces the precursor has grooves having a predetermined depth and forming protrusions and recesses or is roughened to a predetermined depth, and is in contact with at least a perimeter portion of the precursor.

10. The method according to claim 6, wherein
the group III nitride semiconductor included in the buffer layer is one of aluminum nitride, gallium nitride, aluminum gallium nitride, and aluminum gallium indium nitride,
the cover member includes at least one of a group III nitride semiconductor, carbon, boron nitride, sapphire, ceramic, silicon carbide, refractory metal, zirconia, and tantalum carbide,
the refractory metal is at least one of molybdenum, tungsten, iridium, and an alloy of at least two of molybdenum, tungsten, and iridium, and
a body of the substrate holder includes at least one material among a group III nitride semiconductor including aluminum nitride, carbon, boron nitride (BN), pyrolytic boron nitride (PBN), aluminum oxide, ceramic, silicon carbide, refractory metal, and zirconia.

11. The method according to claim 9, wherein
the bottom-side lid includes at least one of a group III nitride semiconductor, carbon, boron nitride, sapphire, ceramic, silicon carbide, refractory metal, zirconia, and tantalum carbide, and
the refractory metal is at least one of molybdenum, tungsten, iridium, and an alloy of at least two of molybdenum, tungsten, and iridium.

12. The method according to claim 5, comprising:
after the step of annealing the semiconductor substrate, a surface treatment step of setting a temperature in the annealing furnace used in the step of annealing the semiconductor substrate to an ambient temperature in a range from 1000° C. to 1300° C., making an atmosphere of a mixed gas containing ammonia and hydrogen or nitrogen in the annealing furnace, and leaving the buffer layer for a predetermined time period.

13. A method for manufacturing a nitride semiconductor substrate, the method comprising:
a step of placing, in an annealing furnace, a semiconductor substrate which includes: a substrate which includes one of sapphire, silicon carbide, and aluminum nitride; and a precursor of a buffer layer which includes a group III nitride semiconductor represented by $Al_xGa_yIn_{(1-x-y)}N$, where $0 \leq x \leq 1$, $0 \leq y \leq 1$, and $(x+y) \leq 1$, such that the precursor and a base face each other to inhibit dissociation of a component of the group III nitride semiconductor due to heating the semiconductor substrate, the precursor being formed on a surface of the substrate and including group III nitride semiconductor grains; and
a step of annealing the semiconductor substrate in the annealing furnace for at least 20 minutes at a temperature of the semiconductor substrate in a range from 1400° C. to 1750° C. in an inert gas atmosphere, wherein
a full width at half maximum of an X-ray rocking curve of a (10-12) plane of the annealed semiconductor substrate is less than or equal to 1000 arcsec.

14. The method according to claim 13, wherein
a surface of the base which faces the precursor has grooves having a predetermined depth and forming protrusions and recesses or is roughened to a predetermined depth.

* * * * *